US012087813B2

(12) United States Patent
Ali et al.

(10) Patent No.: US 12,087,813 B2
(45) Date of Patent: Sep. 10, 2024

(54) DEEP TRENCH ISOLATION WITH FIELD OXIDE

(71) Applicant: Texas Instruments Incorporated, Dallas, TX (US)

(72) Inventors: Abbas Ali, Plano, TX (US); Rajni J. Aggarwal, Garland, TX (US); Steven J. Adler, Plano, TX (US); Eugene C. Davis, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/462,880

(22) Filed: Aug. 31, 2021

(65) Prior Publication Data

US 2023/0060695 A1 Mar. 2, 2023

(51) Int. Cl.

*H01L 29/06* (2006.01)
*H01L 21/265* (2006.01)
*H01L 21/761* (2006.01)
*H01L 21/762* (2006.01)
*H01L 21/763* (2006.01)

(52) U.S. Cl.

CPC .... *H01L 29/0649* (2013.01); *H01L 21/26513* (2013.01); *H01L 21/76286* (2013.01); *H01L 21/763* (2013.01); *H01L 21/761* (2013.01)

(58) Field of Classification Search

CPC ........... H01L 29/0649; H01L 21/26513; H01L 21/76286; H01L 21/76237; H01L 29/42368; H01L 27/0829

USPC .......................................... 257/330; 438/238

See application file for complete search history.

(56) References Cited

U.S. PATENT DOCUMENTS 4,704,368 A * 11/1987 Goth ...................... H10B 12/10 257/E21.651
9,159,791 B2 * 10/2015 Chen .................. H01L 29/7809
9,431,286 B1 8/2016 Pendharkar
2006/0244029 A1 * 11/2006 Moens ................ H01L 21/3081 257/E21.232
2007/0096257 A1 * 5/2007 Coolbaugh et al. ......................... H01L 27/0664 257/565
2016/0163583 A1 * 6/2016 Liu et al. ............ H01L 21/6229
2018/0053765 A1 * 2/2018 Pendharkar ........... H01L 21/765
2018/0342416 A1 11/2018 Sucher
2020/0212229 A1 * 7/2020 Hu ................. H01L 21/823814
2021/0005760 A1 1/2021 Hu
2021/0005768 A1 * 1/2021 Derkacs et al. .. H01L 21/76237

* cited by examiner

*Primary Examiner* — Peter Bradford

(74) *Attorney, Agent, or Firm* — Yudong Kim; Frank D. Cimino

(57) ABSTRACT

An electronic device comprises a semiconductor substrate including majority carrier dopants of a first conductivity type, a semiconductor surface layer including majority carrier dopants of a second conductivity type, field oxide that extends on the semiconductor surface layer, and an isolation structure. The isolation structure includes a trench that extends through the semiconductor surface layer and into one of the semiconductor substrate and a buried layer of the semiconductor substrate, and polysilicon including majority carrier dopants of the second conductivity type, the polysilicon fills the trench to a side of the semiconductor surface layer.

20 Claims, 52 Drawing Sheets

DEEP TRENCH ISOLATION WITH FIELD OXIDE

BACKGROUND

Isolation structures separate electrically circuits of different power supply domains and/or types, such as high and low voltage circuits or analog and digital circuits in an integrated circuit. Shallow trench isolation (STI) is a type of isolation structure with dielectric material deposited into shallow trenches etched between circuit areas to be isolated. Deep trench isolation (DTI) is used in combination with STI to mitigate electric current leakage between adjacent semiconductor device components. Silicon deep trench isolation schemes incorporate a shallow trench isolation loop during fabrication for lateral device isolation. Deep trench isolation is desirable for circuit designs that do not require STI structures elsewhere, but the STI loop (used in combination with DTI) adds another STI mask and increases manufacturing cost and complexity.

SUMMARY

In one aspect, an electronic device comprises a semiconductor substrate including majority carrier dopants of a first conductivity type, a buried layer in a portion of the semiconductor substrate and including majority carrier dopants of a second conductivity type, a semiconductor surface layer including majority carrier dopants of the second conductivity type, an isolation structure, and field oxide. The isolation structure includes a trench that extends through the semiconductor surface layer and into one of the semiconductor substrate and the buried layer, a dielectric liner that extends on a sidewall of the trench from the semiconductor surface layer to the one of the semiconductor substrate and the buried layer, and polysilicon on the dielectric liner. The polysilicon includes majority carrier dopants of the second conductivity type and fills the trench to a side of the semiconductor surface layer. The field oxide extends on a portion of the side of the semiconductor surface layer, and a portion of the field oxide contacts a portion of the isolation structure.

In another aspect, a method includes forming a buried layer in a portion of a semiconductor substrate, forming a trench through a semiconductor surface layer and into one of the semiconductor substrate and the buried layer, forming a dielectric liner along a sidewall of the trench, forming polysilicon inside the trench and on the dielectric liner, and forming a field oxide on a portion of the side of the semiconductor surface layer.

In another aspect, a method includes forming a semiconductor surface layer on a semiconductor substrate, forming a field oxide on a portion of a side of the semiconductor surface layer, forming a trench through the semiconductor surface layer and into one of the semiconductor substrate and a buried layer of the semiconductor substrate, and forming polysilicon in the trench, the polysilicon filling the trench to the side of the semiconductor surface layer, and the polysilicon including majority carrier dopants of the second conductivity type.

DETAILED DESCRIPTION

Figure 1:
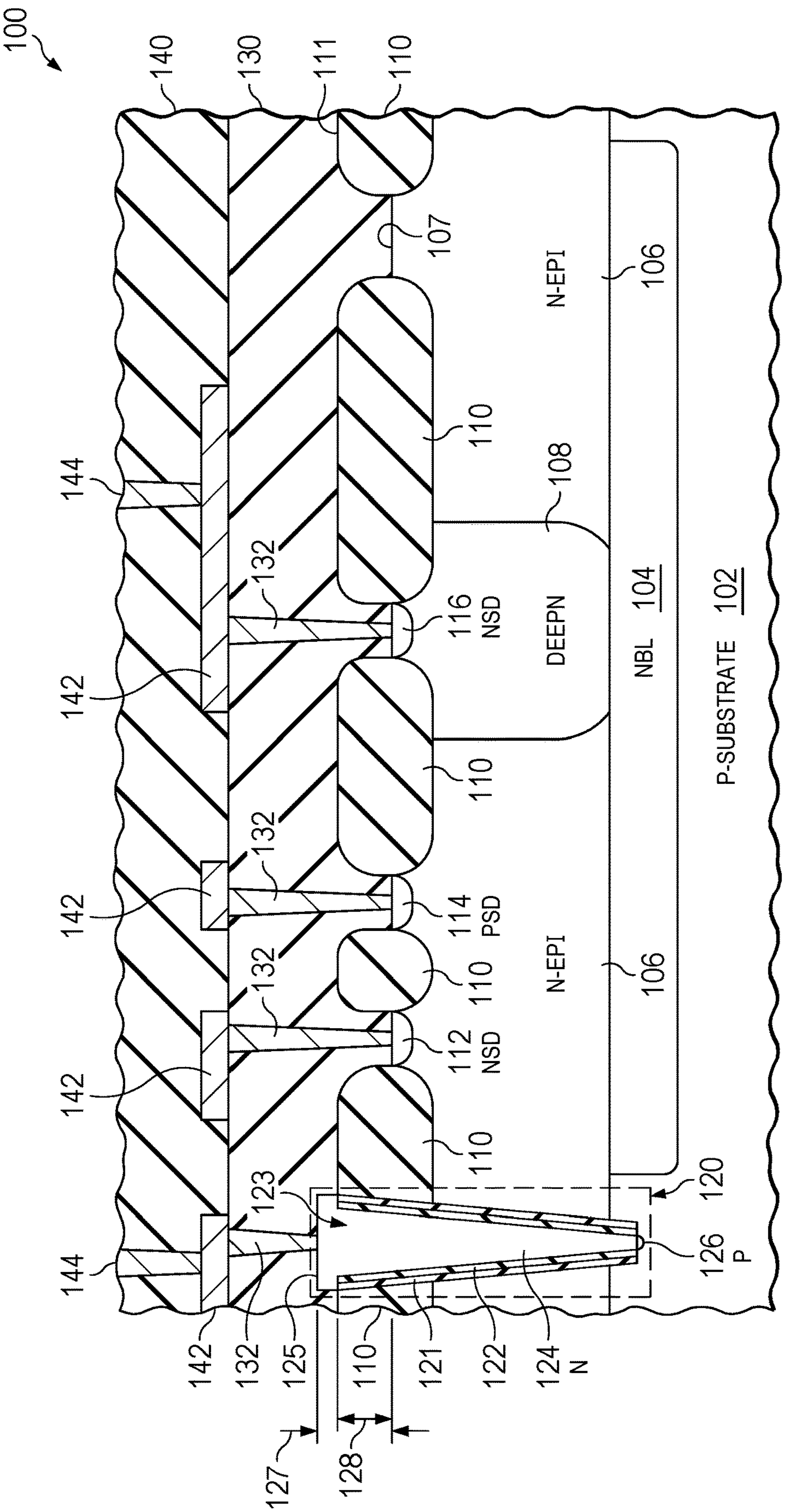
FIG. 1 is a partial sectional side elevation view of an electronic device that includes a deep trench isolation structure formed through field oxide.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows an electronic device 100 that includes a deep trench isolation structure formed through field oxide without STI structures. As used herein the term "field oxide" refers to a thick oxide (e.g., having a thickness in nm or greater) that is thermally grown through thermal oxidation on a semiconductor surface, such as a LOCOS formed oxide, without forming a trench in the semiconductor surface layer for the field oxide. The use of a thermally grown field oxide instead of STI provides benefits as detailed herein while providing or enhancing isolation around or near the DTI structure. The DTI structure facilitates electrical isolation between components or circuits without adding an STI mask and without the cost and complexity of STI processing. The electronic device 100 in one example is an integrated circuit product, only a portion of which is shown in FIG. 1. The electronic device 100 includes electronic components, such as transistors, resistors, capacitors (not shown) fabricated on or in a semiconductor structure of a starting wafer, which is subsequently separated or singulated into individual semiconductor dies that are separately packaged to produce integrated circuit products. The electronic device 100 includes a semiconductor structure having a semiconductor substrate 102, a buried layer 104 in a portion of the semiconductor substrate 102, a semiconductor surface layer 106 with an upper or top side 107 and a deep doped region 108, and field oxide structures 110 that have upper or top sides 111 and extend on corresponding portions of the top side 107 of the semiconductor surface layer 106. In one example, the field oxide 110 is or includes silicon dioxide ($SiO_2$) grown by a thermal oxidation process during fabrication of the electronic device 100.

The semiconductor substrate 102 in one example is a silicon or silicon on insulator (SOI) structure that includes majority carrier dopants of a first conductivity type. The buried layer 104 extends in a portion of the semiconductor substrate 102 and includes majority carrier dopants of a second conductivity type. In the illustrated implementation, the first conductivity type is P, the second conductivity type is N, the semiconductor substrate 102 is labeled "P-SUBSTRATE", and the buried layer 104 is an N-type buried layer labeled "NBL" in the drawings. In another implementation (not shown), the first conductivity type is N and the second conductivity type is P.

The semiconductor surface layer 106 in the illustrated example is or includes epitaxial silicon having majority carrier dopants of the second conductivity type and is labeled "N-EPI" in the drawings. The deep doped region 108 includes majority carrier dopants of the second conductivity type and is labeled "DEEPN" in the drawings. The deep doped region 108 extends from the semiconductor surface layer 106 to the buried layer 104. A first portion 112 (e.g., a first implanted region) of the semiconductor surface layer 106 along the top side 107 includes majority carrier dopants of the second conductivity type and is labeled "NSD" in the drawings. A second portion or implanted region 114 of the semiconductor surface layer 106 along the top side 107 includes majority carrier dopants of the first conductivity type and is labeled "PSD" in the drawings. A third portion 116 (e.g., a third implanted region) of the semiconductor surface layer 106 within the deep doped region 108 along the top side 107 includes majority carrier dopants of the second conductivity type and is labeled "NSD" in the drawings.

The isolation structure includes a trench that extends from a top surface of the semiconductor surface layer 106 through a bottom surface of the semiconductor surface layer 106, for example into the semiconductor substrate or the buried layer. The electronic device 100 includes a deep trench isolation structure 120 with a bilayer dielectric liner having a first dielectric liner layer 121 and a second dielectric liner layer 122 along a sidewall of a trench 123. In another implementation, a single layer dielectric liner (not shown) is formed along the trench sidewall. In another implementation, a multilayer dielectric liner (not shown) includes more than two dielectric layers along the trench sidewall. The trench 123 is filled with doped polysilicon 124 having an upper or top side 125. The trench 123 extends through the semiconductor surface layer 106 into the semiconductor substrate 102. A portion 126 (e.g., an implanted region) of the semiconductor substrate 102 under the trench 123 includes majority carrier dopants of the first conductivity type.

In the illustrated example, the buried layer 104 is formed by a masked implantation process and does not extend laterally to the bottom of the trench 124. In another implementation (e.g., FIGS. 49 and 51 below), the buried layer is formed by a blanket implantation process and the trench extends into the buried layer of the semiconductor substrate. The bilayer dielectric liner 121, 122 in one example extends on the sidewall of the trench 123 from a level above or even with the top surface of the semiconductor surface layer 106 and below a bottom surface of the semiconductor surface layer 106 to or below a top surface of the semiconductor substrate 102. In another implementation (e.g., FIGS. 49 and 51 below), the dielectric liner extends on the sidewall of the trench 123 from the top surface of the semiconductor surface layer 106 to the buried layer 104.

The polysilicon 124 includes majority carrier dopants of the second conductivity type. The polysilicon 124 extends on the dielectric liner 121, 122 and fills the trench 123 to the top side 107 of the semiconductor surface layer 106. In the example of FIG. 1, the trench 123, the dielectric liner 121, 122, and the polysilicon 124 extend beyond the top side 107 of the semiconductor surface layer 106 through a portion of the field oxide 110. A portion (e.g., side) of the field oxide 110 contacts (e.g., is in physical contact with) a portion of the isolation structure 120. The top side 125 of the polysilicon 124 extends outward beyond the top side 107 of the semiconductor surface layer 106 by a first distance 127, and the top side 111 of the field oxide 110 extends outward beyond the top side 107 of the semiconductor surface layer 106 by a second distance 128. As described further below in connection with FIGS. 2-26, the isolation structure 120 in the electronic device 100 of FIG. 1 is fabricated after formation (e.g., growth) of the field oxide structure 110, and the first distance 127 is greater than the second distance 128 in the electronic device 100 of FIG. 1 (e.g., the polysilicon 124 extends upward past and above the top side 111 of the field oxide 110 in the configuration and orientation shown in the drawings). In another implementation (e.g., FIGS. 27-48 below), the deep trench isolation structure is formed before the field oxide.

The deep doped region 108 in FIG. 1 is spaced apart laterally from the isolation structure 120. In another example, the deep doped region 108 is omitted and another deep doped region (not shown) extends from the semiconductor surface layer 106 and into one of the buried layer 104 and the semiconductor substrate 102, laterally surrounds a portion of the trench 123, and includes majority carrier dopants of the second conductivity type. In another example (e.g., FIGS. 49 and 51 below), a second deep doped region extends from the semiconductor surface layer to the buried layer and surrounds a portion of the trench.

The electronic device 100 includes a multilevel metallization structure, only a portion of which is shown in the drawings. The electronic device 100 includes a first dielectric layer 130 (e.g., a pre-metal dielectric layer labeled "PMD" in the drawings) that extends on or over the field oxide 110 and portions of the top side 107 of the semiconductor surface layer 106. In one example, the first dielectric layer is or includes $SiO_2$. The PMD layer 130 includes conductive contacts 132 that extend through the PMD layer 130 to form electrical contacts to the respective implanted regions 112, 114, and 116 of the semiconductor surface layer 106. The PMD layer 130 also includes a conductive contact 132 that forms an electrical contact to the top side 125 of the doped polysilicon 124 of the deep trench isolation structure 120.

The multilevel metallization structure in FIG. 1 also includes a second dielectric layer 140 (e.g., $SiO_2$), referred to herein as an interlayer or interlevel dielectric (ILD) layer. The second dielectric layer 140 is labeled "ILD" in the drawings. The second dielectric layer 140 includes conductive routing structures 142, such as traces or lines. In one example, the conductive routing structures 142 are or include copper or aluminum or aluminum or other conductive metal. The second dielectric layer 140 includes conductive vias 144 that are or include copper or aluminum or other conductive metal. In one example, the electronic device 100 includes one or more further metallization layers or levels (not shown).

Figure 25:
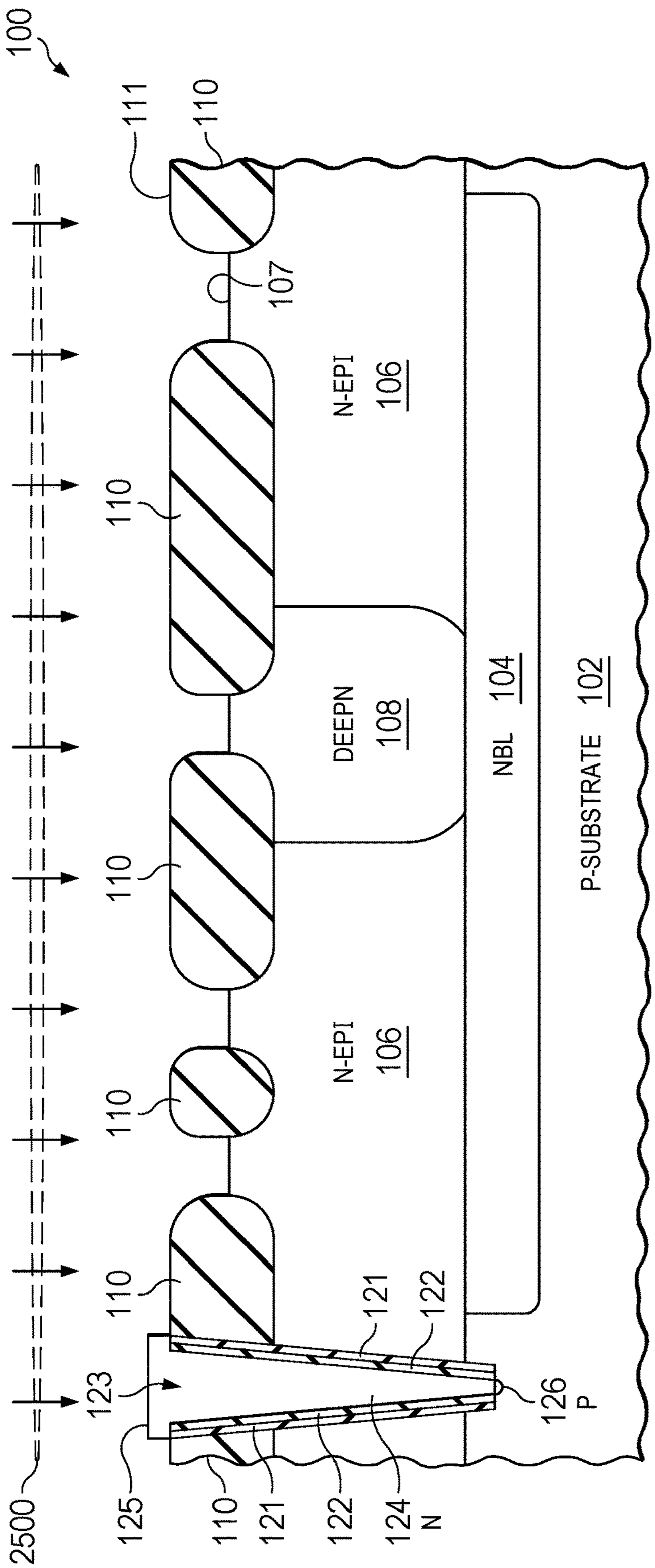
Figure 26:
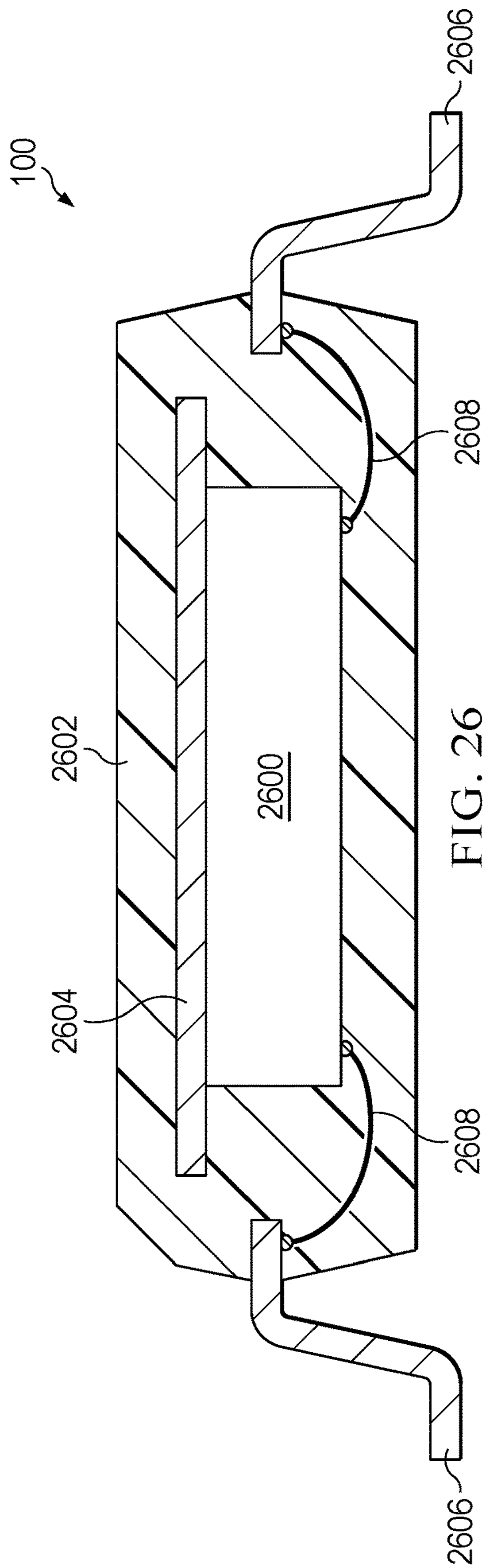
FIG. 26 is a sectional side elevation view of the electronic device of FIGS. 1 and 3-25 including a package structure.

Referring also to FIGS. 2-26, FIG. 2 shows a method 200 for making an electronic device and for making an isolation structure in an electronic device. FIGS. 3-25 show the electronic device 100 of FIG. 1 at various stages of fabrication according to the method 200, and FIG. 26 shows the electronic device 100 including a package structure. The method 200 begins with a starting wafer, such as a silicon wafer 102 or a silicon on insulator wafer that includes majority carrier dopants of a first conductivity type (e.g., P in the illustrated example).

Figure 3:
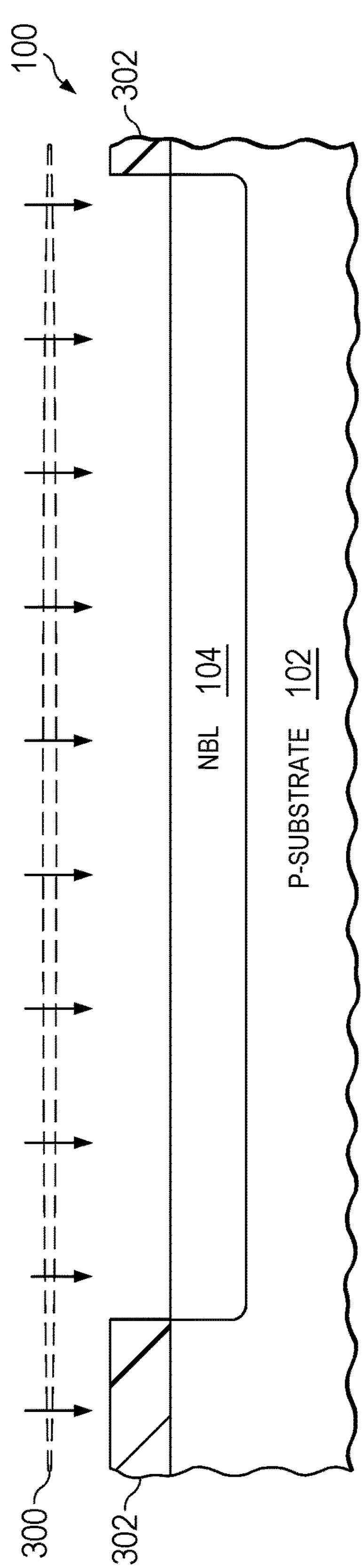
FIGS. 3-25 are partial sectional side elevation views of the electronic device of FIG. 1 at various stages of fabrication according to the method of FIG. 2.

The method 200 includes forming a buried layer at 202. FIG. 3 shows one example, in which an implantation process 300 is performed using an implant mask 302. The implantation process 300 implants dopants of the second conductivity type (e.g., N in the illustrated example) into an exposed portion of the top side of the semiconductor substrate 102 to form the buried layer 104 in a portion of the semiconductor substrate 102. The implant mask 302 is then removed. In another implementation, a blanket implantation is performed at 202 without an implant mask.

Figure 2:
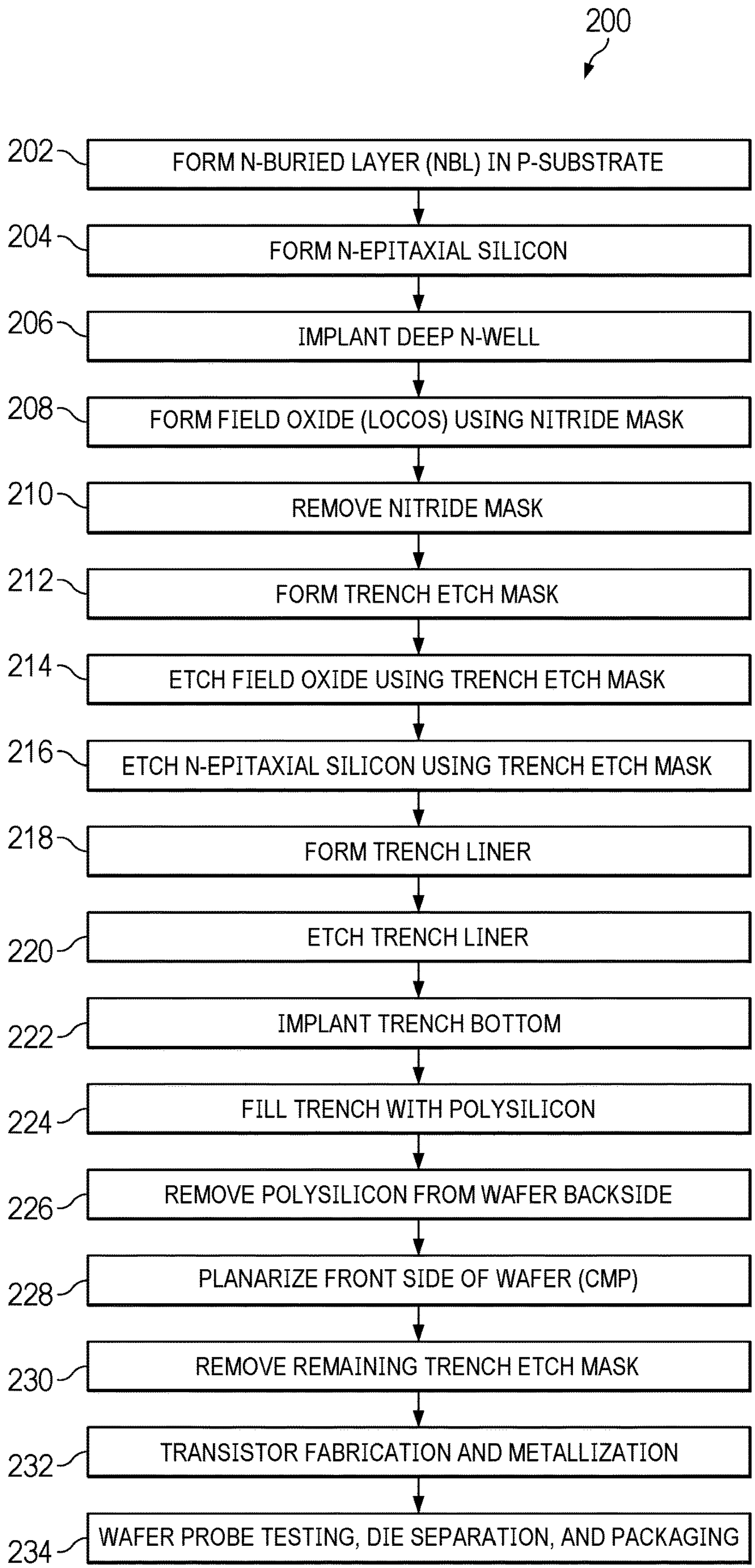
FIG. 2 is a flow diagram of a method for making an electronic device and for making an isolation structure in an electronic device.
Figure 4:
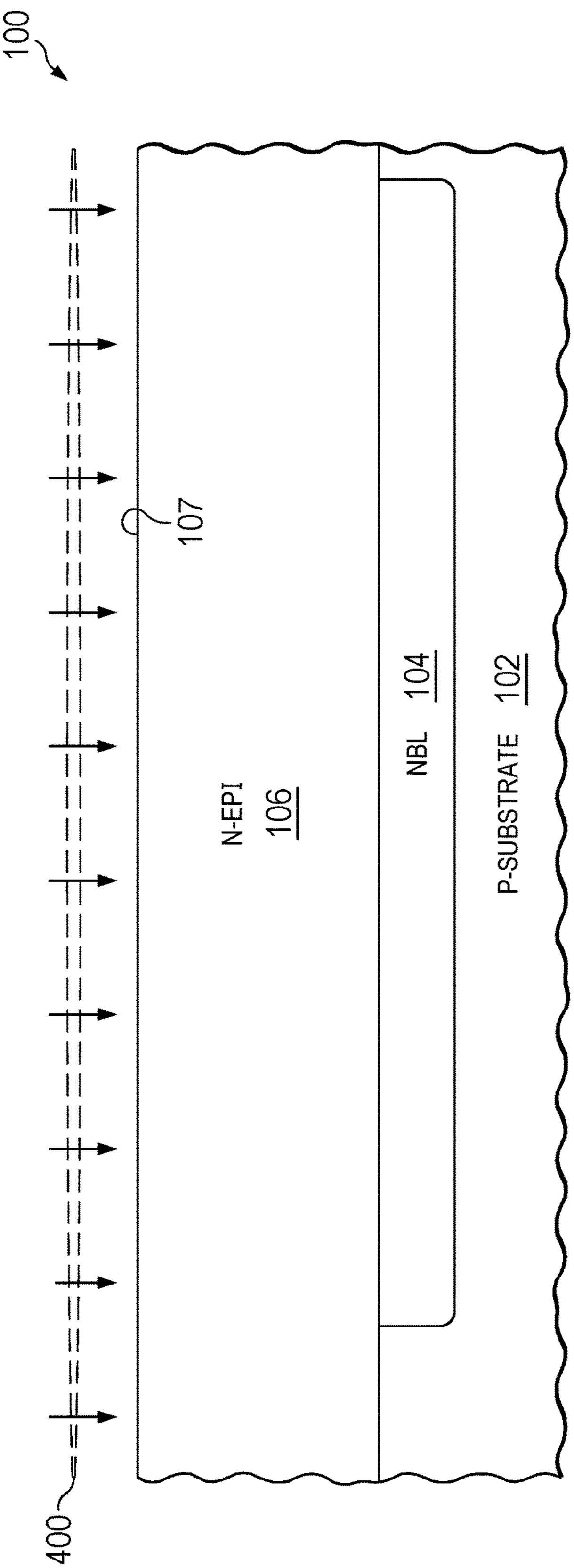

At 204 in FIG. 2, the method 200 also includes forming a semiconductor surface layer on the semiconductor substrate. FIG. 4 shows one example, in which an epitaxial growth process 400 is performed with in-situ N-type dopants that grows the N-doped epitaxial silicon semiconductor surface layer 106 on the top side of the semiconductor substrate 102. The semiconductor surface layer 106 has a top side 107 as previously described.

Figure 5:
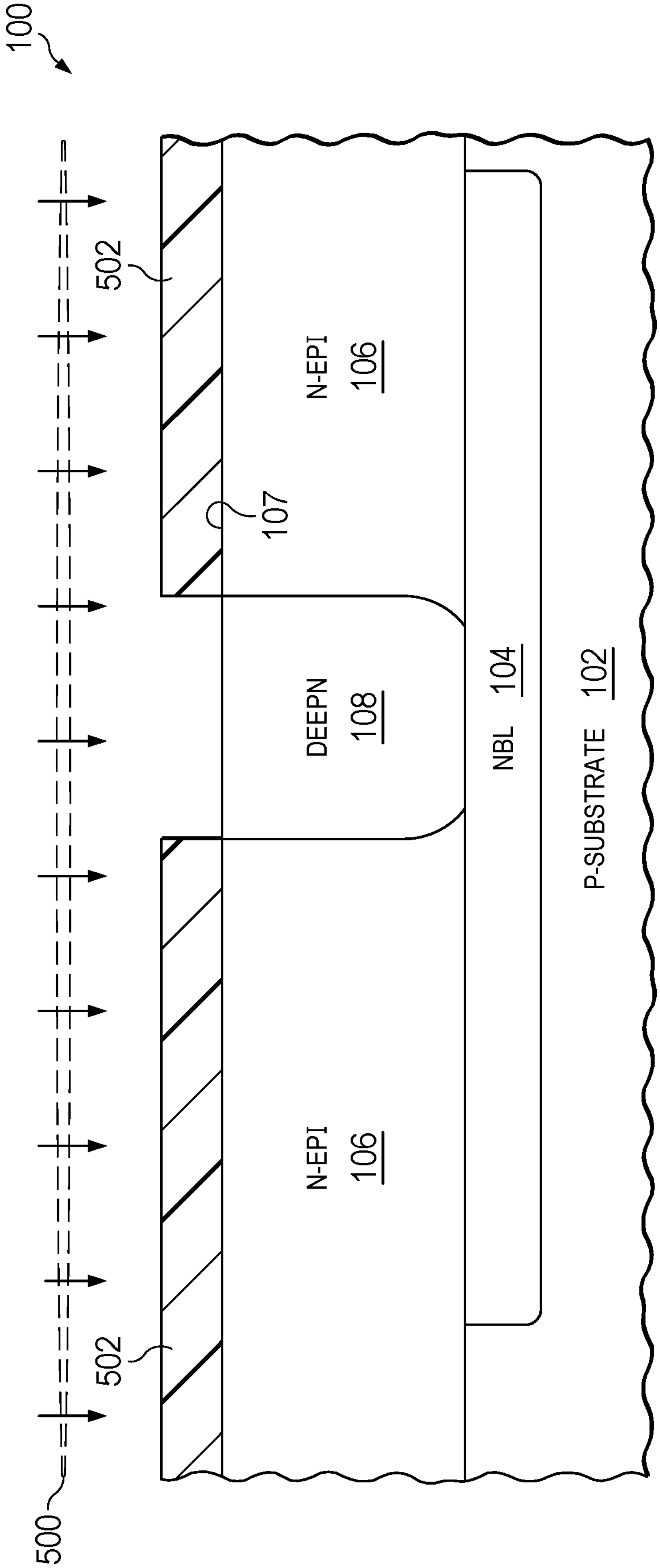

At 206 in FIG. 2, the method 200 also includes forming a deep doped region that includes majority carrier dopants of the second conductivity type. FIG. 5 shows one example, in which an implantation process 500 is performed using an implant mask 502. The implantation process 500 implants dopants of the second conductivity type (e.g., N in the illustrated example) into an exposed portion of the top side 107 of the semiconductor surface layer 106 to form the deep doped region 108 extending from the top side 107 of the semiconductor surface layer 106 to the buried layer 104. The implant mask 502 is then removed. In another implementation, the implant mask 502 includes a second opening (not shown in FIG. 5) and the process 500 implants an exposed second portion of the top side 107 of the semiconductor surface layer 106 to concurrently form a second deep doped region to surround a subsequently formed isolation structure trench (e.g., FIGS. 49 and 51 below).

Figure 6:
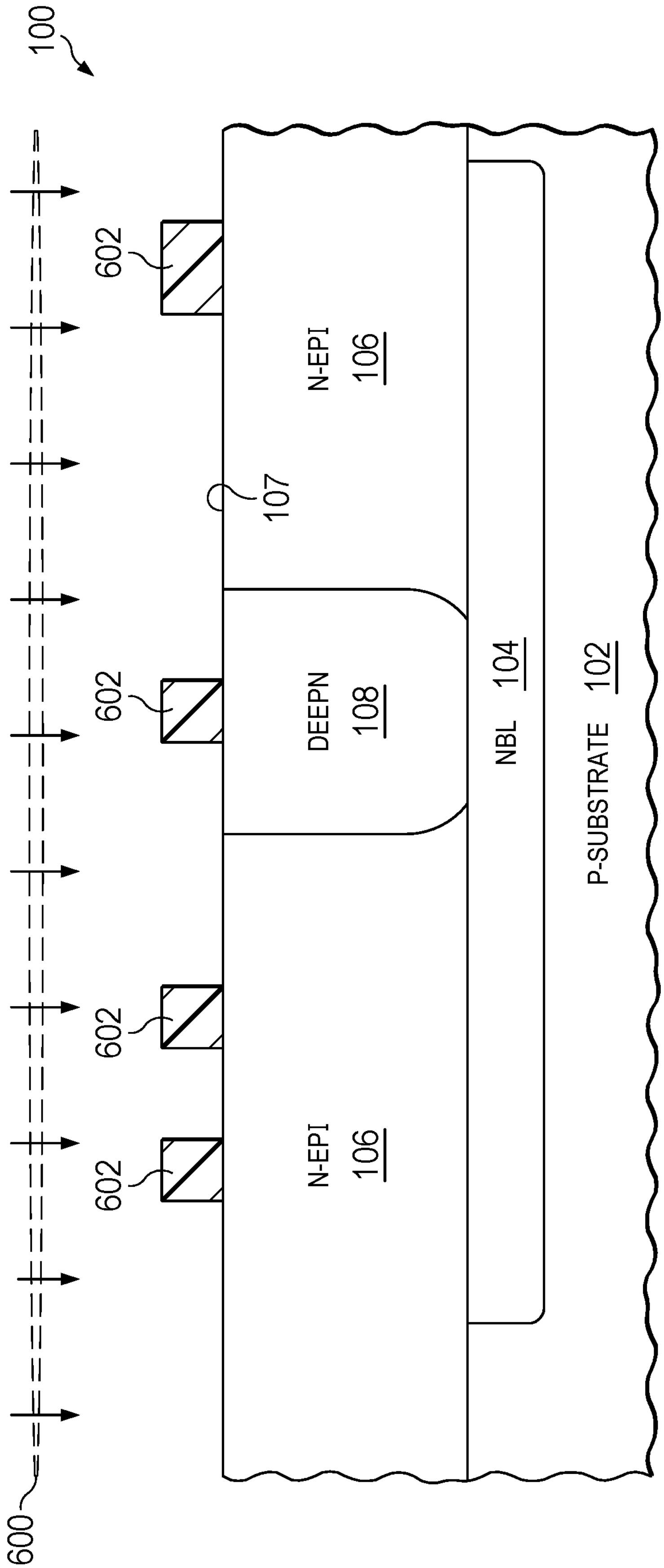
Figure 7:
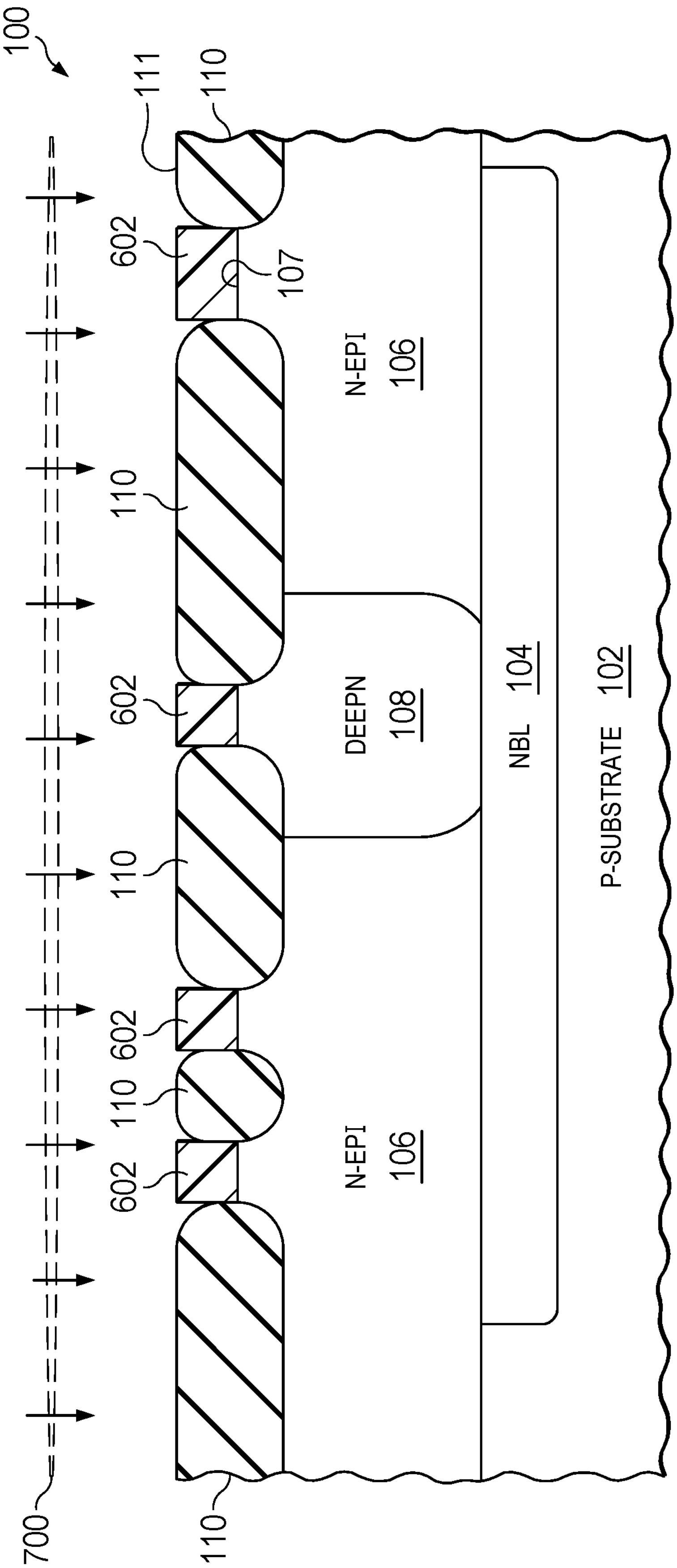

At 208 in FIG. 2, the method 200 also includes forming a field oxide, for example, by local oxidation of silicon (LOCOS) using a nitride mask. FIGS. 6 and 7 show one example, in which a nitride mask is formed, and local oxidation of silicon processing is performed to grow the field oxide 110 on exposed portions of the top side 107 of the semiconductor surface layer 106. In FIG. 6, a process 600 is performed that deposits a mask material, for example, that is or includes silicon nitride (SiN) on the top side 107 of the semiconductor surface layer 106. The process 600 also includes patterning the deposited mask material to form a patterned mask 602 that exposes select portions of the top side 107 of the semiconductor surface layer 106 as shown in FIG. 6.

FIG. 7 shows an example, in which a LOCOS process 700 is performed, for example, in a furnace with an internal oxidizing environment. The LOCOS process 700 forms the field oxide 110 on portions of the top side 107 of the semiconductor surface layer 106, including a portion through which an isolation trench is subsequently etched. The field oxide 110 in one example is or includes $SiO_2$ that penetrates under the surface of the wafer with a Si—SiO2 interface slightly below the level of the top side 107 of the semiconductor surface layer 106. Thermal oxidation of the selected exposed regions of the top side causes oxygen penetration into the top side 107, and the oxygen reacts with silicon and transforms it into silicon dioxide.

In the illustrated example, the processing at 208 forms the field oxide 110 on a portion of the top side 107 of the semiconductor surface layer 106 such that a portion of the field oxide 110 is subsequently in contact with one of a portion of the dielectric liner 121, 122 and a portion of the polysilicon 124 following formation of the deep trench isolation structure as shown in FIG. 1 above.

Figure 8:
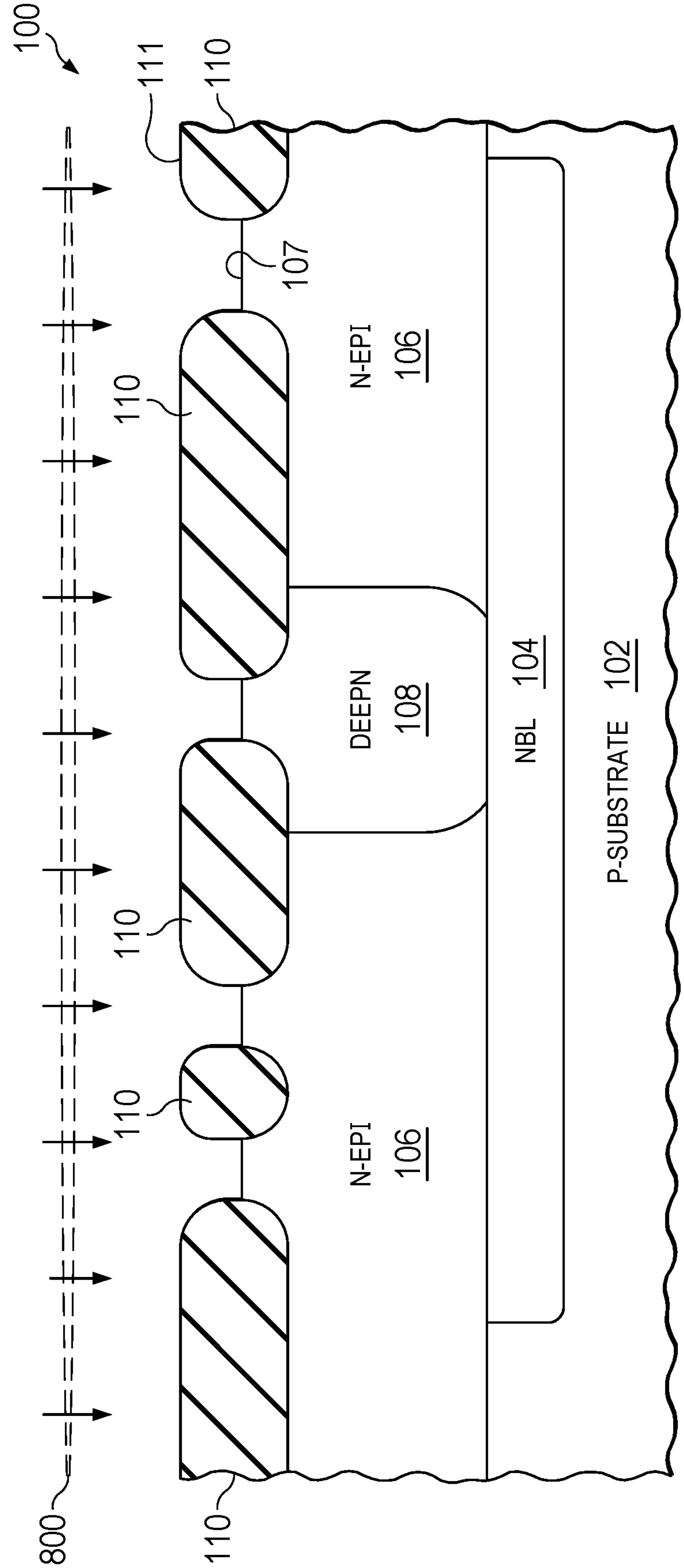

The method 200 continues at 210 with removing the mask 602. FIG. 8 shows an example, in which a stripping process 800 is performed that removes the mask and leaves the patterned field oxide structures 110 having respective top sides 111.

At 212, 214 and 216, the method 200 of FIG. 2 continues with forming a deep isolation trench structure. FIGS. 9-14 show an example that includes forming a dielectric trench etch mask at 212, etching through a portion of the field oxide 110 using the mask at 214, and etching through the semiconductor surface layer 106 and into the semiconductor substrate 102 at 216. In another implementation, for example, in which a blanket implantation was used to form the buried layer 104, the second etch at 216 forms the trench partially into the buried layer 104 (e.g., FIGS. 49 and 51 below).

Figure 9:
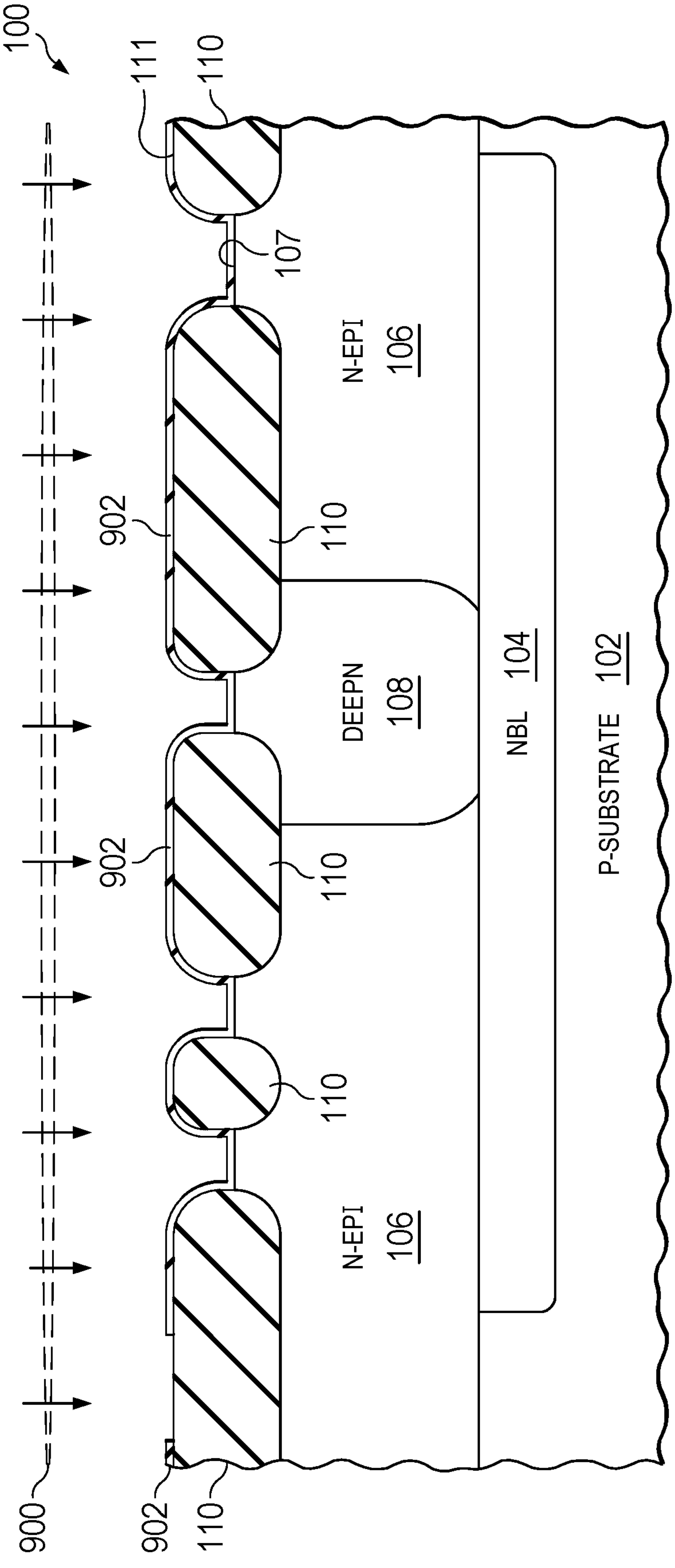
Figure 10:
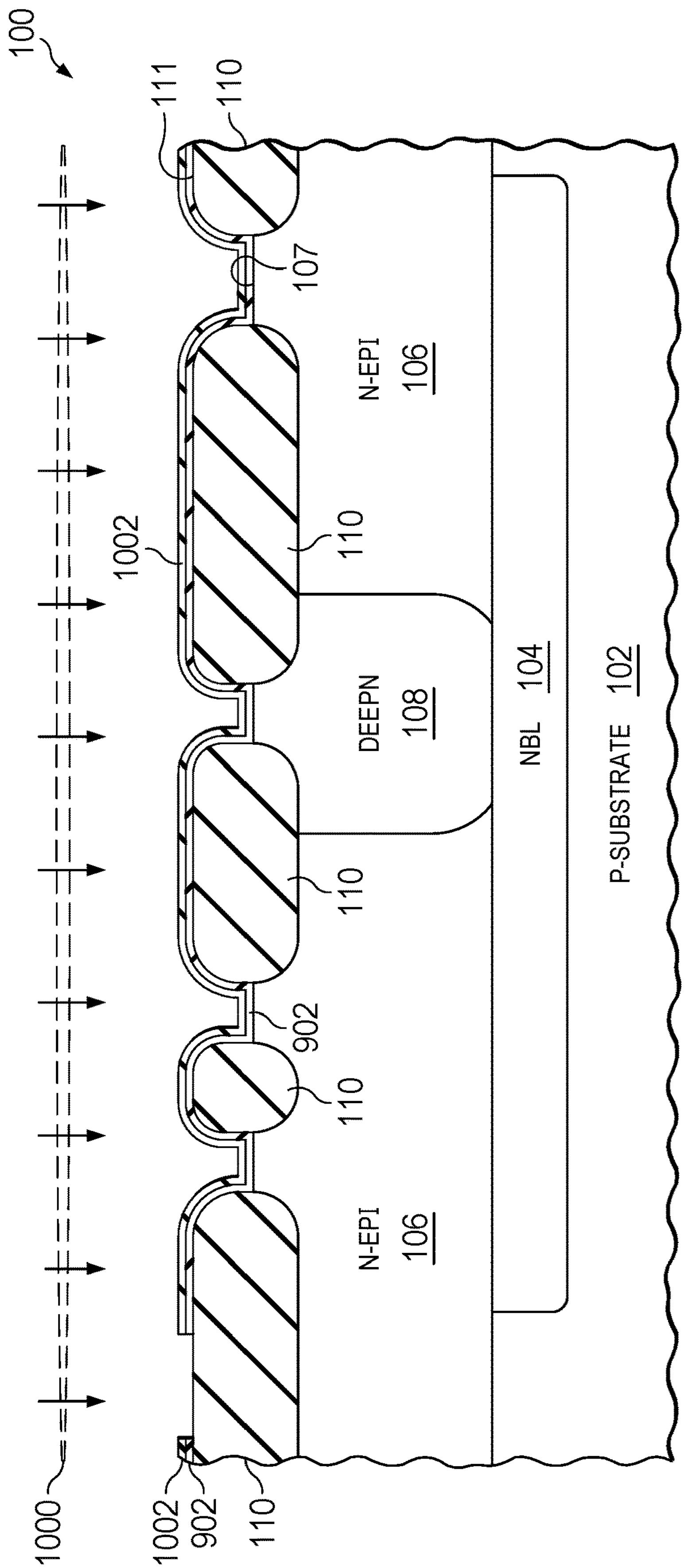
Figure 11:
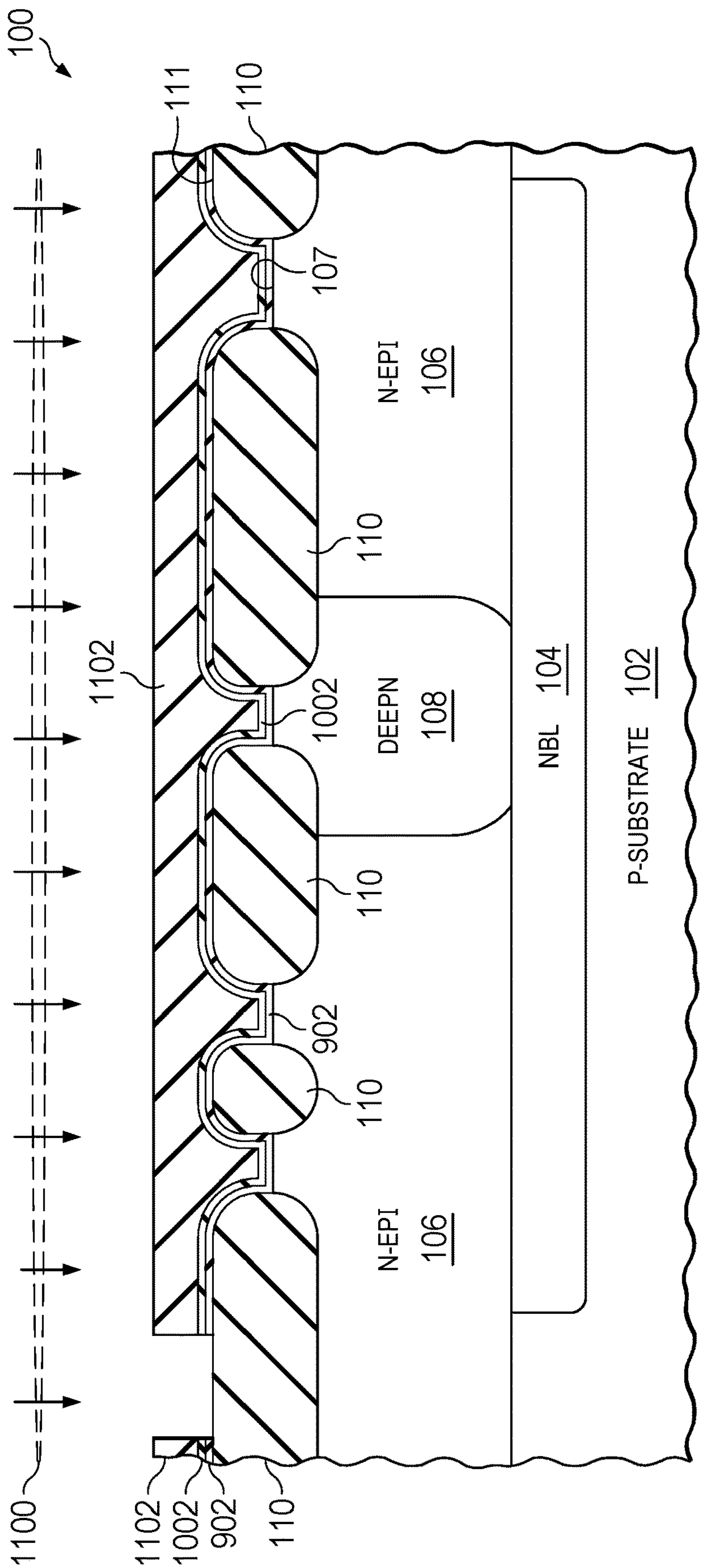

FIGS. 9-11 show an example of the trench etch mask formation at 212, in which a patterned multilayer etch mask is created. The nominal layer thicknesses and composition of the trench etch mask layers are adjustable depending on the depth of the isolation trench and vary within manufacturing tolerances. In other example, more or fewer layers are used in forming the trench etch mask at 212. In the illustrated implementation, a process 900 is performed in FIG. 9 that deposits and patterns a silicon dioxide layer 902 to expose a portion of the field oxide 110. In one example, the silicon dioxide layer 902 has a thickness of 150 Angstroms. In FIG. 10, a process 1000 is performed that deposits (e.g., chemical vapor deposition) and patterns a silicon nitride layer 1002, for example, to a thickness of 2000 Angstroms. In FIG. 11, a process 1100 is performed that deposits and patterns another silicon dioxide layer 1102, for example, to a thickness of 1.4 μm to complete the patterned multilayer dielectric etch mask 902, 1002, 1102.

Figure 12:
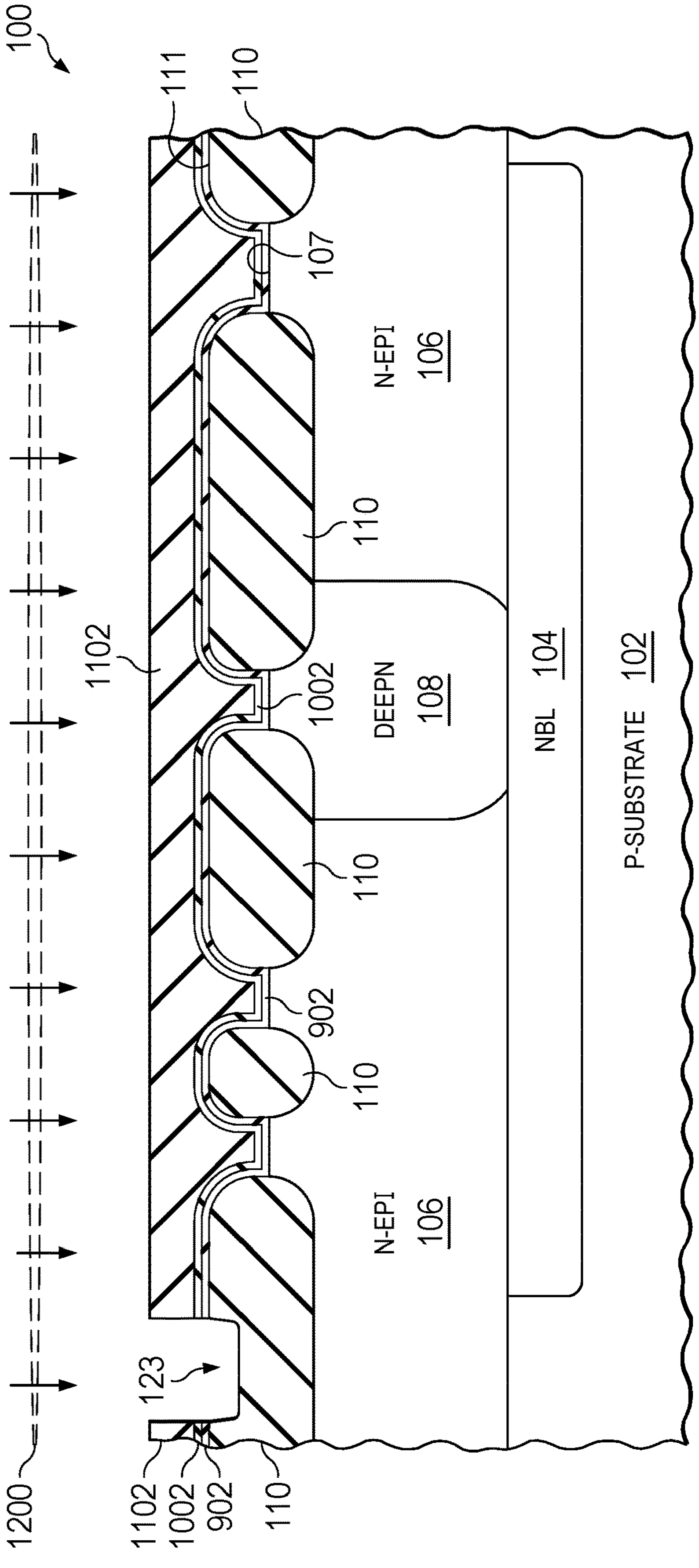
Figure 13:
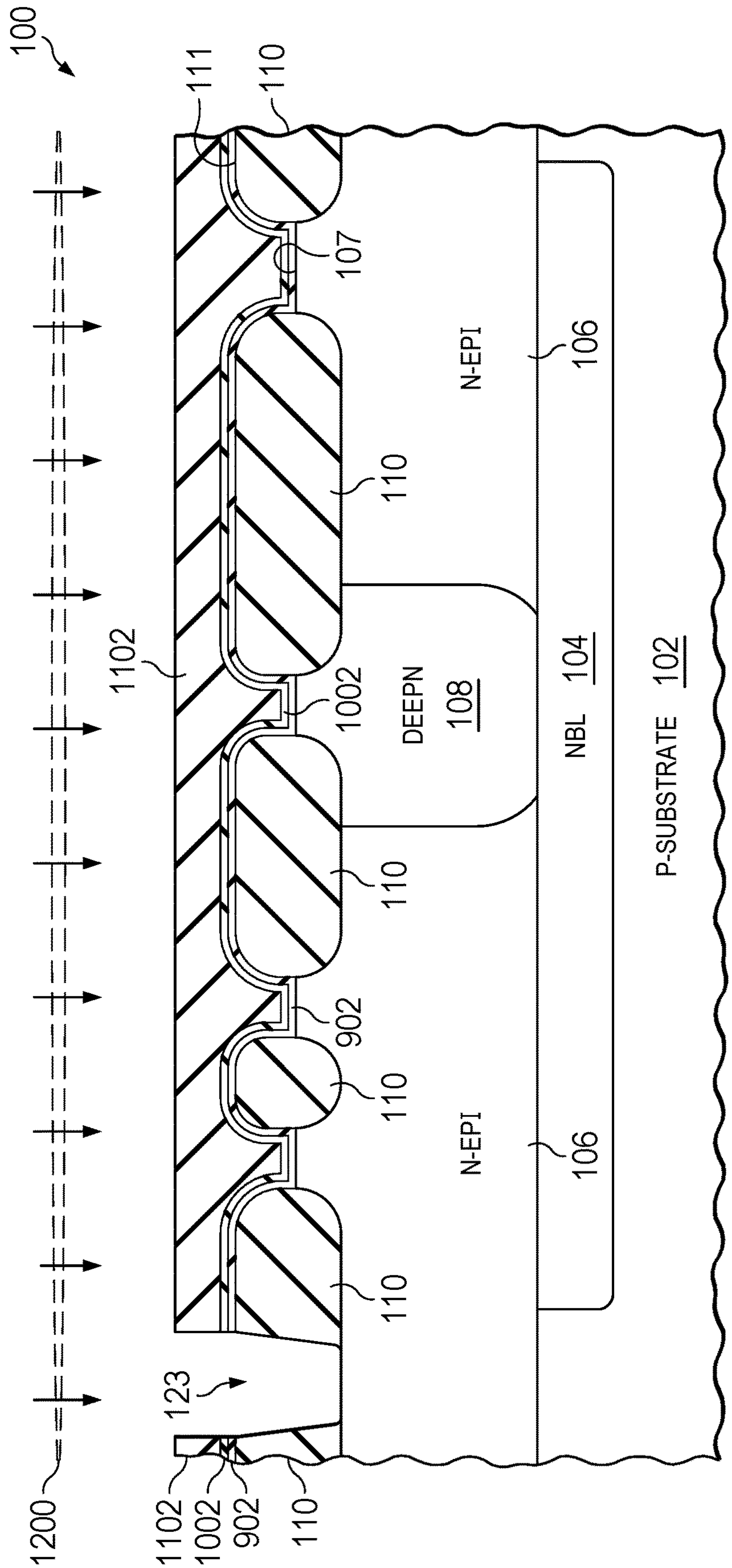

At 214 in FIG. 2, the method 200 continues with etching the field oxide 110 to form an initial portion of the isolation trench 123. FIGS. 12 and 13 show one example, in which a first etch process 1200 is performed using the trench etch mask 902, 1002, 1102. FIG. 12 shows partial performance of the etch process 1200 forming the trench 123 partially into the portion of the field oxide 110 exposed by the trench etch mask 902, 1002, 1102. FIG. 13 shows continued etching via the process 1200 to expose a portion of the semiconductor surface layer 106 at the bottom of the partially formed trench 123. In one example, the first etch process 1200 is a fluorinated etch using carbon, fluorine, and hydrogen sources. In another example, the etch chemistry is carbon and fluorine only and no hydrogen. In one implementation, the first etch process 1200 is selective to the LOCOS field oxide 110 using $Ar/O_2/CF_4/CHF_3$ and with or without one or more other fluorocarbons, and with or without $N_2$. In one example, the first etch process 1200 is performed at room temperature in a plasma etch reactor. In one implementation, an ash and clean operation is performed to strip off any remaining photo resist and clean the electronic device 100. In one example, the ash operation uses $Ar/O_2/N_2/H_2/CF_4$, either all or combinations thereof at a temperature of 100 degrees C. or more. In one example, the clean operation is a dilute HF or industry standard cleaning chemistries in a single wafer tool or hood. In another implementation, the ash and clean operation is omitted.

Figure 14:
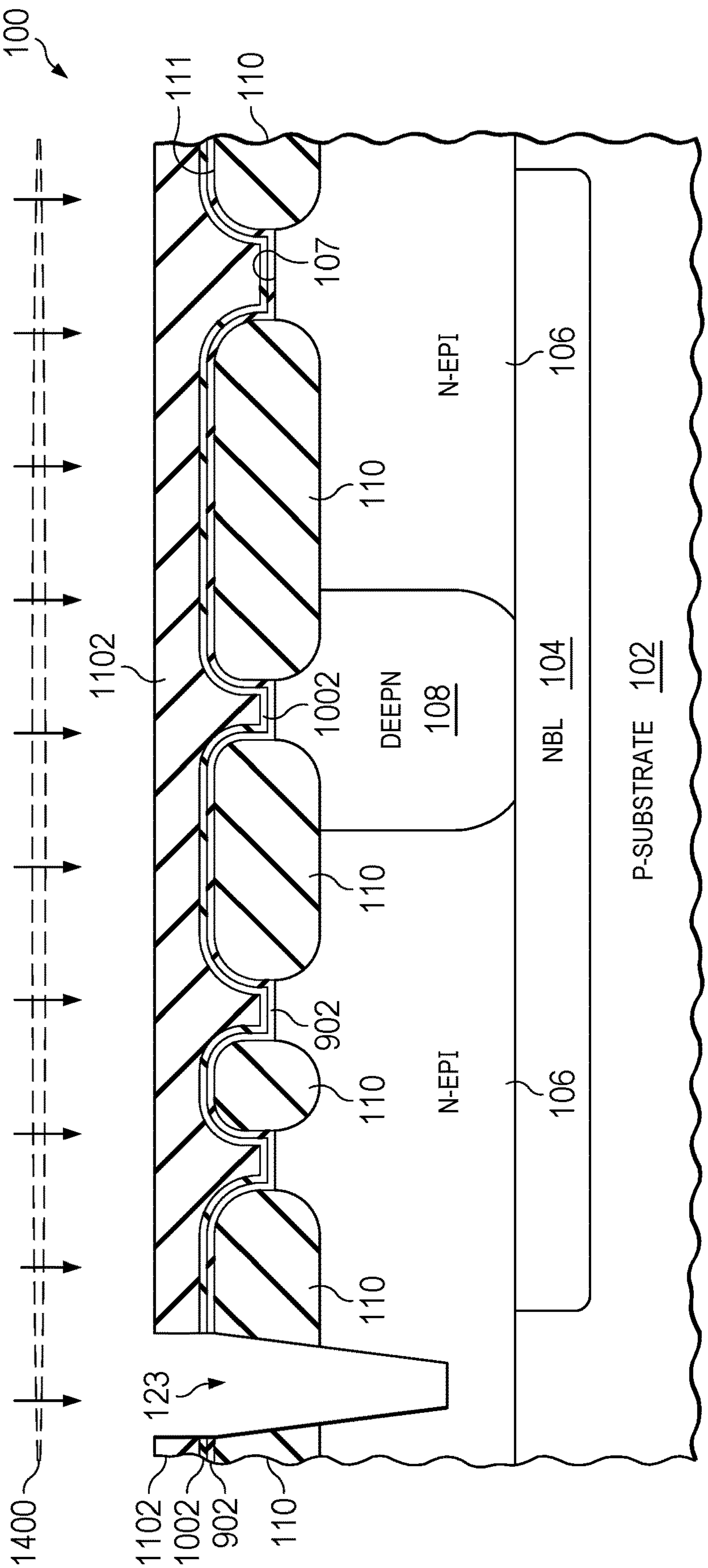
Figure 15:
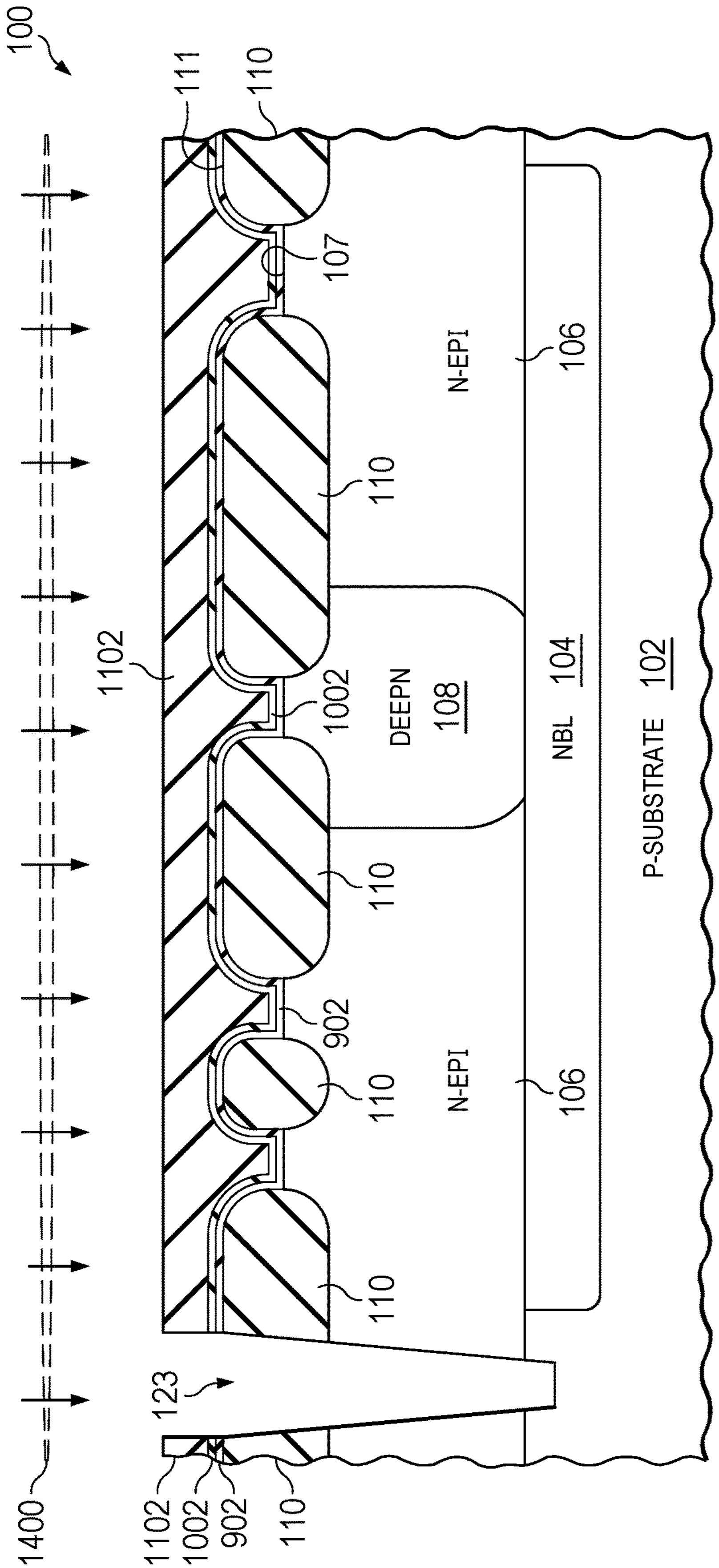

At 216 in FIG. 2, a second etch is performed using the trench etch mask 902, 1002, 1102 to etch through the exposed portion of the semiconductor surface layer 106 and to expose a portion of the semiconductor substrate 102. In another implementation, the second etch process at 216 exposes a portion of a buried layer 104 (e.g., FIGS. 49 and 51 below). FIGS. 14 and 15 show one example, in which a second etch process 1400 is performed using the trench etch mask 902, 1002, 1102. FIG. 14 shows partial performance of the etch process 1400 that extends the trench 123 into the portion of the semiconductor surface layer 106 exposed by the trench etch mask 902, 1002, 1102. FIG. 15 shows continuation of the second etch process 1400 that etches through the remaining portion of the semiconductor surface layer 106 and into the semiconductor substrate 102. In one example, the first etch process 1200 is performed in a first etching tool, and the processed wafer is moved to a different etching tool for the second etch process 1400. In one example, the second etch process 1400 etches the trench 123 into the semiconductor surface layer 106 and into the semiconductor substrate 102 to a trench depth of 20 to 26 μm, such as about 22 μm, and stops in the semiconductor substrate 102.

In another implementation, where a blanket implant is used to form the buried layer 104, the second etch process continues to extend the trench 123 through the semiconductor surface layer 106, through the buried layer 104 and into the semiconductor substrate 102 beneath the buried layer 104. In one example, the second etch process 1400 uses a combination of $SF_6$, oxygen, argon, and HDR, MO2. In another implementation, the second etch process 1400 uses an $Ar/SF_6/O_2/CF_4/HBr/N_2$ etch chemistry. In other implementations, the second etch process 1400 uses a combination of all or some (e.g., two or more) of $Ar/SF_6/O_2/CF_4/HBr/N_2$. In one implementation, the second etch process 1400 is an anisotropic etch performed in a plasma reactor with source and bias radio frequency (RF) power.

In another implementation, such as for a self-aligned deep doped region and isolation trench (e.g., FIGS. 49 and 51 below), a portion of the trench 123 is etched into a previously formed second deep implanted region using the second etch process 1400 to expose the blanket implanted buried layer, and the trench sidewalls are then implanted using traditional beam line implanters, after which the second etch process 1400 is resumed to etch the rest of the trench 123.

The method 200 continues at 218 in FIG. 2 with forming a single or multi-layer trench liner. The total thickness and composition of the trench liner is tailored according to a target breakdown voltage rating for the isolation structure 120 in a given technology. In the illustrated example, the total thickness of the bilayer liner 121, 122 is 5000 to 6000 Angstroms.

Figure 16:
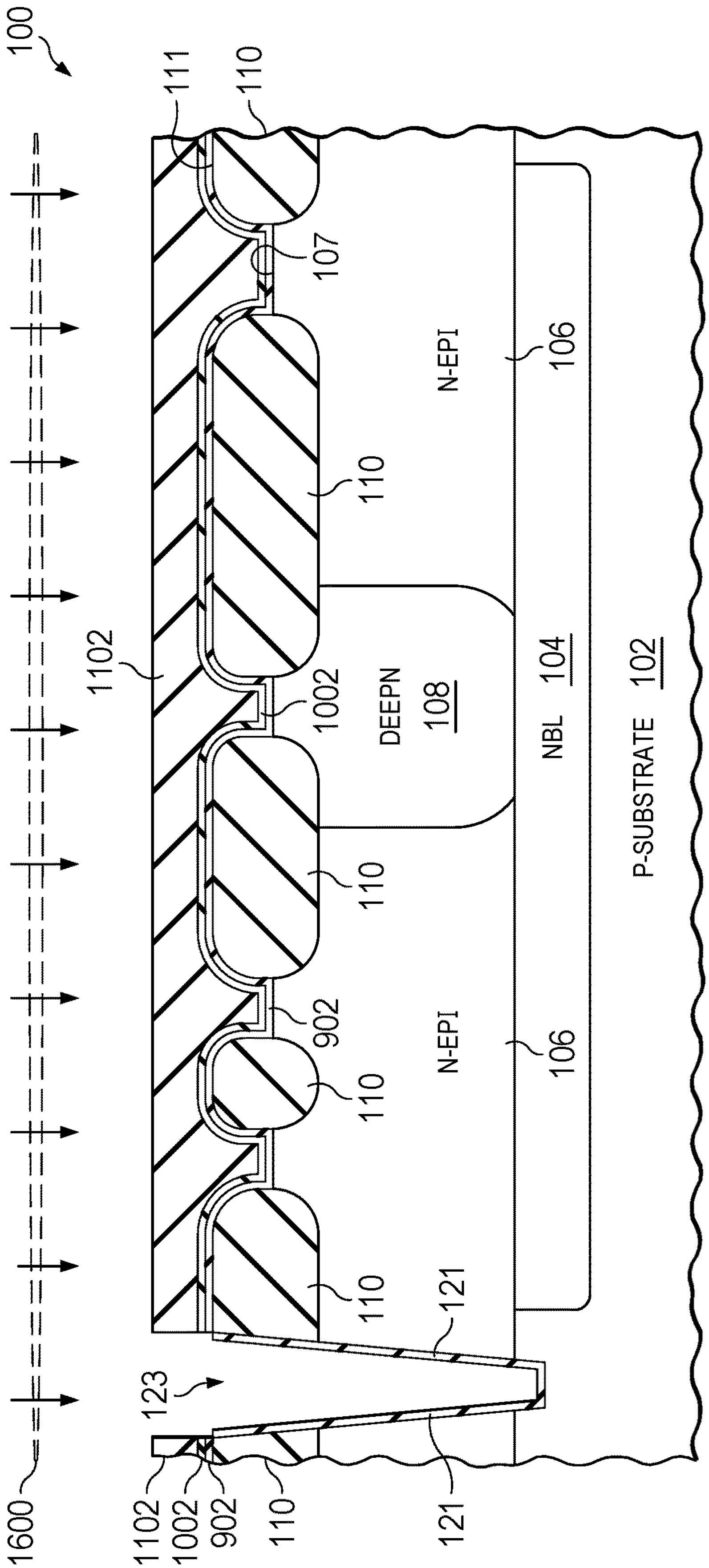
Figure 17:
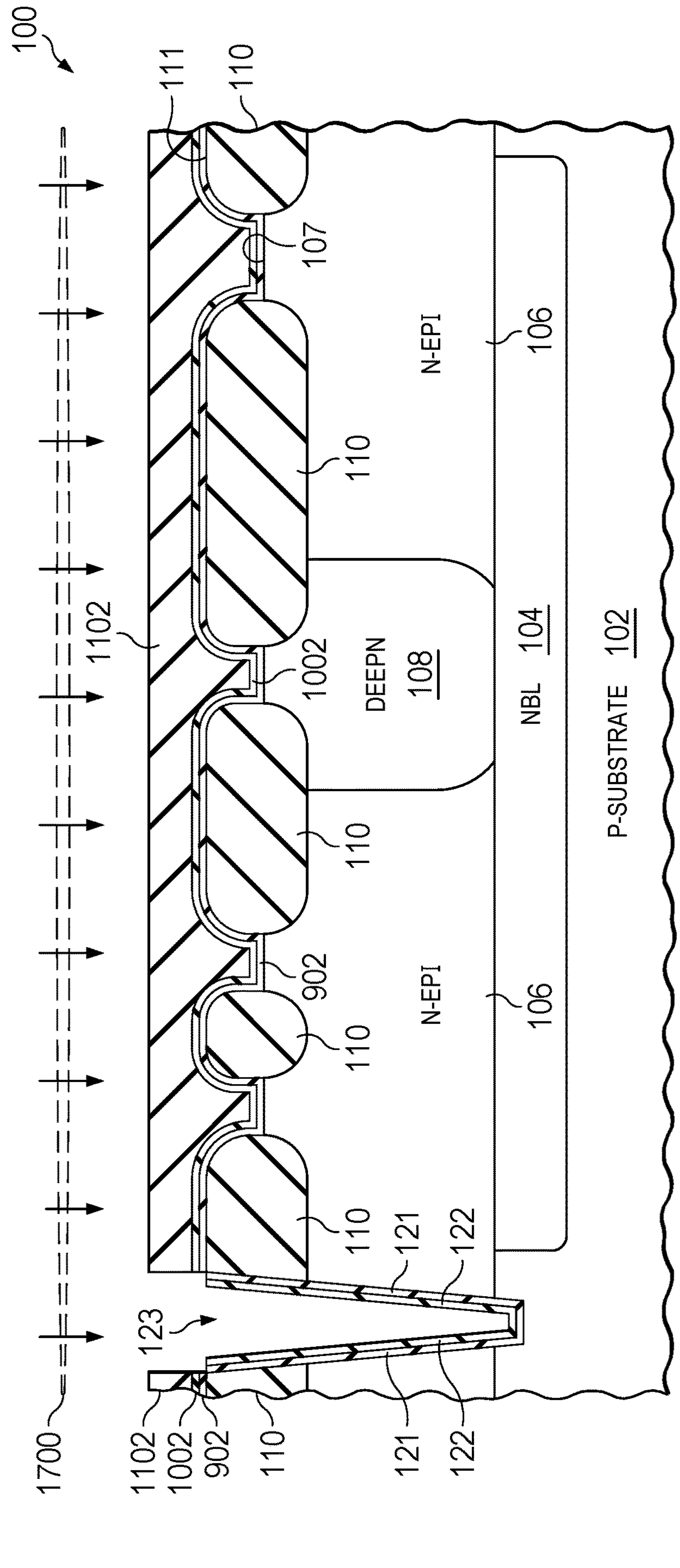

FIGS. 16 and 17 show one example that forms a bilayer oxide trench liner 121, 122 as in FIG. 1 above. The trench liner layers 121 and 122 are formed along the sidewall of the trench 123 from the semiconductor surface layer 106 to the semiconductor substrate 102. In another implementation, such as where a blanket implant was used to form the buried layer 104, the trench liner layers 121 and 122 extend to the buried layer 104. In another example where a blanket implant was used to form the buried layer 104, the trench liner layers 121 and 122 extend to the buried layer 104 and beyond into the underlying semiconductor substrate 102 below the buried layer 104. The nominal layer thicknesses and composition of the trench liner 121, 122 are adjustable and vary within manufacturing tolerances. In other example, more or fewer layers are used in forming the trench liner.

FIG. 16 shows one example, in which a process 1600 is performed to form the first liner layer 121 on the trench sidewall. The process 1600 in one example includes thermal growth in a furnace with an oxidizing interior environment using an $O_2$ source stream at a temperature of about 1050 degrees C. to deposit or grow the first trench liner layer 121 to a thickness of 1000 to 4000 Angstroms.

In FIG. 17, a deposition process 1700 is performed that deposits the second liner layer 122 as a second oxide on the first layer 121. In one implementation, the deposition process 1700 is a sub-atmospheric pressure chemical vapor deposition (SA-CVD) process, for example, using $O_2$ and/or ozone ($O_3$) as a source gas to help catalyze the reaction, at a pressure between 13,300 Pa and 80,000 Pa, and a process temperature of about 300 to 700 degrees C. In one example, the process 1700 deposits the second liner layer 122 as a conformal layer both inside the trench 123 along the first liner layer 121, and outside the trench 123 (not shown in FIG. 17).

Figure 18:
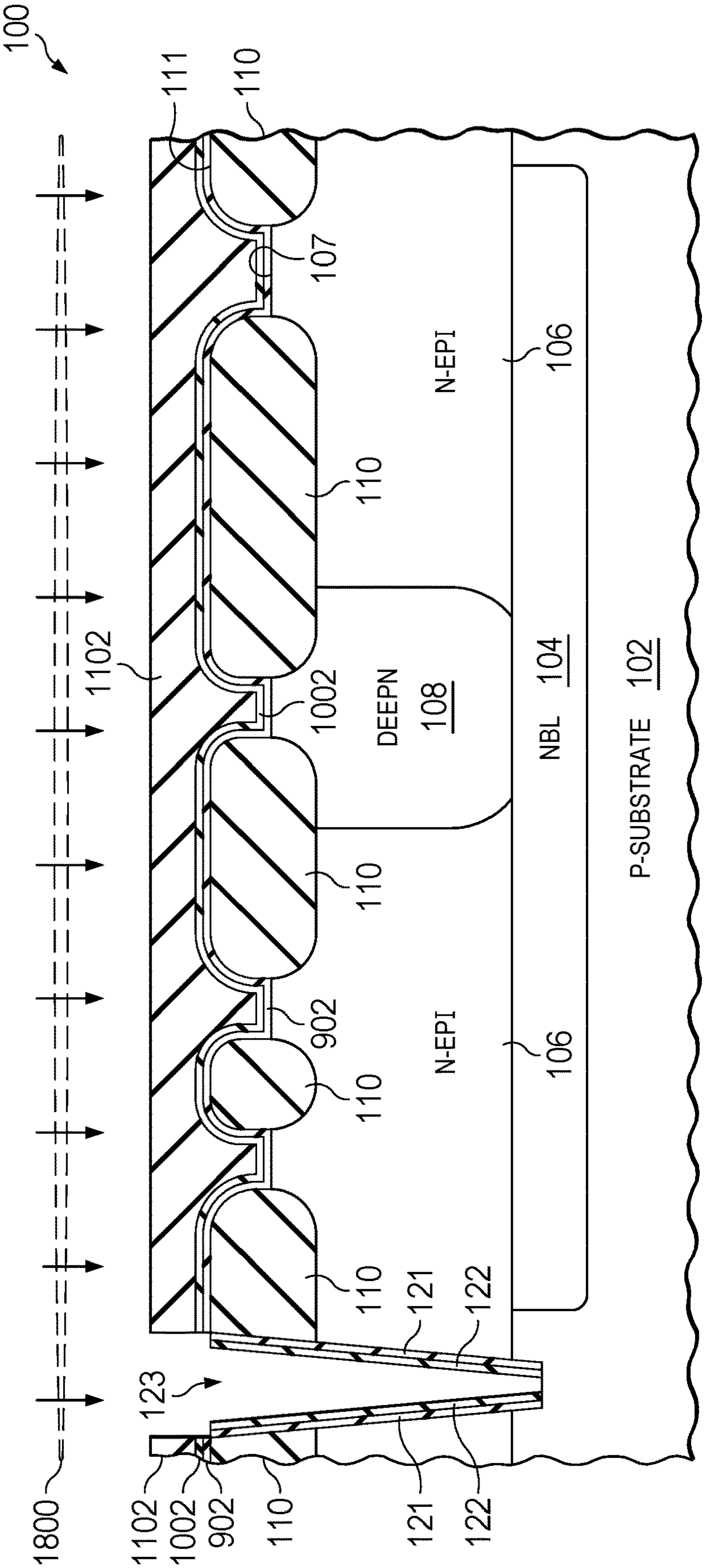

At 220 in FIG. 2, the method 200 continues with etching the trench liner 121, 122. FIG. 18 shows one example, in which a trench liner etch process 1800 is performed, such as an anisotropic plasma dry etch that is self-aligned etch without any additional mask. In one implementation, the etch process 1800 uses all or a combination of $Ar/CF_4/CH_2F_2/CHF_3/N_2/O_2$, and/or another fluorocarbon source at room temperature in a plasma reactor with RF sources and bias power for anisotropy. The etch process 1800 removes the liner layers 121 and 122 from the bottom of the trench 123 and exposes a portion of the semiconductor substrate 102. In another implementation, such as where a blanket implant was used to form the buried layer 104, the trench liner etch process 1800 exposes a portion of the buried layer 104 (e.g., FIGS. 49 and 51 below). In another example where a blanket implant was used to form the buried layer 104, the trench liner layers 121 and 122 extend to the buried layer 104 and beyond into the underlying semiconductor substrate 102, and the etch process 1800 exposes a portion of the semiconductor substrate 102 below the buried layer 104.

Figure 19:
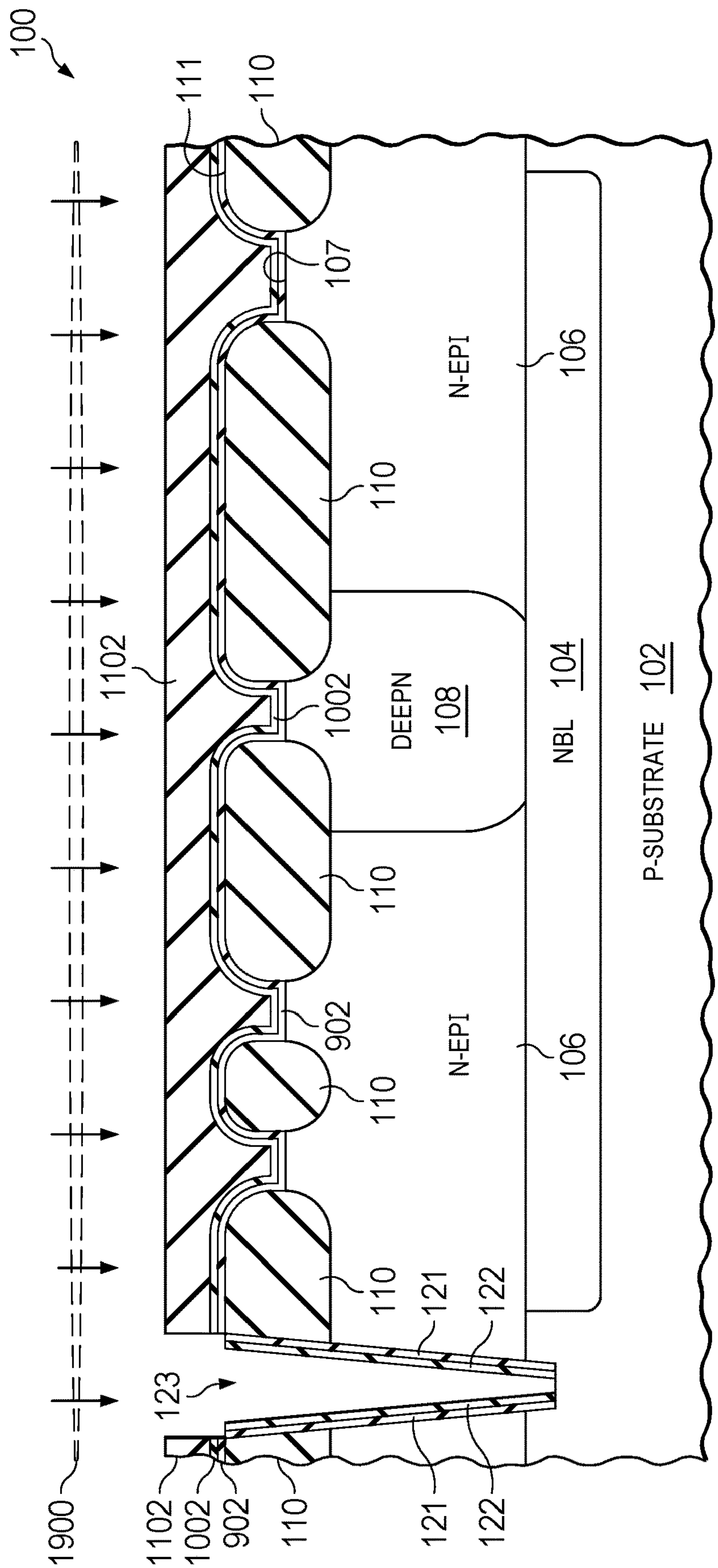

In one example, the device is cleaned after the trench bottom etch. FIG. 19 shows one example, in which a cleaning process 1900 is performed that cleans the trench bottom. In one example, the cleaning process 1900 is a dilute HF or other low oxide loss cleaning operation performed in a single wafer processing tool or hood, such as SC1-SPOM, etc.

Figure 20:
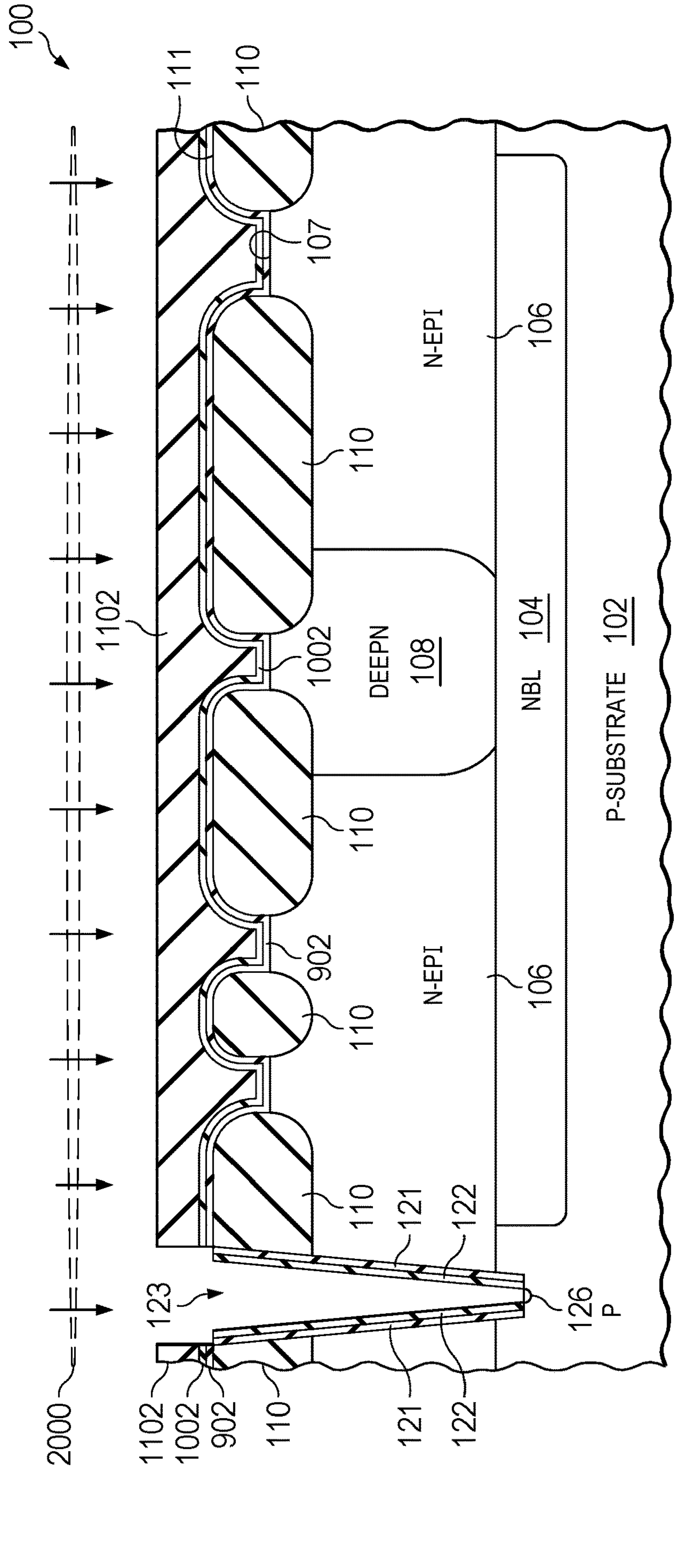

At 222 in FIG. 2, the method 200 continues with implanting the bottom of the trench 123 with majority carrier dopants of a first conductivity type (e.g., P in the illustrated example). FIG. 20 shows one example, in which a trench bottom implantation process 2000 is performed that implants boron or other majority carrier dopants of the first conductivity type into the portion 126 (e.g., an implanted region) of the semiconductor substrate 102. The trench bottom implantation process 2000 enhances conductivity and passivates any damage to the interface of the underlying material of the semiconductor substrate 102 or buried layer material resulting from the trench bottom etch process 1800. No additional mask is required for the trench bottom implantation process 2000 since the trench etch mask 902, 1002, 1102 prevents implantation outside the trench 123. In one example, the trench bottom implantation process 2000 is performed using a beam line implantation tool for zero-degree implantation of boron dopants at an implantation energy of 60 KeV to provide a majority carrier concentration of 5 E14 mm-3 with four rotations of the wafer during implantation.

Figure 21:
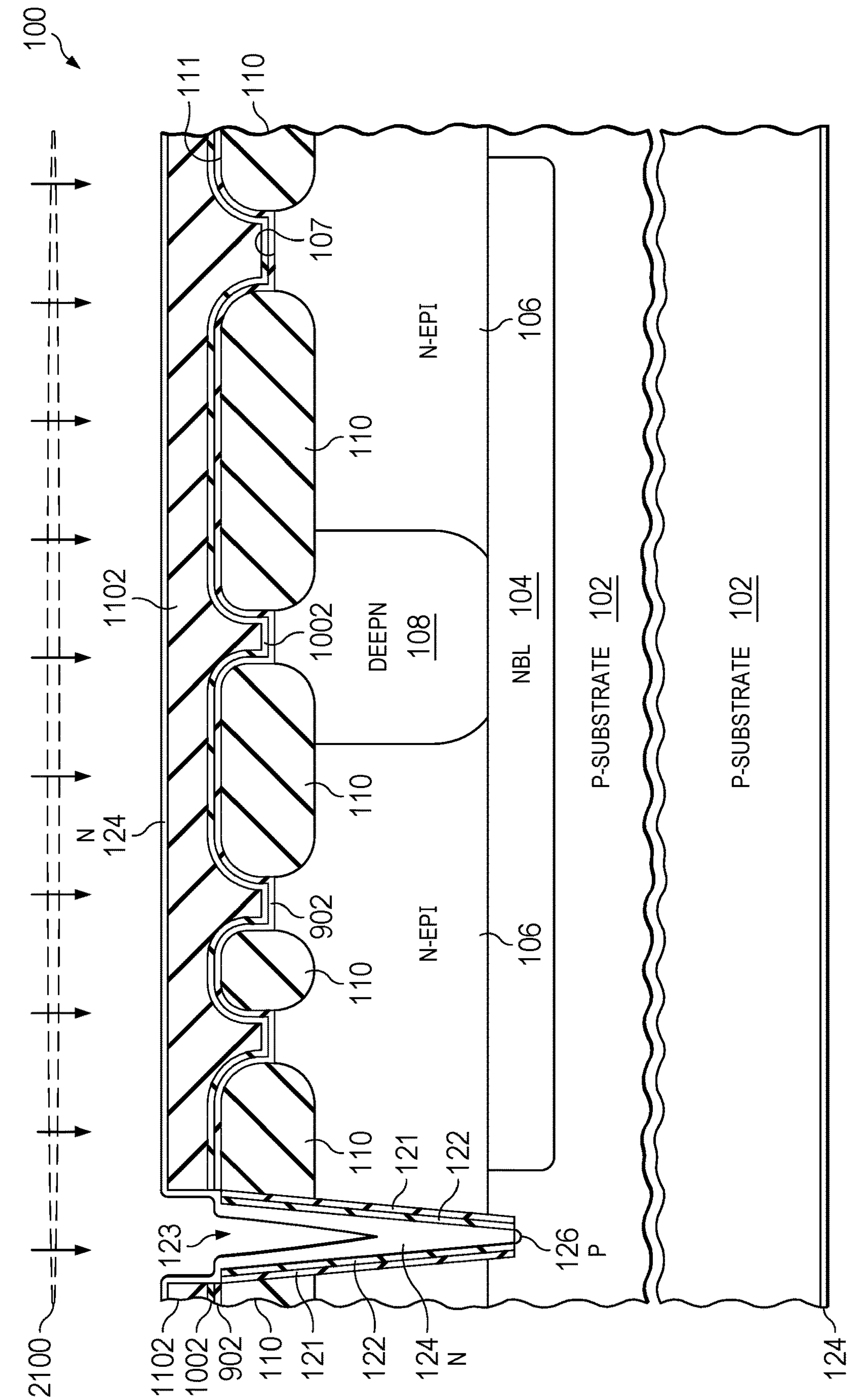
Figure 22:
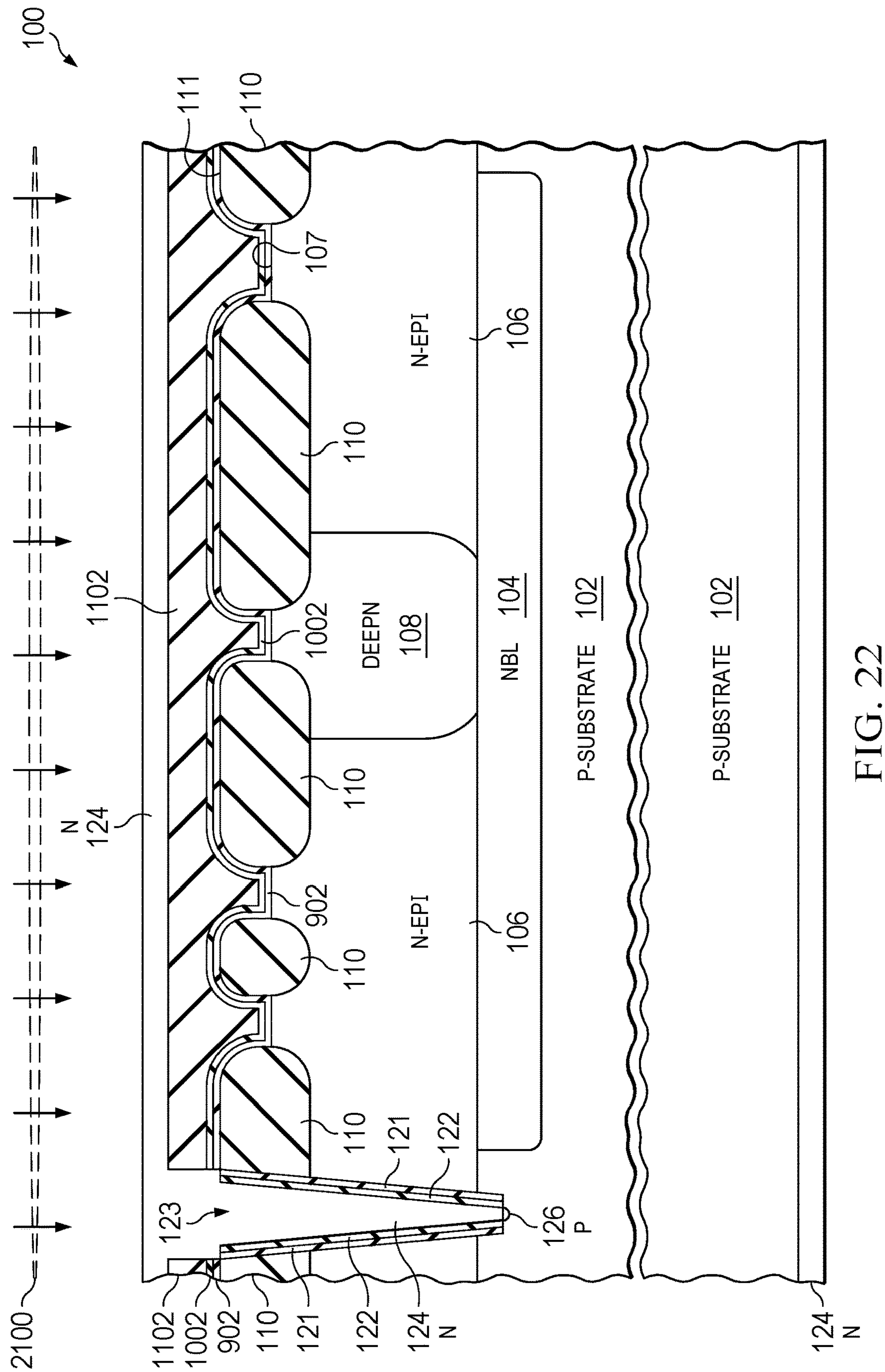

The method 200 also includes filling the trench 123 with the polysilicon 124 at 224. FIGS. 21 and 22 show one example, in which a process 2100 is performed that forms the polysilicon 124 in the trench 123 and fills the trench 123 to and beyond the top side 107 of the semiconductor surface layer 106. The process 2100 in one example includes epitaxial silicon growth with in-situ doping to form the polysilicon 124 with majority carrier dopants of the second conductivity type (e.g., N in the illustrated example). FIG. 21 shows partial completion of the fill deposition process 2100 that conformally starts to fill the trench while conformally covering the device with deposited polysilicon 124 outside the trench 123 and on the wafer bottom. FIG. 22 shows completion of the process 2100 with the trench 123 filled with polysilicon 124.

In one example, the deposition process 2100 includes in-situ doped poly fill using $BCl_3$ as a dopant source gas for boron with silane as the Si source. In one implementation, the entire deposited polysilicon is doped in-situ. Another implementation deposits an in-situ doped thin layer and then deposits an undoped layer, followed by an anneal or high temperature drive to diffuse dopants throughout. In one example, the polysilicon deposition process 2100 is performed in a furnace at a process temperature of 500 to 700 degrees C. In another example, the process 2100 deposits completely undoped polysilicon 124, followed by an implant with n or p type dopants using a suitable implantation process. In another example, a deposition (e.g., epitaxial growth) is performed and a separate implantation provides majority carrier dopants of the second conductivity type into the deposited polysilicon 124 in the trench 123, followed by a thermal anneal to drive the implanted dopants into the polysilicon 124 of the filled trench 123. In the illustrated example, the process 2100 forms the polysilicon 124 in the trench 123 along the liner 121, 122 and the polysilicon 124 also extends over the trench etch mask 902, 1002, 1102 that remains on the field oxide 110.

Figure 23:
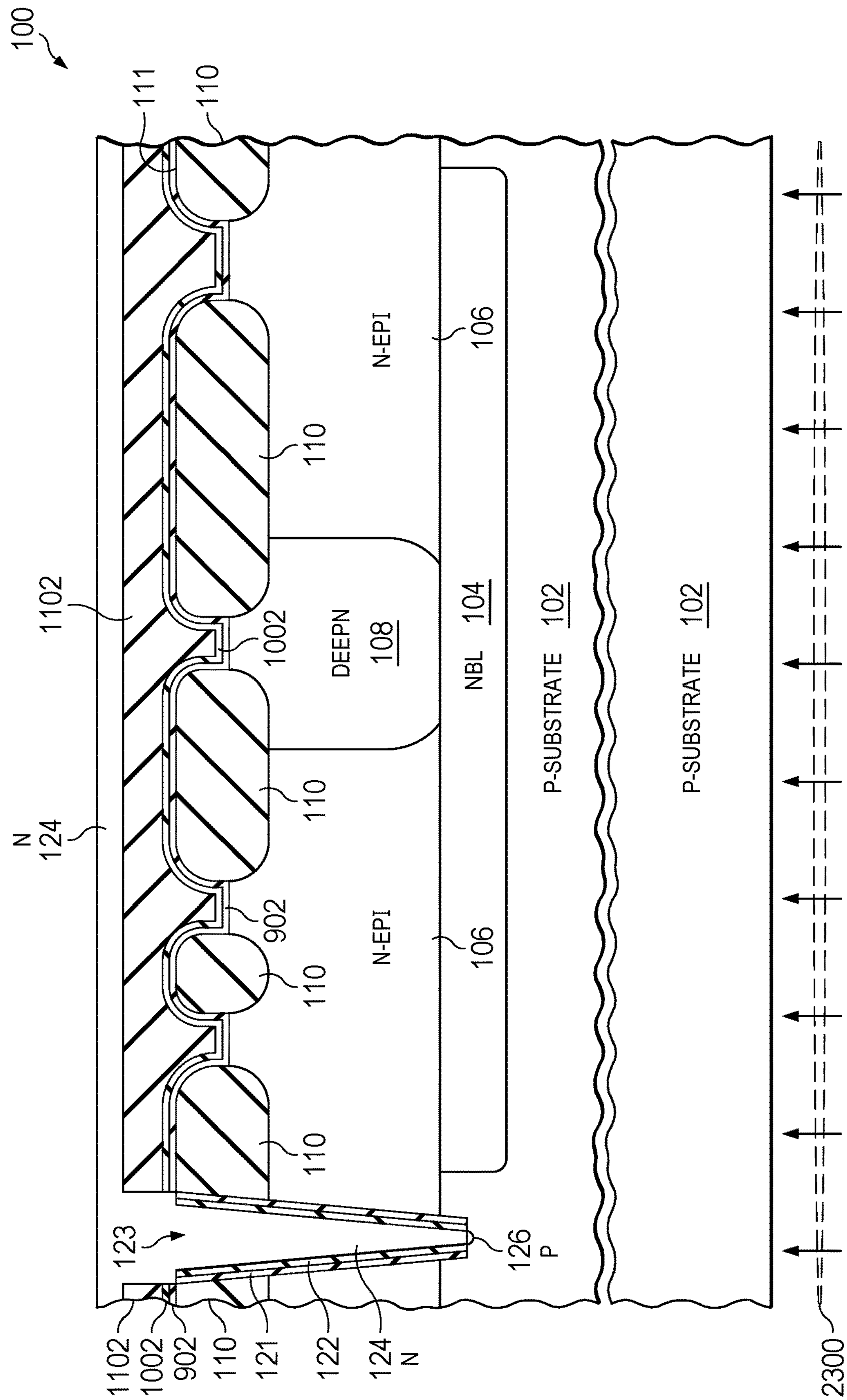

The method 200 of FIG. 2 also includes removing the deposited polysilicon from the wafer backside (e.g., from the bottom) at 226. FIG. 23 shows one example, in which a stripping process 2300 is performed that removes the polysilicon 124 from the back side of the semiconductor substrate 102. In one implementation, the back side poly strip process 2300 includes exposing the back side of the semiconductor substrate 102 to HF/nitric acid to provide high selectivity to $SiO_2$ and SiN using a wafer clean tool, such as SEZ, etc.

Figure 24:
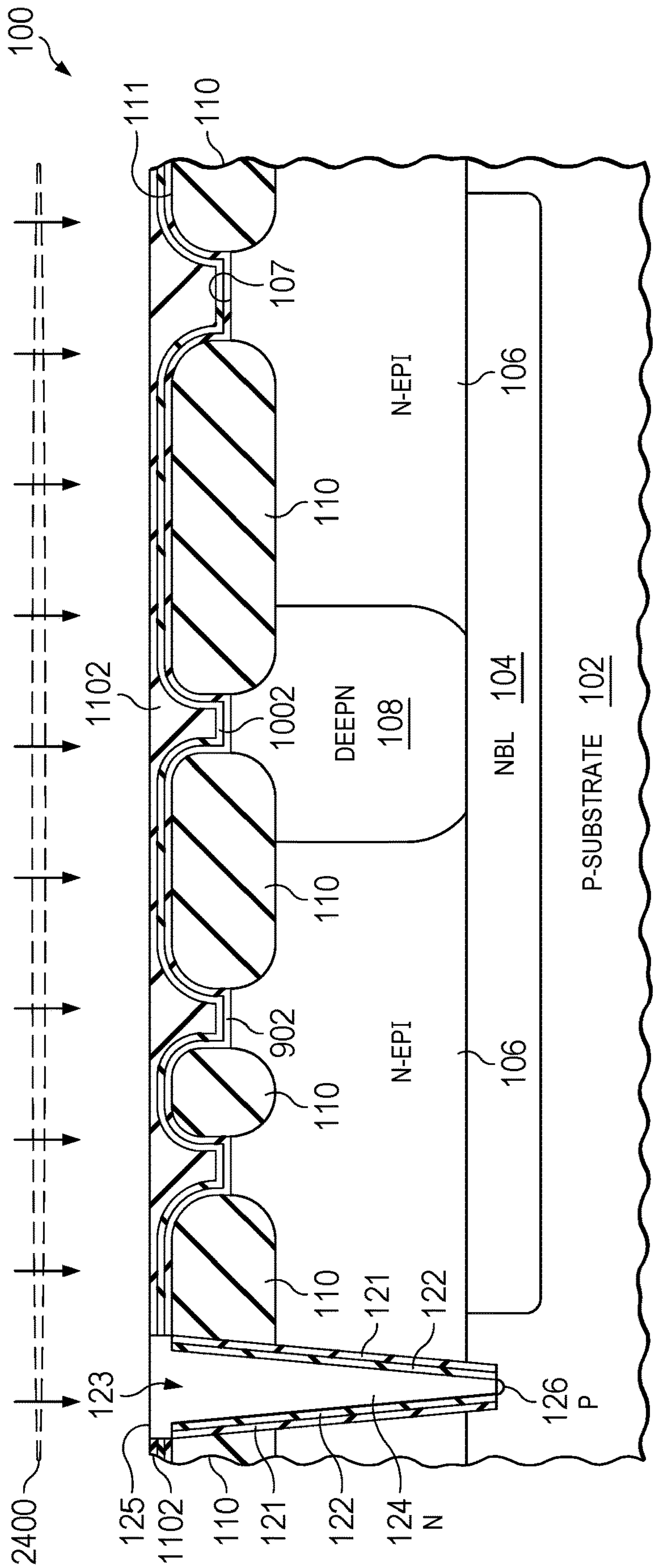

At 228 in FIG. 2, the method 200 also includes planarizing the front side of the wafer (e.g., the top side in the illustrated orientation). FIG. 24 shows one example, in which a chemical mechanical polishing (CMP) process 2400 is performed that planarizes the top side and sets the height of the top side 125 of the polysilicon 124 in the trench 123. In one example, the CMP process 2400 stops on or slightly above the silicon nitride layer 1002 of the multilayer trench etch mask. In one implementation, the CMP process 2400 is performed in a CMP tool using a process slurry, for example, a ceria slurry that has good selectivity to nitride, in which the polysilicon 124 is polished with an endpoint to stops on the silicon dioxide, after which the silicon dioxide is polished stopping on the silicon nitride mask layer 1002. In one implementation, a further cleaning operation is performed at 228, for example, using a non-HF solution to mitigate surface particle defects.

The method 200 continues at 230 in FIG. 2 to remove the remaining trench etch mask remnants. FIG. 25 shows one example, in which a nitride strip process 2500 is performed that removes any remaining portions of the trench etch mask layers 902, 1002, 1102. In one example, the nitride strip process 2500 includes a hot phosphoric acid clean to etch SiN.

The method 200 also includes transistor fabrication and metallization at 232, beginning with gate polysilicon deposition and patterning, and includes formation of various circuit components, such as transistors, polysilicon capacitors and resistors, etc., as well as formation of a single or multilayer metallization structure (e.g., FIG. 1 above).

At 234 in FIG. 2, the method 200 includes wafer probe testing, die separation or singulation to separate processed dies from the wafer structure, and packaging to produce packaged electronic devices. FIG. 26 shows the finished electronic device 100 that includes a package structure having a semiconductor die 2600 enclosed in a molded package 2602. In the illustrated example, the die 2600 is mounted on a die attach pad 2604, and conductive bond pads of the die 2600 are electrically coupled to respective leads 2606 via conductive bond wires 2608.

The example electronic device 100 and method 200 provide deep trench isolation solutions for any process flow in which LOCOS or other type of field oxide 110 is used for lateral device isolation or raised gate integration, etc., and incorporates deep trench isolation in the process flow (e.g., field oxide processing before deep trench processing) without the need to have additional cost or complexity associated with shallow trench isolation (STI) processing or mask. The thickness and composition of the trench etch hard mask layer or layers (e.g., 902, 1002, 1102 above) can be adjusted or tailored to enable enhanced dielectric breakdown performance in a cost-effective, robust and manufacturable deep trench isolation loop, with or without a self-aligned deep-n sinker and substrate contacts.

Figure 27:
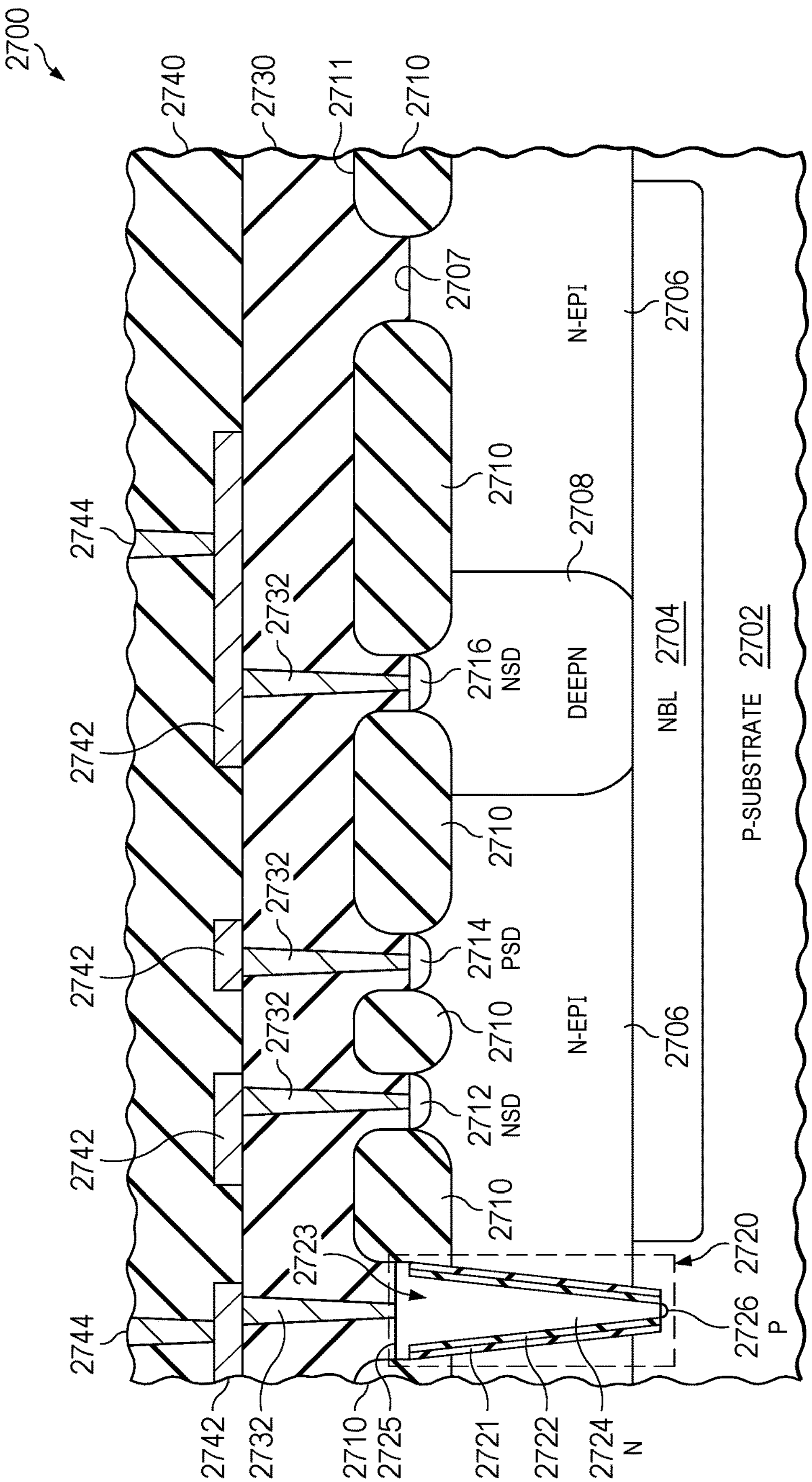
FIG. 27 is a partial sectional side elevation view of another electronic device that includes a deep trench isolation structure formed between field oxide structures.

Referring now to FIGS. 27-48, another implementation integrates deep trench isolation with field oxide lateral isolation structures in which the deep trench processing precedes field oxide formation, and the deep isolation trench does not extend through field oxide. These examples provide the same advantages described above in connection with FIGS. 1-26. FIG. 27 shows another electronic device 2700 that includes a deep trench isolation structure formed between field oxide structures. The DTI structure in this example facilitates electrical isolation between components or circuits without adding an STI mask and without the cost and complexity of STI processing. The electronic device 2700 in one example is an integrated circuit product, only a portion of which is shown in FIG. 27. The electronic device 2700 includes electronic components, such as transistors, resistors, capacitors (not shown) fabricated on or in a semiconductor structure of a starting wafer, which is subsequently separated or singulated into individual semiconductor dies that are separately packaged to produce integrated circuit products.

The electronic device 2700 includes a semiconductor structure having a semiconductor substrate 2702, a buried layer 2704 in a portion of the semiconductor substrate 2702, a semiconductor surface layer 2706 with an upper or top side 2707 and a deep doped region 2708, and field oxide structures 2710 that have upper or top sides 2711 and extend on corresponding portions of the top side 2707 of the semiconductor surface layer 2706. In one example, the field oxide 2710 is or includes silicon dioxide ($SiO_2$) grown by a thermal oxidation process during fabrication of the electronic device 2700.

The semiconductor substrate 2702 in one example is a silicon or silicon on insulator (SOI) structure that includes majority carrier dopants of a first conductivity type. The buried layer 2704 extends in a portion of the semiconductor substrate 2702 and includes majority carrier dopants of a second conductivity type. In the illustrated implementation, the first conductivity type is P, the second conductivity type is N, the semiconductor substrate 2702 is labeled "P-SUBSTRATE", and the buried layer 2704 is an N-type buried layer labeled "NBL" in the drawings. In another implementation (not shown), the first conductivity type is N and the second conductivity type is P.

The semiconductor surface layer 2706 in the illustrated example is or includes epitaxial silicon having majority carrier dopants of the second conductivity type and is labeled "N-EPI" in the drawings. The deep doped region 2708 includes majority carrier dopants of the second conductivity type and is labeled "DEEPN" in the drawings. The deep doped region 2708 extends from the semiconductor surface layer 2706 to the buried layer 2704. A first portion 2712 (e.g., a first implanted region) of the semiconductor surface layer 2706 along the top side 2707 includes majority carrier dopants of the second conductivity type and is labeled "NSD" in the drawings. A second portion or implanted region 2714 of the semiconductor surface layer 2706 along the top side 2707 includes majority carrier dopants of the first conductivity type and is labeled "PSD" in the drawings. A third portion 2716 (e.g., a third implanted region) of the semiconductor surface layer 2706 within the deep doped region 2708 along the top side 2707 includes majority carrier dopants of the second conductivity type and is labeled "NSD" in the drawings.

The electronic device 2700 includes a deep trench isolation structure 2720 with a bilayer dielectric liner having a first dielectric liner layer 2721 and a second dielectric liner layer 2722 along a sidewall of a trench 2723. In another implementation, a single layer dielectric liner (not shown) is formed along the trench sidewall. In another implementation, a multilayer dielectric liner (not shown) includes more than two dielectric layers along the trench sidewall. The trench 2723 is filled with doped polysilicon 2724 having an upper or top side 2725. In this example, the top side 2725 of the polysilicon 2724 is at a lower level than the top sides 2711 of the field oxide structures 110. The trench 2723 extends through the semiconductor surface layer 2706 to the semiconductor substrate 2702. A portion 2726 (e.g., an implanted region) of the semiconductor substrate 2702 under the trench 2723 includes majority carrier dopants of the first conductivity type.

In the illustrated example, the buried layer 2704 is formed by a masked implantation process and does not extend laterally to the bottom of the trench 2724. In another implementation (e.g., FIGS. 49 and 51 below), the buried layer is formed by a blanket implantation process and the trench extends into the buried layer of the semiconductor substrate. The bilayer dielectric liner 2721, 2722 extends on the sidewall of the trench 2723 from the semiconductor surface layer 2706 to the semiconductor substrate 2702. In another implementation (e.g., FIGS. 49 and 51 below), the dielectric liner extends on the sidewall of the trench 2723 from the semiconductor surface layer 2706 to the buried layer 2704.

The polysilicon 2724 includes majority carrier dopants of the second conductivity type (e.g., N in this example). The polysilicon 2724 extends on the dielectric liner 2721, 2722 and fills the trench 2723 to the top side 2707 of the semiconductor surface layer 2706. In the example of FIG. 27, the trench 2723 and the polysilicon 2724 extend beyond the top side 2707 of the semiconductor surface layer 2706 and an upper lateral side of the polysilicon 2724 contacts a portion of the lateral side of the field oxide 2710. As described further below in connection with FIGS. 28-48, the isolation structure 2720 in the electronic device 2700 of FIG. 27 is fabricated before formation (e.g., growth) of the field oxide structure 2710, and the top side 2711 of the field oxide 2710 extends upward past and above the top side 2725 of the polysilicon 2724 in the configuration and orientation shown in the drawings.

The deep doped region 2708 in FIG. 27 is spaced apart laterally from the isolation structure 2720. In another example, the deep doped region 2708 is omitted and another deep doped region (not shown) extends from the semiconductor surface layer 2706 and into one of the buried layer 2704 and the semiconductor substrate 2702, laterally surrounds a portion of the trench 2723, and includes majority carrier dopants of the second conductivity type. In another example (e.g., FIGS. 49 and 51 below), a second deep doped region extends from the semiconductor surface layer to the buried layer and surrounds a portion of the trench.

The electronic device 2700 includes a multilevel metallization structure, only a portion of which is shown in the drawings. The electronic device 2700 includes a first dielectric layer 2730 (e.g., a pre-metal dielectric layer labeled "PMD" in the drawings) that extends on or over the field oxide 2710 and portions of the top side 2707 of the semiconductor surface layer 2706. In one example, the first dielectric layer is or includes $SiO_2$. The PMD layer 2730 includes conductive contacts 2732 that extend through the PMD layer 2730 to form electrical contacts to the respective implanted regions 2712, 2714, and 2716 of the semiconductor surface layer 2706. The PMD layer 2730 also includes a conductive contact 2732 that forms an electrical contact to the top side 2725 of the doped polysilicon 2724 of the deep trench isolation structure 2720.

The multilevel metallization structure in FIG. 27 also includes a second dielectric layer 2740 (e.g., $SiO_2$), referred to herein as an interlayer or interlevel dielectric (ILD) layer. The second dielectric layer 2740 is labeled "ILD" in the drawings. The second dielectric layer 2740 includes conductive routing structures 2742, such as traces or lines. In one example, the conductive routing structures 2742 are or include copper or aluminum or aluminum or other conductive metal. The second dielectric layer 2740 includes conductive vias 2744 that are or include copper or aluminum or other conductive metal. In one example, the electronic device 2700 includes one or more further metallization layers or levels (not shown).

Figure 47:
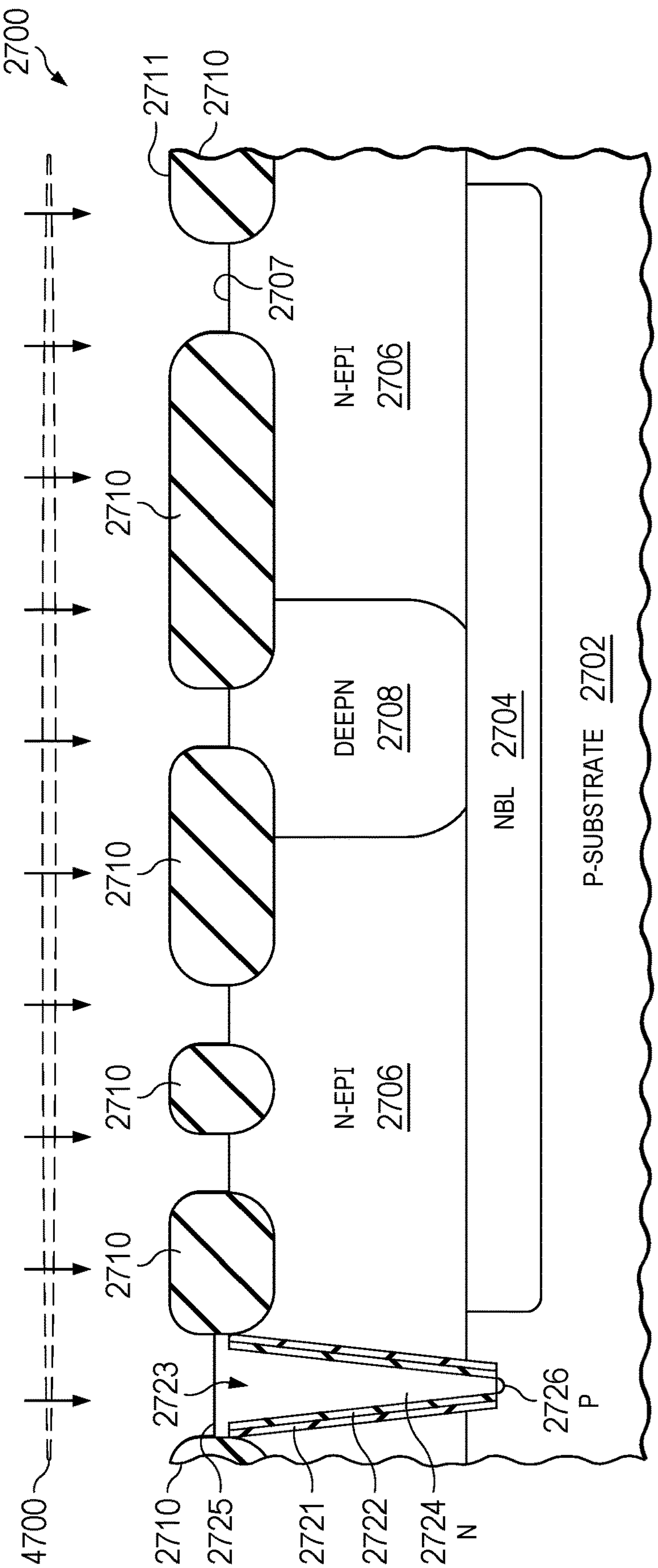
Figure 48:
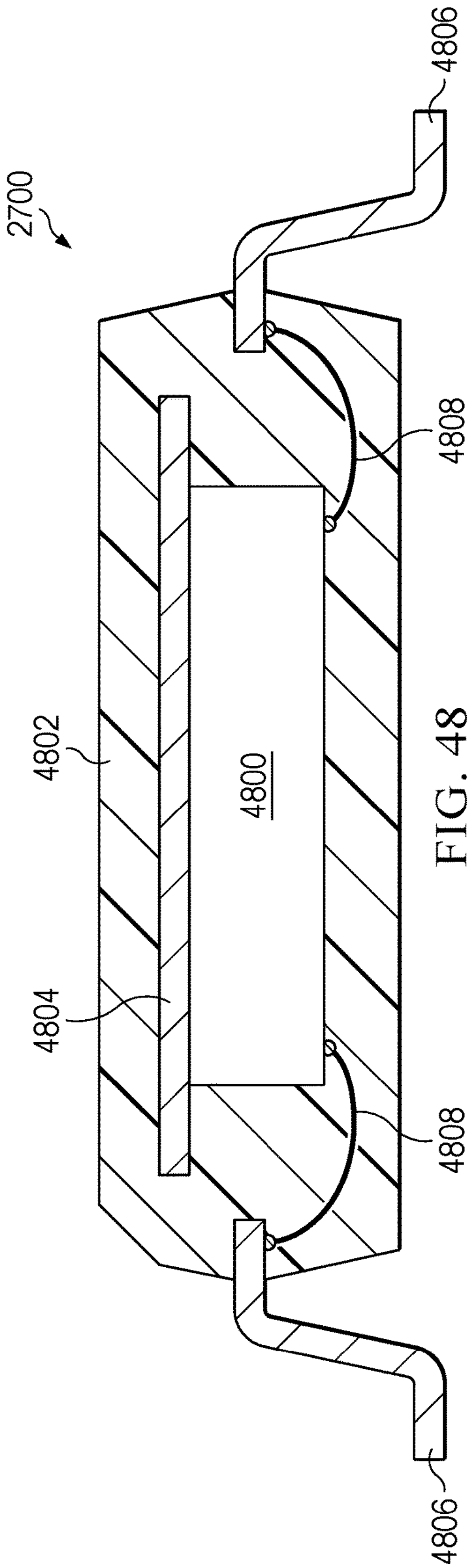
FIG. 48 is a sectional side elevation view of the electronic device of FIGS. 27 and 29-47 including a package structure.

Referring also to FIGS. 28-48, FIG. 28 shows another method 2800 for making an electronic device and for making an isolation structure in an electronic device. FIGS. 29-47 show the electronic device 2700 of FIG. 28 at various stages of fabrication according to the method 2800, and FIG. 48 shows the electronic device 2700 including a package structure. The method 2800 begins with a starting wafer, such as a silicon wafer substrate 2702 or a silicon on insulator wafer that includes majority carrier dopants of a first conductivity type (e.g., P in the illustrated example).

Figure 29:
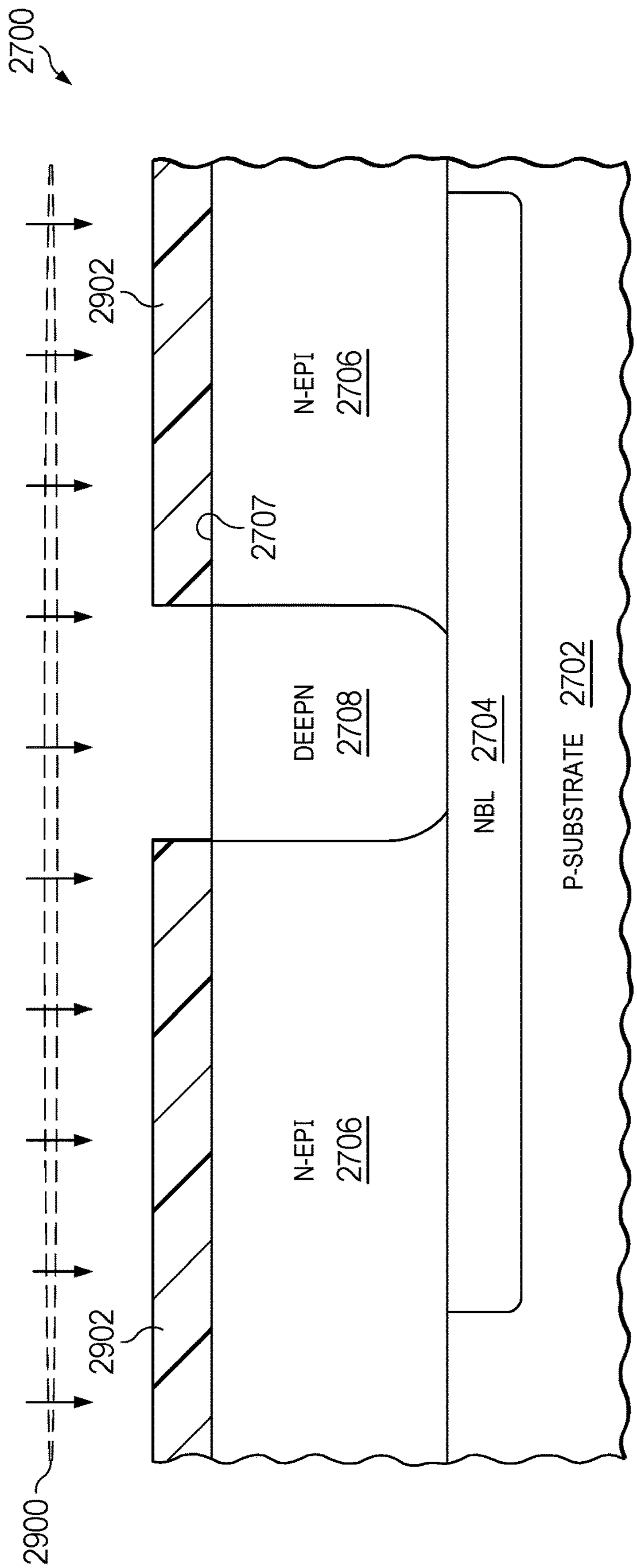
FIGS. 29-47 are partial sectional side elevation views of the electronic device of FIG. 27 at various stages of fabrication according to the method of FIG. 28.

The method 2800 includes forming a buried layer at 2802. FIG. 29 shows one example, in which an implantation process has been performed is performed using an implant mask (e.g., the same as or like the processing described above in connection with FIG. 3, (not shown in FIG. 29). The processing at 2802 implants dopants of the second conductivity type (e.g., N in the illustrated example) into an exposed portion of the top side of the semiconductor substrate 2702 to form the buried layer 2704 in a portion of the semiconductor substrate 2702. In another implementation, a blanket implantation is performed at 2802 without an implant mask.

Figure 28:
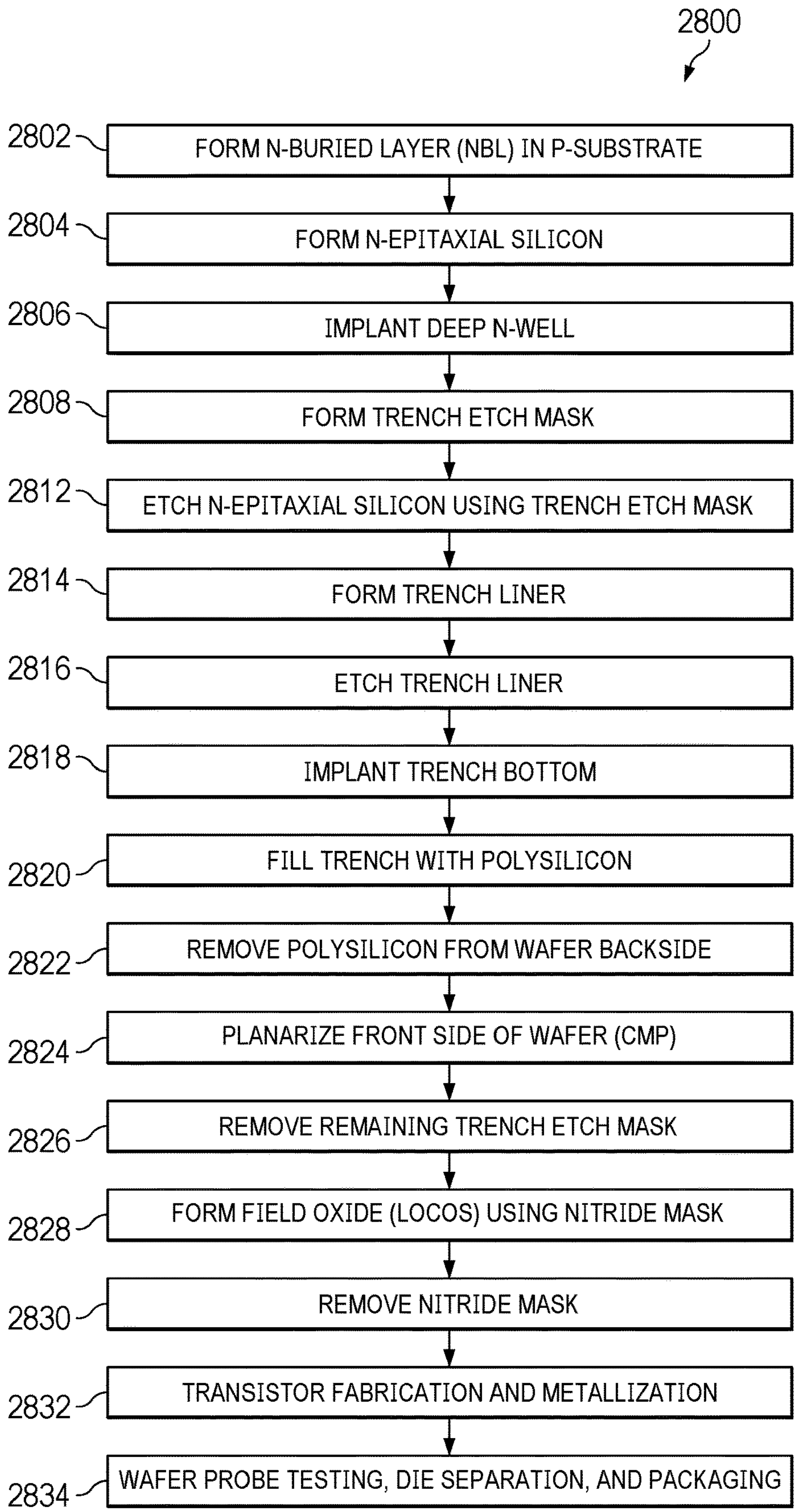
FIG. 28 is a flow diagram of another method for making an electronic device and for making an isolation structure in an electronic device.

At 2804 in FIG. 28, the method 2800 also includes forming a semiconductor surface layer on the semiconductor substrate. FIG. 29 shows the device 2700 after an epitaxial growth process (e.g., the same as or like the processing described above in connection with FIG. 4, not shown in FIG. 29) has been performed with in-situ N-type dopants that grows the N-doped epitaxial silicon semiconductor surface layer 2706 on the top side of the semiconductor substrate 2702. The semiconductor surface layer 2706 has a top side 2707.

At 2806 in FIG. 28, the method 2800 also includes forming a deep doped region that includes majority carrier dopants of the second conductivity type. FIG. 29 shows one example in which an implantation process 2900 is performed using an implant mask 2902. The process 2900 implants dopants of the second conductivity type (e.g., N in the illustrated example) into an exposed portion of the top side 2707 of the semiconductor surface layer 2706 to form the deep doped region 2708 extending from the top side 2707 of the semiconductor surface layer 2706 to the buried layer 2704. In another implementation, the implant mask includes a second opening (not shown in FIG. 29) and the process at 2806 implants an exposed second portion of the top side 2707 of the semiconductor surface layer 2706 to concurrently form a second deep doped region to surround a subsequently formed isolation structure trench (e.g., FIGS. 49 and 51 below).

At 2808 and 2812, the method 2800 of FIG. 28 continues with forming a deep isolation trench structure. FIGS. 30-34 show an example that includes forming a dielectric trench etch mask at 2808 and etching through the semiconductor surface layer 2706 and into the semiconductor substrate 2702 at 2812. In another implementation, for example, in which a blanket implantation was used to form the buried layer 2704, the etching at 2812 forms the trench partially into the buried layer 2704 (e.g., FIGS. 49 and 51 below).

Figure 30:
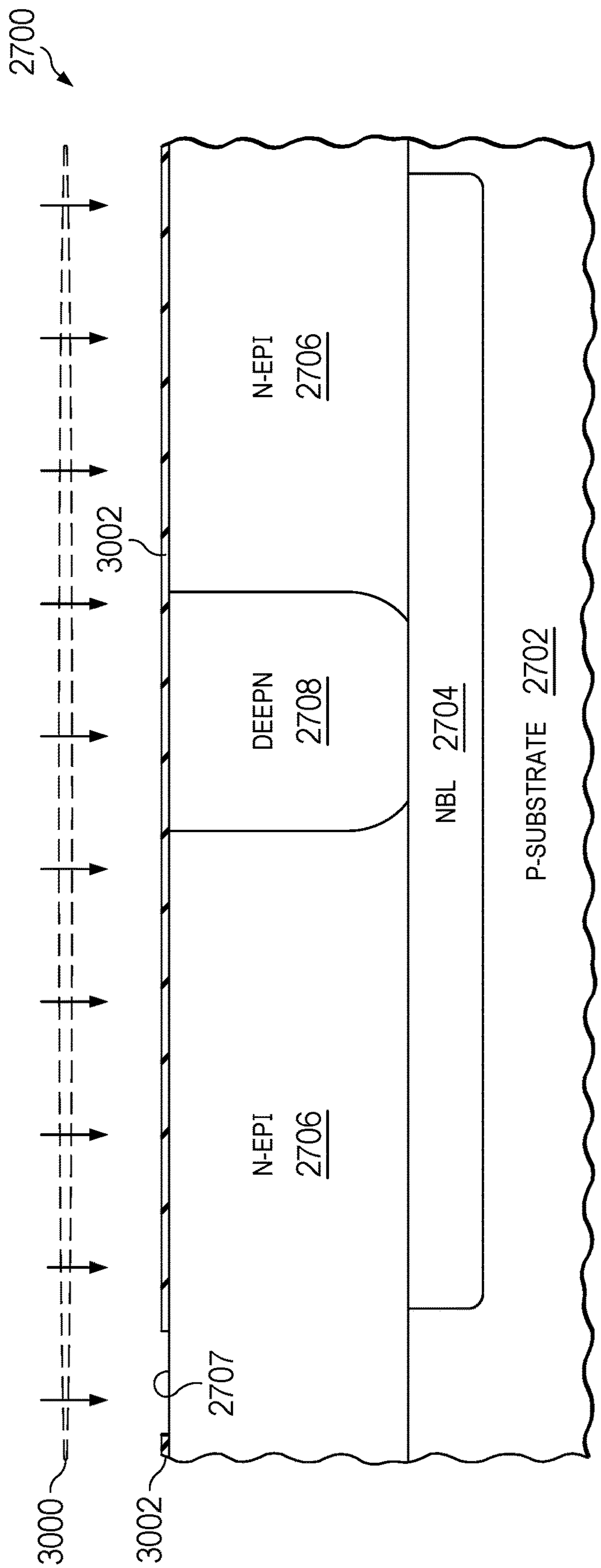
Figure 31:
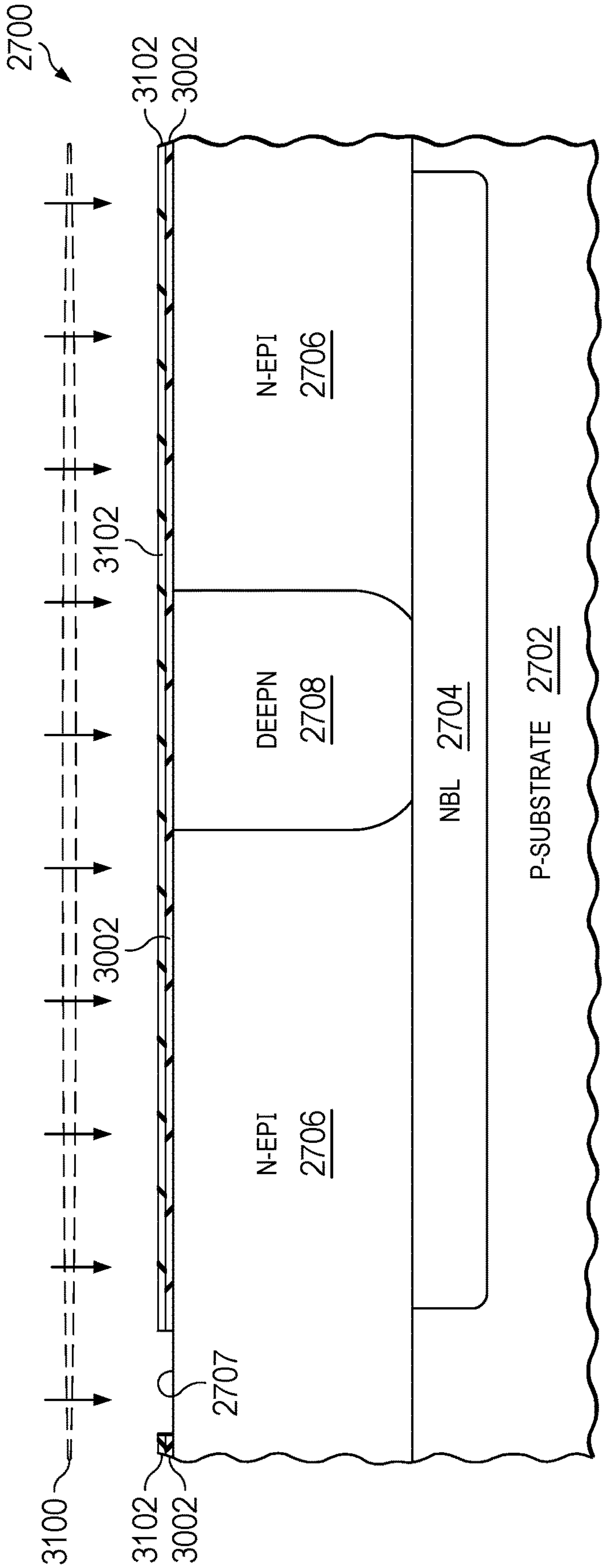
Figure 32:
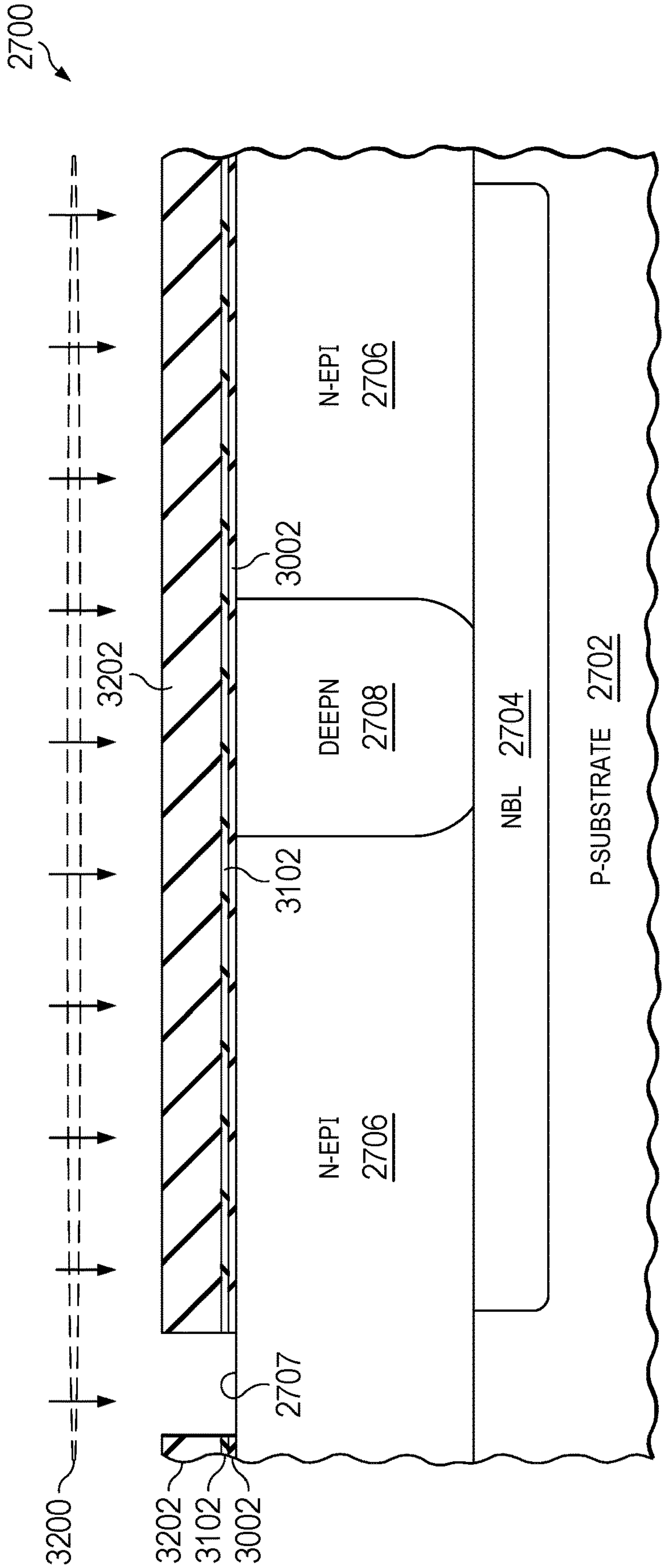

FIGS. 30-32 show an example of the trench etch mask formation at 2808, in which a patterned multilayer etch mask is created. The nominal layer thicknesses and composition of the trench etch mask layers are adjustable depending on the depth of the isolation trench and vary within manufacturing tolerances. In other example, more or fewer layers are used in forming the trench etch mask at 2808. In the illustrated implementation, a process 3000 is performed in FIG. 30 that deposits and patterns a silicon dioxide layer 3002 to expose a portion of the semiconductor surface layer 2706. In one example, the silicon dioxide layer 3002 has a thickness of 150 Angstroms. In FIG. 31, a process 3100 is performed that deposits (e.g., by chemical vapor deposition process) and patterns a silicon nitride layer 3102, for example, to a thickness of 2000 Angstroms. In FIG. 32, a process 3200 is performed that deposits and patterns another silicon dioxide layer 3202, for example, to a thickness of 1.4 μm to complete the patterned multilayer dielectric etch mask 3002, 3102, 3202.

Figure 33:
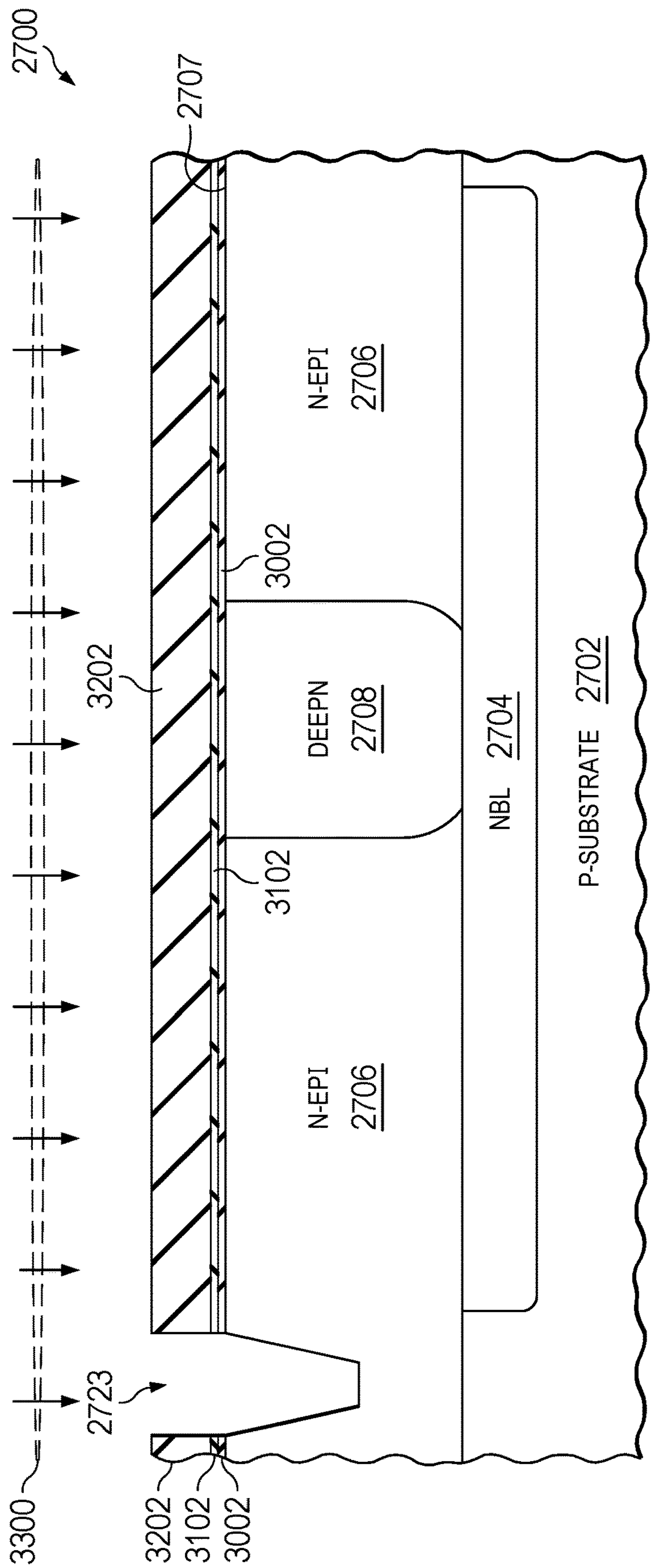
Figure 34:
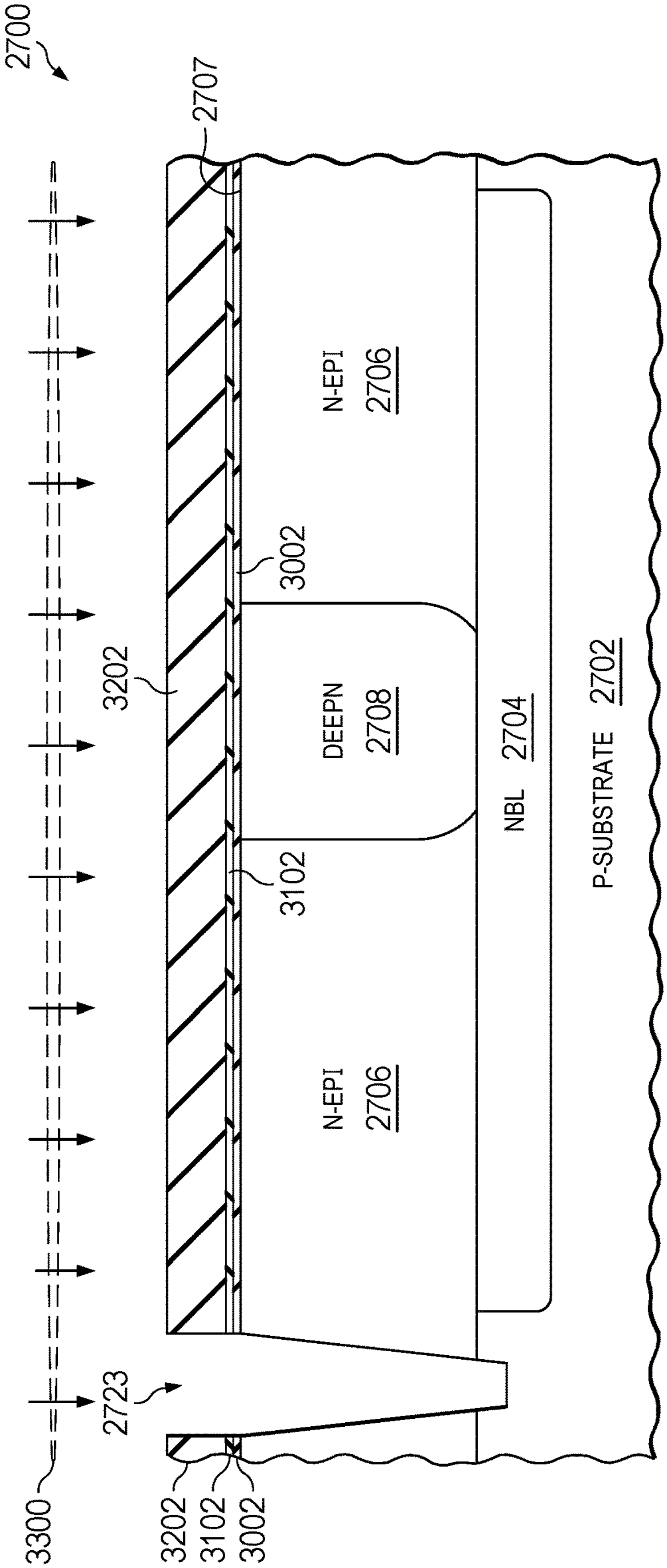

At 2812 in FIG. 28, an etch is performed using the trench etch mask 3002, 3102, 3202 to etch through the exposed portion of the semiconductor surface layer 2706 and to expose a portion of the semiconductor substrate 2702. In another implementation, the etch process at 2812 exposes a portion of a buried layer 2704 (e.g., FIGS. 49 and 51 below). FIGS. 33 and 34 show one example, in which an etch process 3300 is performed using the trench etch mask 3002, 3102, 3202. FIG. 33 shows partial performance of the etch process 3300 that extends the trench 2723 into the portion of the semiconductor surface layer 2706 exposed by the trench etch mask 3002, 3102, 3202. FIG. 34 shows continuation of the etch process 3300 that etches through the remaining portion of the semiconductor surface layer 2706 and into the semiconductor substrate 2702. In one example, the etch process 3300 etches the trench 2723 into the semiconductor surface layer 2706 and into the semiconductor substrate 2702 to a trench depth of 20 to 26 μm, such as about 22 μm, and stops in the semiconductor substrate 2702.

In another implementation, where a blanket implant is used to firm the buried layer 2704, the etch process 3300 continues to extend the trench 2723 through the semiconductor surface layer 2706, through the buried layer 2704 and into the semiconductor substrate 2702 beneath the buried layer 2704. In one example, the etch process 3300 uses a combination of $SF_6$, oxygen, argon, and HDR, MO2. In another implementation, the etch process 3300 uses an $Ar/SF_6/O_2/CF_4/HBr/N_2$ etch chemistry. In other implementations, the etch process 3300 uses a combination of all or some (e.g., two or more) of $Ar/SF_6/O_2/CF_4/HBr/N_2$. In one implementation, the etch process 3300 is an anisotropic etch performed in a plasma reactor with source and bias RF power.

In another implementation, such as for a self-aligned deep doped region and isolation trench (e.g., FIGS. 49 and 51 below), a portion of the trench 2723 is etched into a previously formed second deep implanted region using the etch process 3300 to expose the blanket implanted buried layer, and the trench sidewalls are then implanted using traditional beam line implanters, after which the etch process 3300 is resumed to etch the rest of the trench 2723.

The method 2800 continues at 2814 in FIG. 28 with forming a single or multi-layer trench liner. The total thickness and composition of the trench liner is tailored according to a target breakdown voltage rating for the isolation structure 2720 in a given technology. In the illustrated example, the total thickness of the bilayer liner 2721, 2722 is 5000 to 6000 Angstroms.

Figure 35:
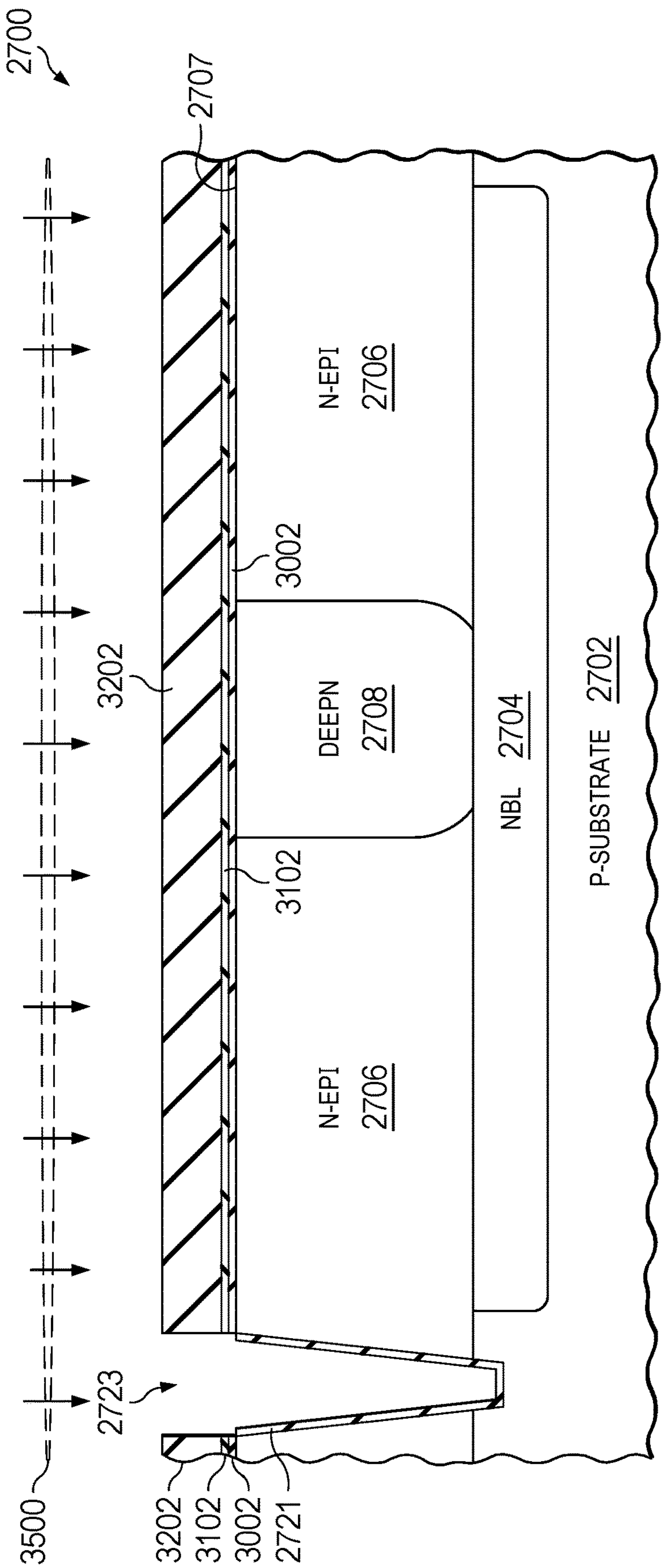
Figure 36:
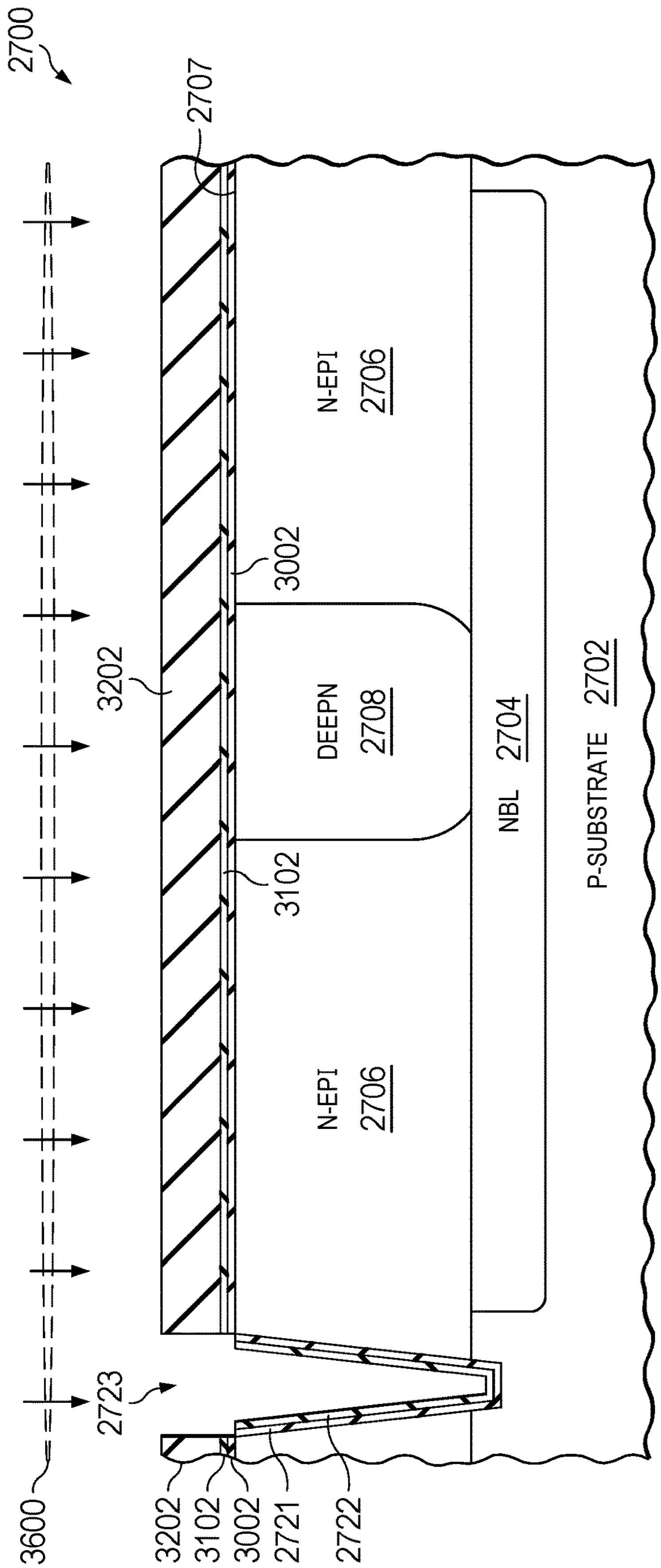

FIGS. 35 and 36 show one example that forms a bilayer oxide trench liner 2721, 2722 as shown in FIG. 27 above. The trench liner layers 2721 and 2722 are formed along the sidewall of the trench 2723 from the semiconductor surface layer 2706 to the semiconductor substrate 2702. In another implementation, such as where a blanket implant was used to form the buried layer 2704, the trench liner layers 2721 and 2722 extend to the buried layer 2704. In another example where a blanket implant was used to form the buried layer 2704, the trench liner layers 2721 and 2722 extend to the buried layer 2704 and beyond into the underlying semiconductor substrate 2702 below the buried layer 2704. The nominal layer thicknesses and composition of the trench liner 2721, 2722 are adjustable and vary within manufacturing tolerances. In other example, more or fewer layers are used in forming the trench liner.

FIG. 35 shows one example, in which a process 3500 is performed to form the first liner layer 2721 on the trench sidewall. The process 3500 in one example includes thermal growth in a furnace with an oxidizing interior environment using an $O_2$ source stream at a temperature of about 1050 degrees C. to deposit or grow the first trench liner layer 2721 to a thickness of 1000 to 4000 Angstroms.

In FIG. 36, a deposition process 3600 is performed that deposits the second liner layer 2722 as a second oxide on the first layer 2721. In one implementation, the deposition process 1700 is a sub-atmospheric pressure chemical vapor deposition (SA-CVD) process, for example, using $O_2$ and/or ozone ($O_3$) as a source gas to help catalyze the reaction, at a pressure between 13,300 Pa and 80,000 Pa, and a process temperature of about 300 to 700 degrees C. In one example, the process 3600 deposits the second liner layer 2722 as a conformal layer both inside the trench 2723 along the first liner layer 2721, and outside the trench 2723 (not shown in FIG. 36).

Figure 37:
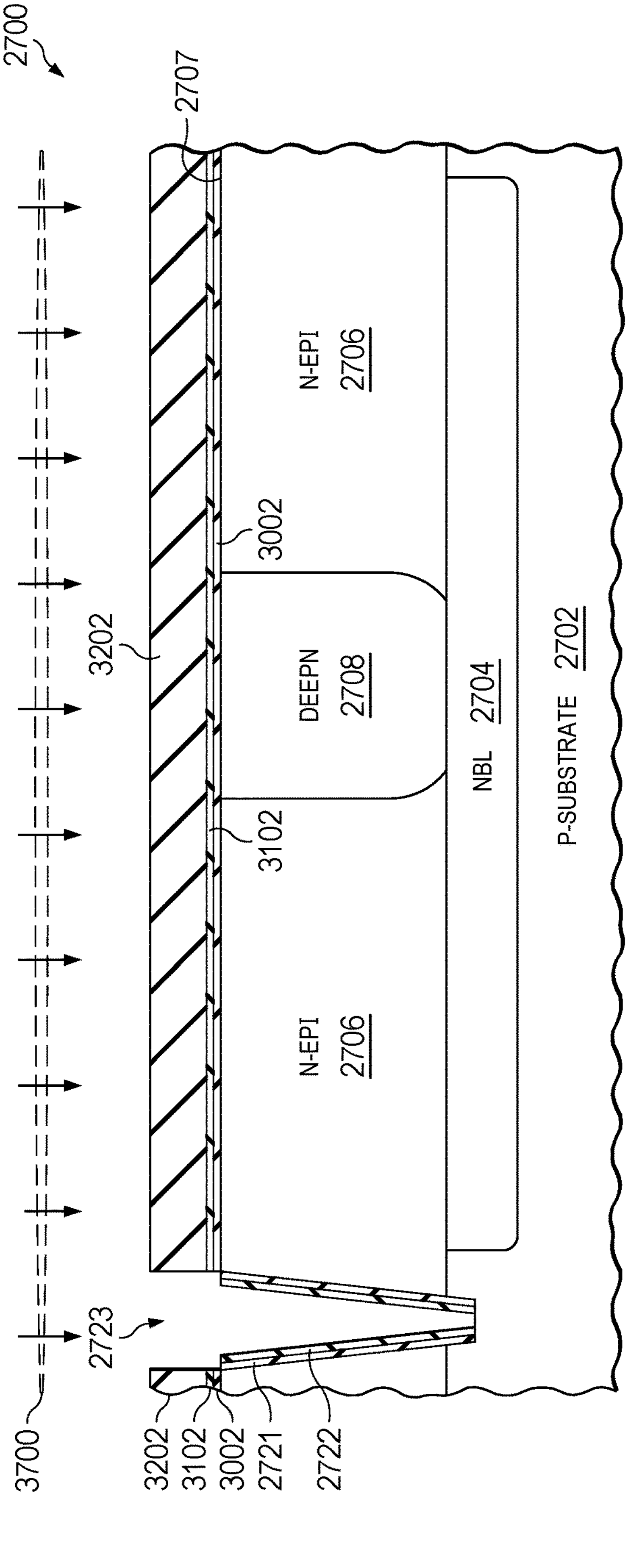

At 2816 in FIG. 28, the method 2800 continues with etching the trench liner 2721, 2722. FIG. 37 shows one example, in which a trench liner etch process 3700 is performed. The process 3700 in one example is an anisotropic plasma dry etch that is self-aligned etch without any additional mask. In one implementation, the etch process 3700 uses all or a combination of $Ar/CF_4/CH_2F_2/CHF_3/N_2/O_2$, and/or another fluorocarbon source at room temperature in a plasma reactor with RF sources and bias power for anisotropy. The etch process 3700 removes the liner layers 2721 and 2722 from the bottom of the trench 2723 and exposes a portion of the semiconductor substrate 2702. In another implementation, such as where a blanket implant was used to form the buried layer 2704, the trench liner etch process 3700 exposes a portion of the buried layer 2704 (e.g., FIGS. 49 and 51 below). In another example where a blanket implant was used to form the buried layer 2704, the trench liner layers 2721 and 2722 extend to the buried layer 2704 and beyond into the underlying semiconductor substrate 2702, and the etch process 3700 exposes a portion of the semiconductor substrate 2702 below the buried layer 2704.

Figure 38:
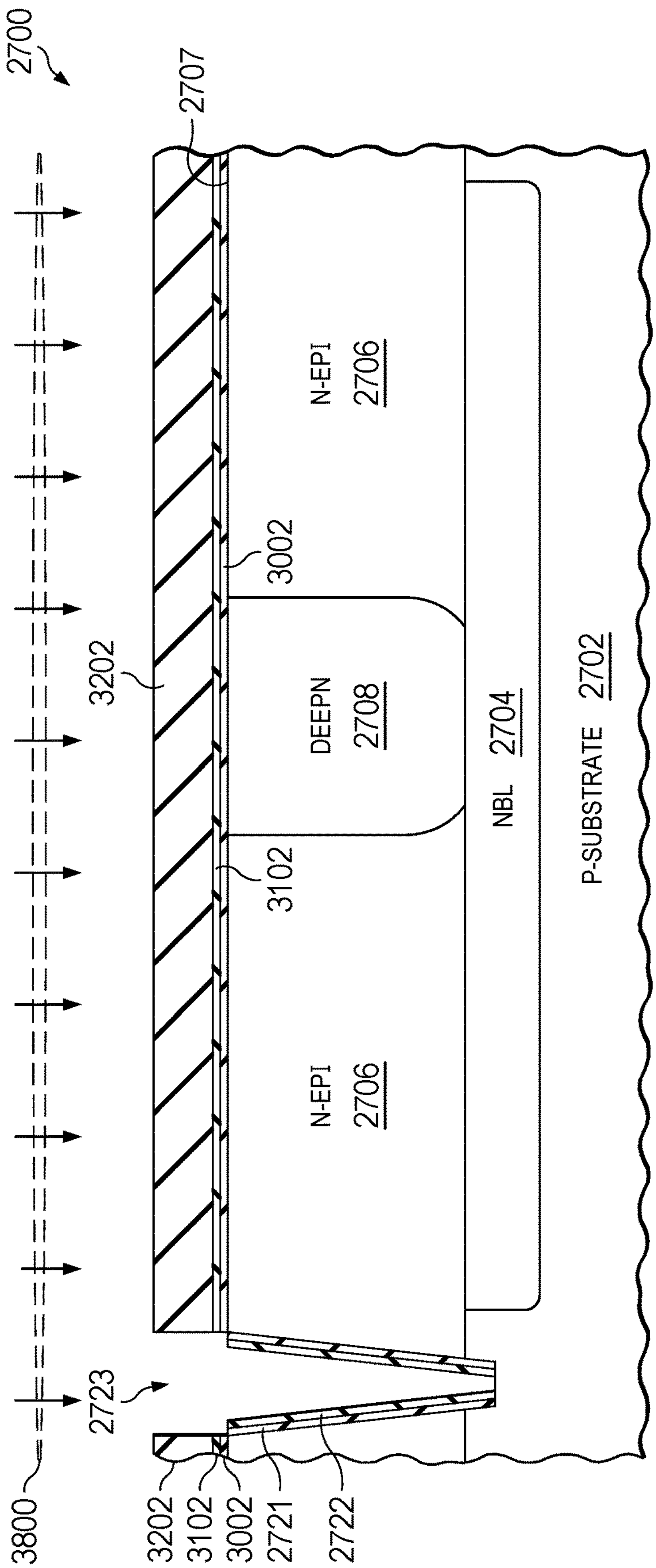

In one example, the device is cleaned after the trench bottom etch. FIG. 38 shows one example, in which a cleaning process 3800 is performed that cleans the trench bottom. In one example, the cleaning process 3800 is a dilute HF or other low oxide loss cleaning operation performed in a single wafer processing tool or hood, such as SC1-SPOM, etc.

Figure 39:
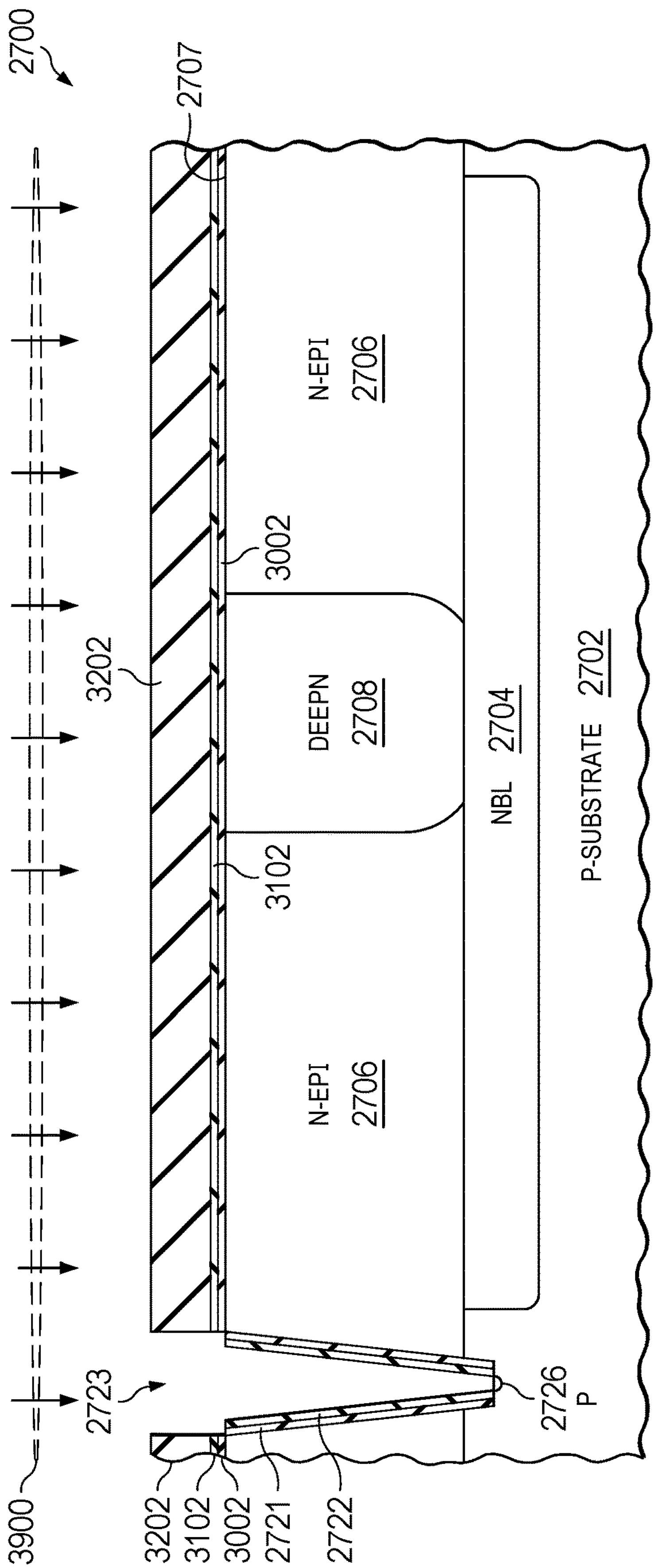

At 2818 in FIG. 28, the method 2800 continues with implanting the bottom of the trench 2723 with majority carrier dopants of a first conductivity type (e.g., P in the illustrated example). FIG. 39 shows one example, in which a trench bottom implantation process 3900 is performed that implants boron or other majority carrier dopants of the first conductivity type into the portion 2726 (e.g., an implanted region) of the semiconductor substrate 2702. The trench bottom implantation process 3900 enhances conductivity and passivates any damage to the interface of the underlying material of the semiconductor substrate 2702 or buried layer material resulting from the trench bottom etch process 3700. No additional mask is required for the trench bottom implantation process 3900 since the trench etch mask 3002, 3102, 3202 prevents implantation outside the trench 2723. In one example, the trench bottom implantation process 3900 is performed using a beam line implantation tool for zero-degree implantation of boron dopants at an implantation energy of 60 KeV to provide a majority carrier concentration of 5 E14 mm-3 with four rotations of the wafer during implantation.

Figure 40:
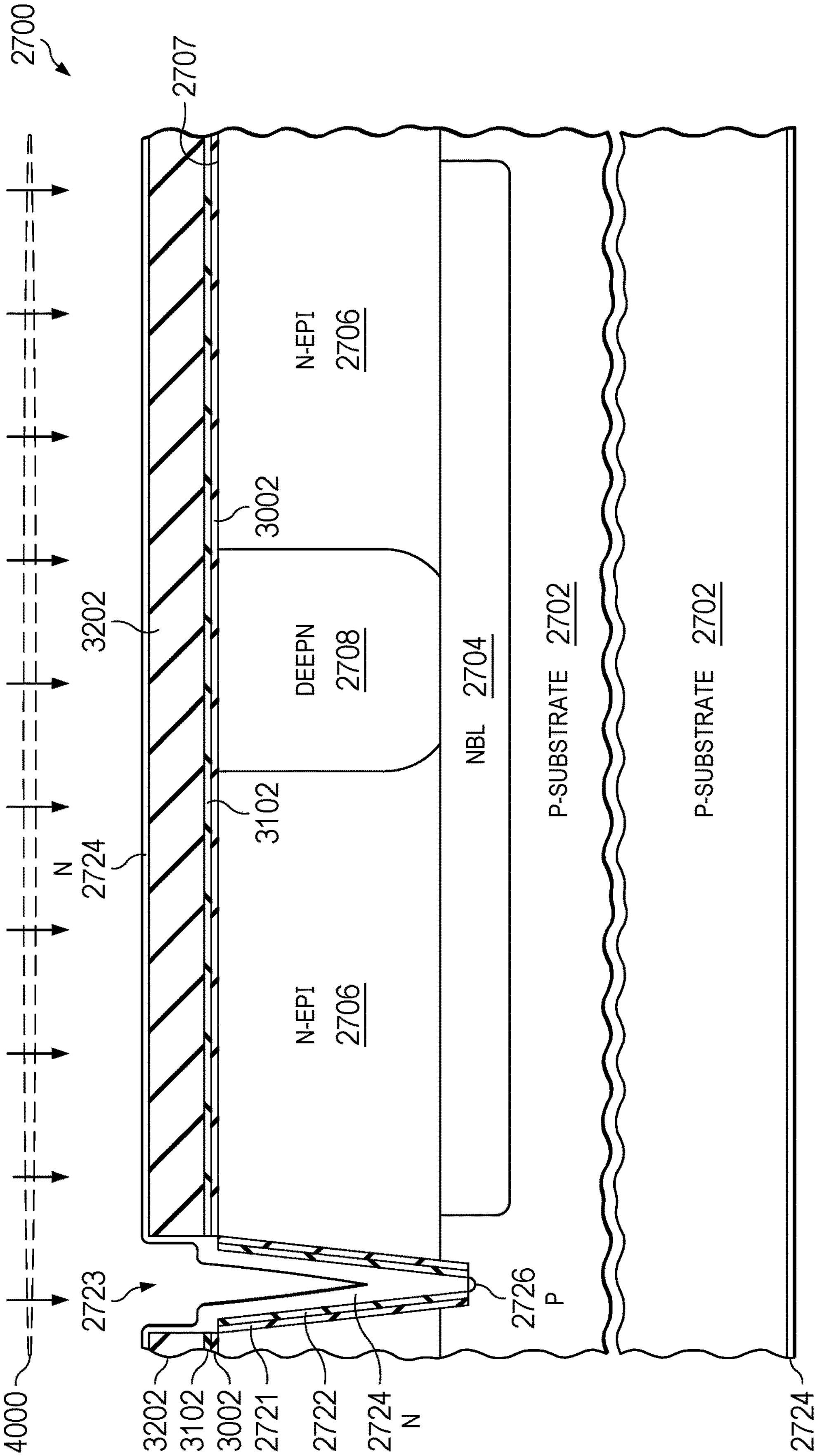
Figure 41:
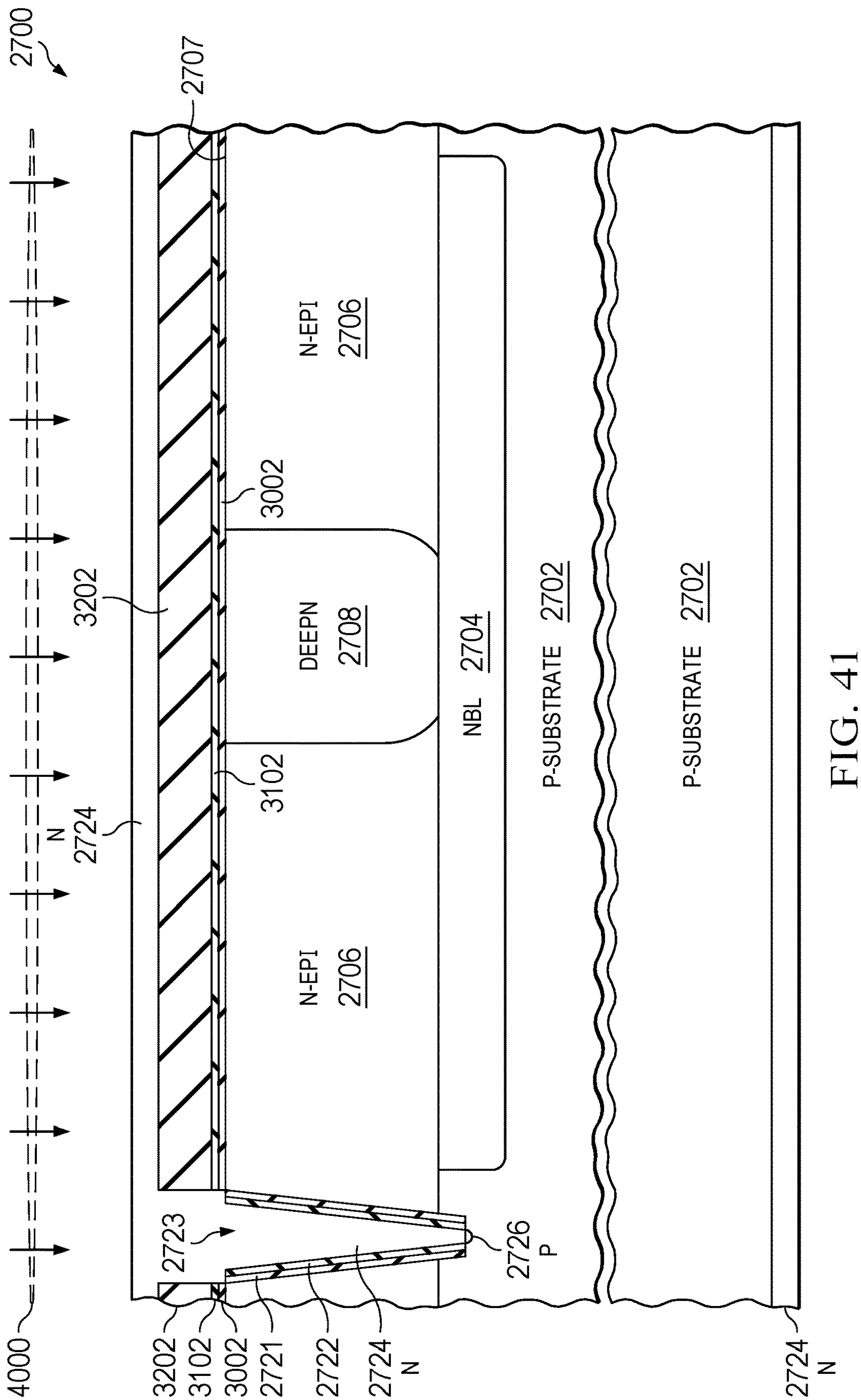

The method 2800 also includes filling the trench 2723 with the polysilicon 2724 at 2820. FIGS. 40 and 41 show one example, in which a process 4000 is performed that forms the polysilicon 2724 in the trench 2723 and fills the trench 2723 to and beyond the top side 2707 of the semiconductor surface layer 2706. The process 4000 in one example includes epitaxial silicon growth with in-situ doping to form the polysilicon 2724 with majority carrier dopants of the second conductivity type (e.g., N in the illustrated example). FIG. 40 shows partial completion of the fill deposition process 4000 that conformally starts to fill the trench while conformally covering the device with deposited polysilicon 2724 outside the trench 2723 and on the wafer bottom. FIG. 41 shows completion of the process 4000 with the trench 2723 filled with polysilicon 2724.

In one example, the deposition process 4000 includes in-situ doped poly fill using $BCl_3$ as a dopant source gas for boron with silane as the Si source. In one implementation, the entire deposited polysilicon is doped in-situ. Another implementation deposits an in-situ doped thin layer and then deposits an undoped layer, followed by an anneal or high temperature drive to diffuse dopants throughout. In one example, the polysilicon deposition process 4000 is performed in a furnace at a process temperature of 500 to 700 degrees C. In another example, the process 4000 deposits completely undoped polysilicon 2724, followed by an implant with n or p type dopants using a suitable implantation process. In another example, a deposition (e.g., epitaxial growth) is performed and a separate implantation provides majority carrier dopants of the second conductivity type into the deposited polysilicon 2724 in the trench 2723, followed by a thermal anneal to drive the implanted dopants into the polysilicon 2724 of the filled trench 2723. In the illustrated example, the process 4000 forms the polysilicon 2724 in the trench 2723 along the liner 2721, 2722 and the polysilicon 2724 also extends over the device on the trench etch mask 3002, 3102, 3202 that remains outside the trench 2723.

Figure 42:
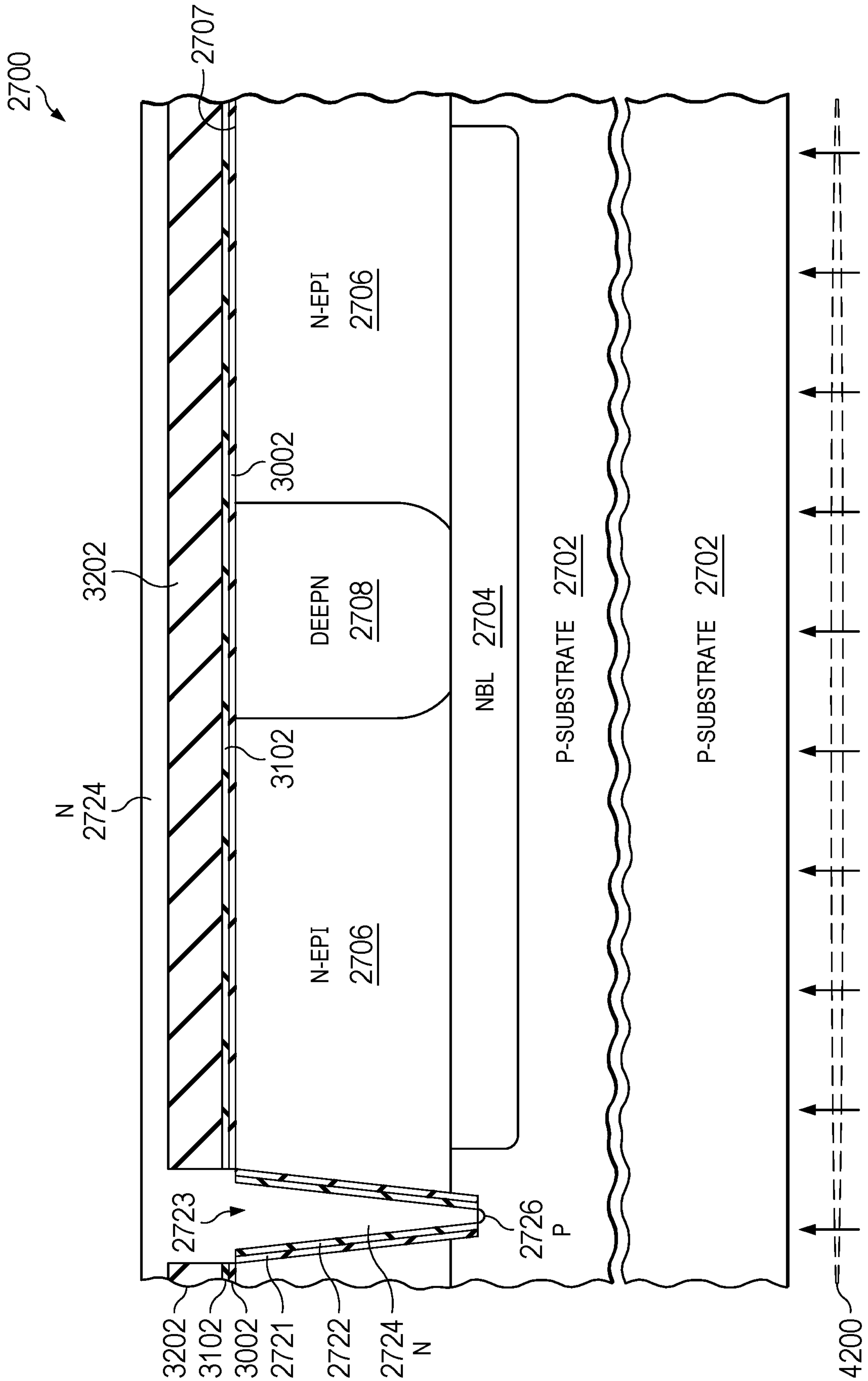

The method 2800 of FIG. 28 also includes removing the deposited polysilicon from the wafer backside (e.g., from the bottom) at 2822. FIG. 42 shows one example, in which a stripping process 4200 is performed that removes the polysilicon 2724 from the back side of the semiconductor substrate 2702. In one implementation, the back side poly strip process 4200 includes exposing the back side of the semiconductor substrate 2702 to HF/nitric acid to provide high selectivity to $SiO_2$ and $Si_N$ using a wafer clean tool, such as SEZ, etc.

Figure 43:
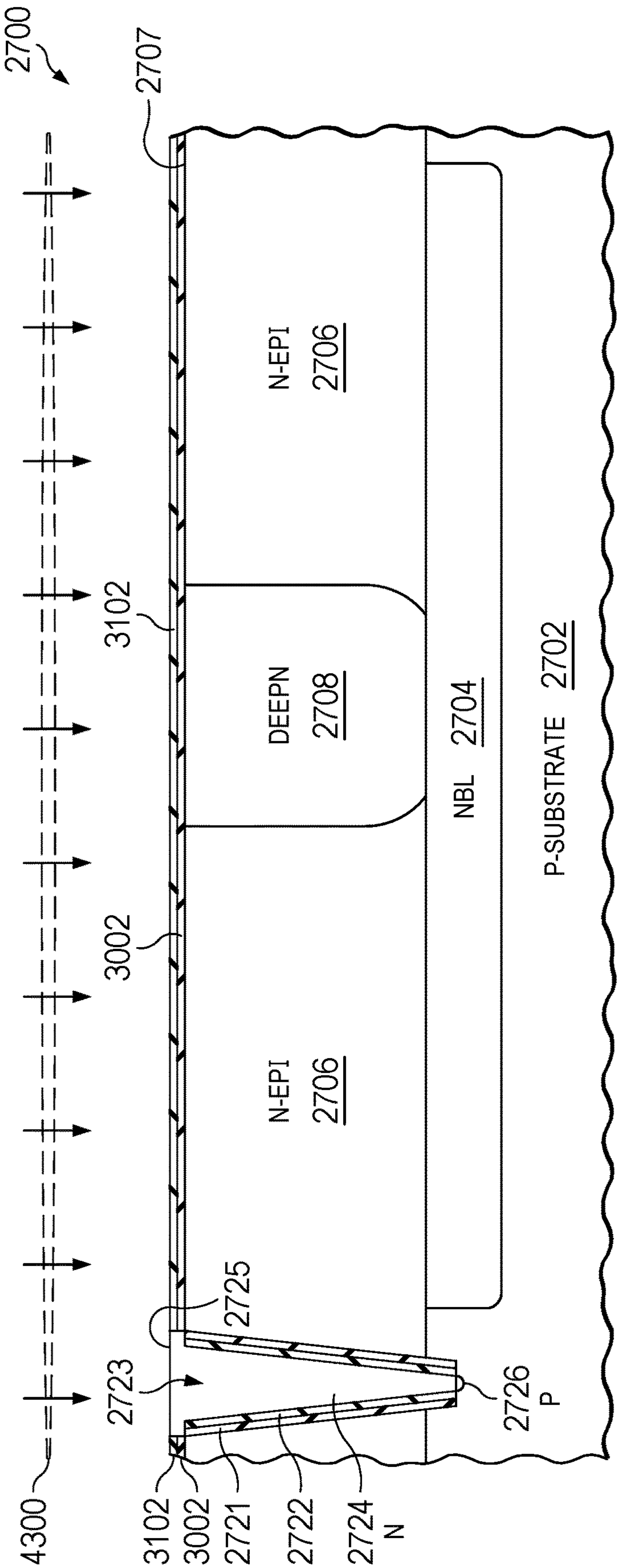

At 2824 in FIG. 28, the method 2800 also includes planarizing the front side of the wafer (e.g., the top side in the illustrated orientation). FIG. 43 shows one example, in which a chemical mechanical polishing (CMP) process 4300 is performed that planarizes the top side and sets the height of the top side 2725 of the polysilicon 2724 in the trench 2723. In one example, the CMP process 4300 stops on or slightly above the silicon nitride layer 3102 of the multilayer trench etch mask. In one implementation, the CMP process 4300 is performed in a CMP tool using a process slurry, for example, a ceria slurry that has good selectivity to nitride, in which the polysilicon 2724 is polished with an endpoint to stops on the silicon dioxide, after which the silicon dioxide is polished stopping on the silicon nitride mask layer 3102. In one implementation, a further cleaning operation is performed at 2824, for example, using a non-HF solution to mitigate surface particle defects.

Figure 44:
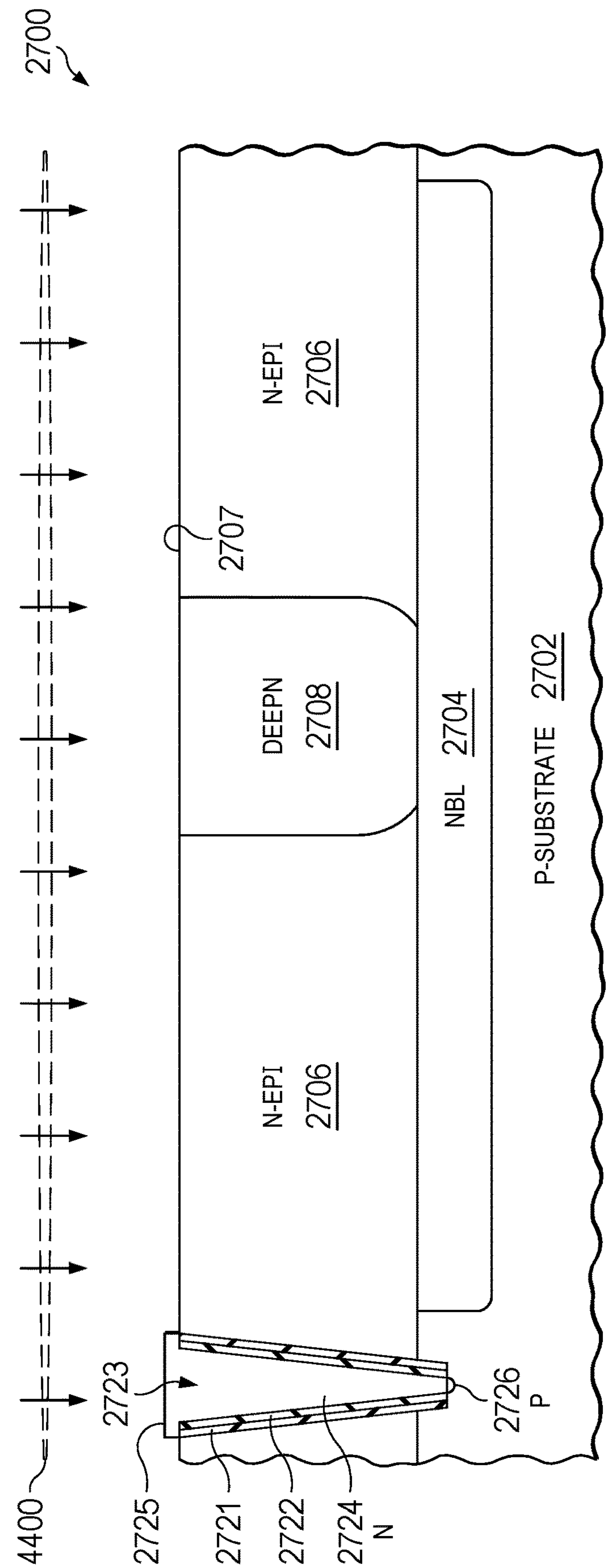

The method 2800 continues at 2826 in FIG. 28 to remove the remaining trench etch mask remnants. FIG. 44 shows one example, in which a nitride strip process 4400 is performed that removes any remaining portions of the trench etch mask layers 3002, 3102, 3202. In one example, the nitride strip process 4400 includes a hot phosphoric acid clean to etch SiN.

Figure 45:
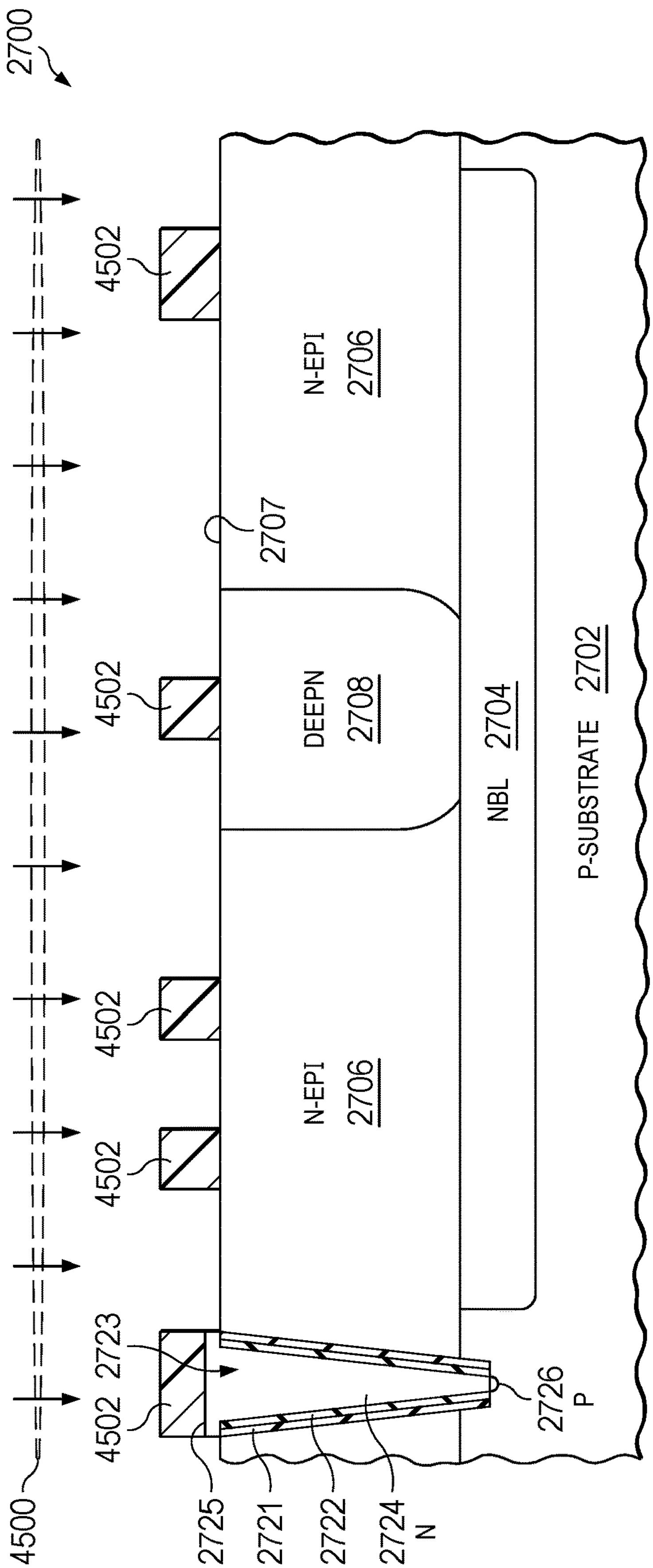
Figure 46:
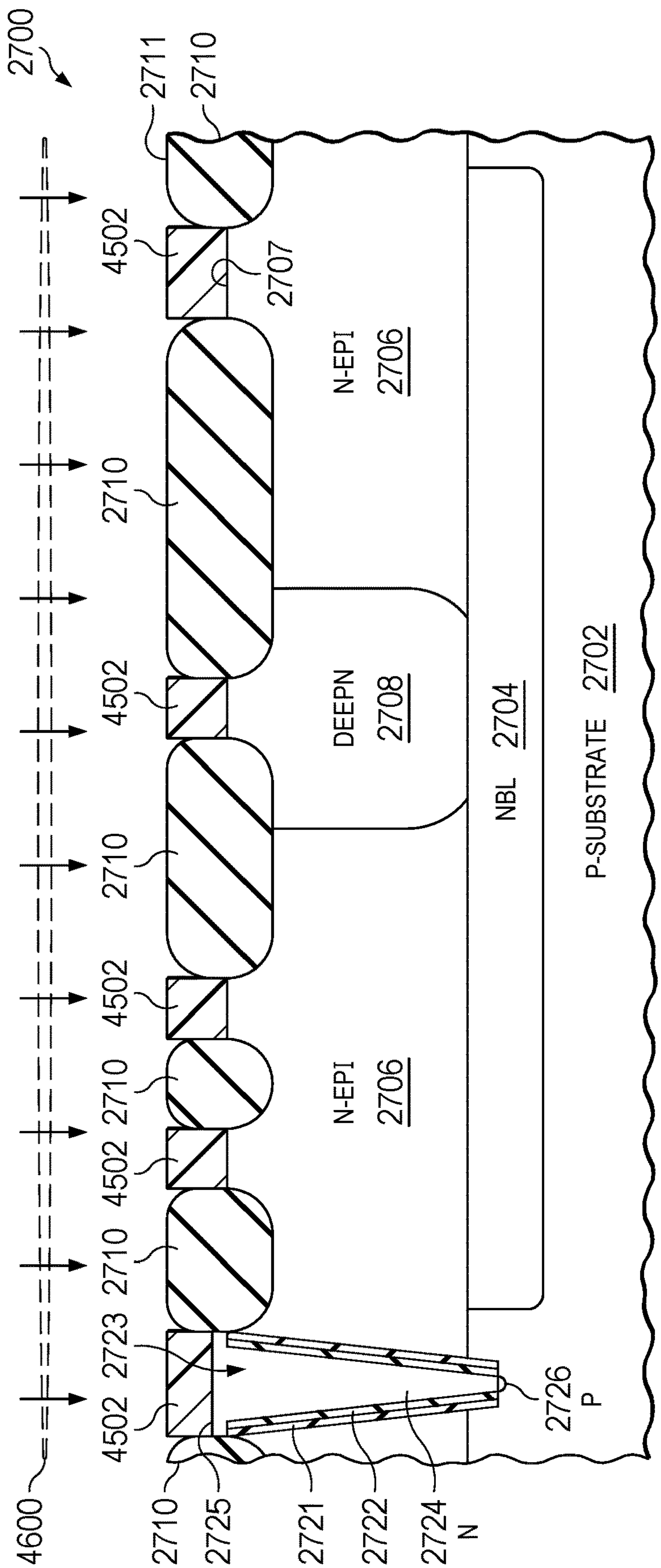

At 2828 in FIG. 28, the method 2800 also includes forming a field oxide, for example, by local oxidation of silicon (LOCOS) using a nitride mask. FIGS. 45 and 46 show one example, in which a nitride mask is formed, and local oxidation of silicon processing is performed to grow the field oxide 2710 on exposed portions of the top side 2707 of the semiconductor surface layer 2706. In FIG. 45, a process 4500 is performed that deposits a mask material, for example, that is or includes silicon nitride (SiN) on the top side 2707 of the semiconductor surface layer 2706. The process 4500 also includes patterning the deposited mask material to form a patterned mask 4502 that covers the deep trench isolation structure and exposes select portions of the top side 2707 of the semiconductor surface layer 2706 as shown in FIG. 45.

FIG. 46 shows an example, in which a LOCOS process 4600 is performed, for example, in a furnace with an internal oxidizing environment. The LOCOS process 4600 forms the field oxide 2710 on portions of the top side 2707 of the semiconductor surface layer 2706. The field oxide 2710 in one example is or includes $SiO_2$ that penetrates under the surface of the wafer with a Si—SiO2 interface slightly below the level of the top side 2707 of the semiconductor surface layer 2706. Thermal oxidation of the selected exposed regions of the top side 2707 causes oxygen penetration into the top side 2707, and the oxygen reacts with silicon and transforms it into silicon dioxide.

In the illustrated example, the processing at 2828 forms the field oxide 2710 on a portion of the top side 2707 of the semiconductor surface layer 2706 such that a portion of the field oxide 2710 is in contact with one of a portion of the dielectric liner 2721, 2722 and a portion of the polysilicon 2724 as shown in FIG. 46.

The method 2800 continues at 2830 with removing the mask 4502. FIG. 47 shows an example, in which a stripping process 4700 is performed that removes the mask and leaves the patterned field oxide structures 2710 having respective top sides 2711.

The method 2800 also includes transistor fabrication and metallization at 2832, beginning with gate polysilicon deposition and patterning, and includes formation of various circuit components, such as transistors, polysilicon capacitors and resistors, etc., as well as formation of a single or multilayer metallization structure (e.g., FIG. 27 above).

At 2834 in FIG. 28, the method 2800 includes wafer probe testing, die separation or singulation to separate processed dies from the wafer structure, and packaging to produce packaged electronic devices. FIG. 48 shows the finished electronic device 2700 that includes a package structure having a semiconductor die 4800 enclosed in a molded package 4802. In the illustrated example, the die 4800 is mounted on a die attach pad 4804, and conductive bond pads of the die 4800 are electrically coupled to respective leads 4806 via conductive bond wires 4808.

Forming the field oxide 2710 after forming and filling the isolation trench 723 enables use of a single trench etch process compared to the example method 200 of FIG. 2 above. In addition, the electronic device 2700 and method 2800 provide deep trench isolation solutions for any process flow in which LOCOS or other type of field oxide 2710 is used for lateral device isolation or raised gate integration, etc., and incorporates deep trench isolation in the process flow (e.g., field oxide processing after deep trench processing) without the need to have additional cost or complexity associated with shallow trench isolation (STI) processing or a mask. The thickness and composition of the trench etch hard mask layer or layers (e.g., 3002, 3102, 3202 above) can be adjusted or tailored to enable enhanced dielectric breakdown performance in a cost-effective, robust and manufacturable deep trench isolation loop, with or without a self-aligned deep-n sinker and substrate contacts.

Figure 50:
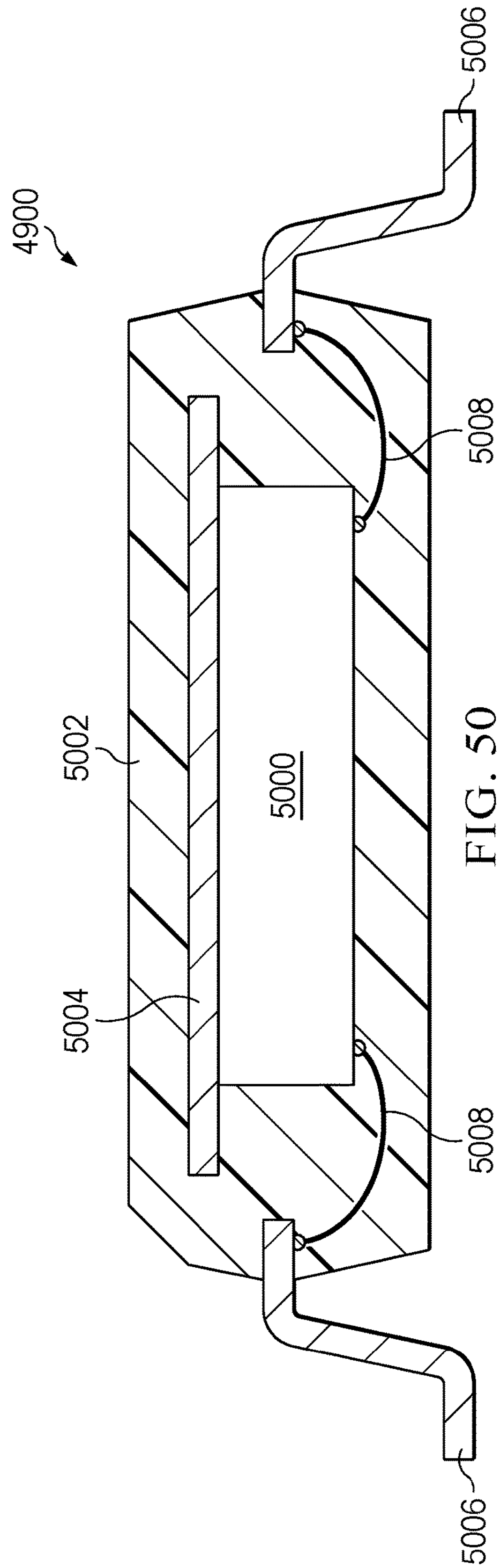
FIG. 50 is a sectional side elevation view of the electronic device of FIG. 49 including a package structure.
Figure 49:
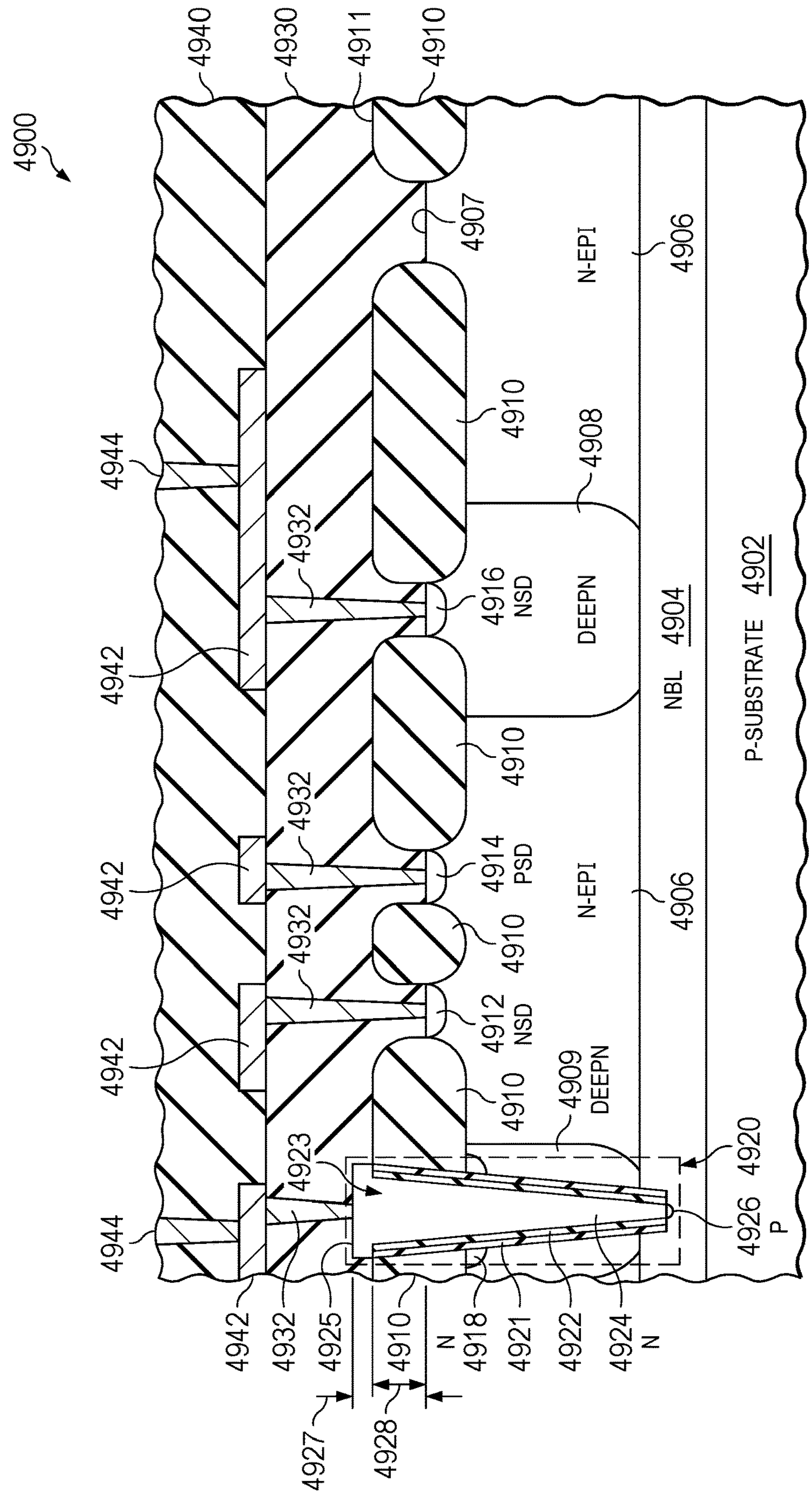
FIG. 49 is a partial sectional side elevation view of another electronic device that includes a deep trench isolation structure formed through a field oxide structure, and a deep implanted region surrounding the isolation structure.
Figure 51:
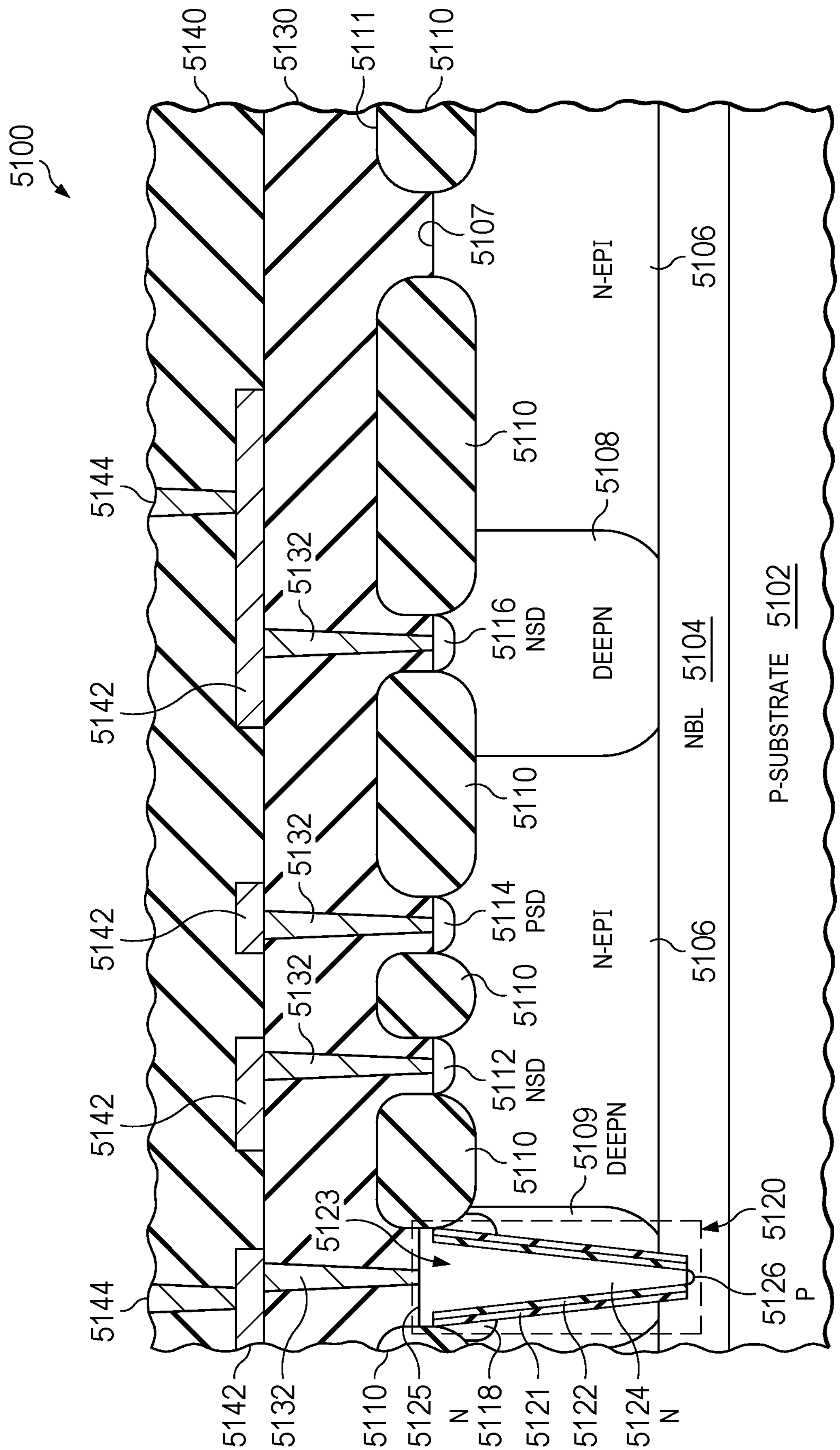
FIG. 51 is a partial sectional side elevation view of another electronic device that includes a deep trench isolation structure formed between field oxide structures, and a deep implanted region surrounding the isolation structure.
Figure 52:
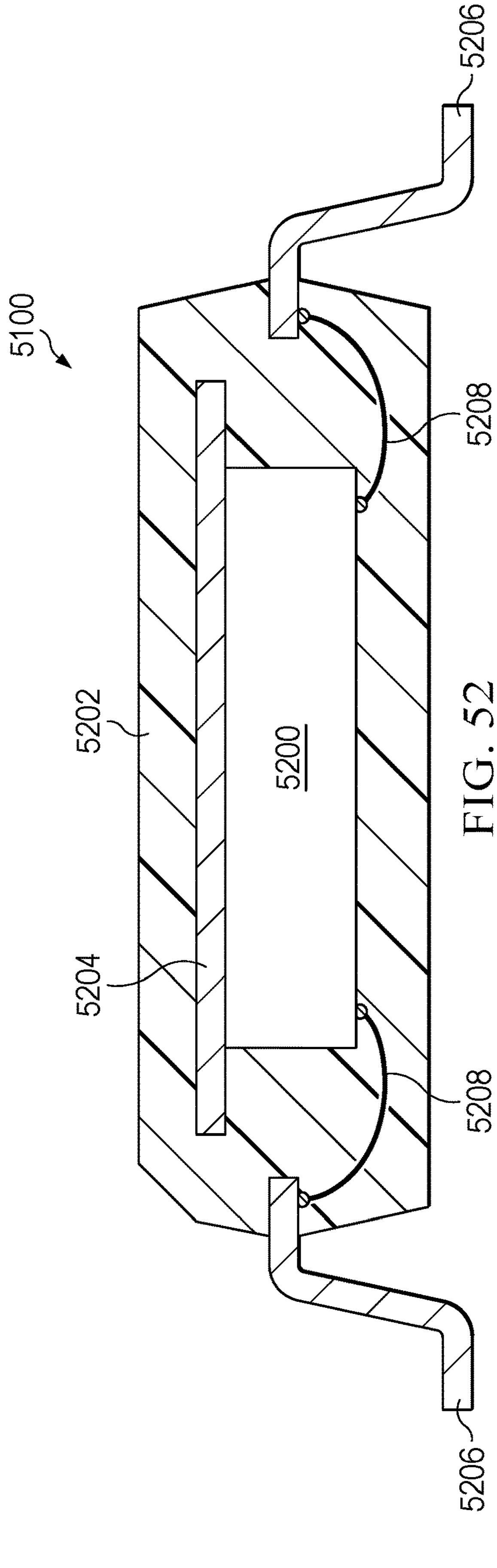
FIG. 52 is a sectional side elevation view of the electronic device of FIG. 51 including a package structure.

Referring now to FIGS. 49-52, further example electronic devices include a deep doped region that at least partially surrounds the deep trench isolation structure. FIGS. 49 and 50 show one example electronic device 4900 with a second deep doped region that includes majority carrier dopants of the second conductivity type (e.g., N in the illustrated example), and which extends from a semiconductor surface layer to a buried layer, where the second deep doped region is laterally spaced apart from the deep doped region of the above examples. The electronic device 4900 of FIG. 49 is produced using the method 200 of FIG. 2 above, in which the field oxide structures are formed before the deep trench isolation structure. FIGS. 51 and 52 illustrate another example having a first deep doped region and a second deep doped region that at least partially surrounds the deep trench isolation structure, in which the deep trench isolation structure is formed before the field oxide structures.

In FIG. 49, the electronic device 4900 includes a deep trench isolation structure formed through field oxide without STI structures. The DTI structure facilitates electrical isolation between components or circuits without adding an STI mask and without the cost and complexity of STI processing. The electronic device 4900 in one example is an integrated circuit product, only a portion of which is shown in FIG. 49. The electronic device 4900 includes electronic components, such as transistors, resistors, capacitors (not shown) fabricated on or in a semiconductor structure of a starting wafer, which is subsequently separated or singulated into individual semiconductor dies that are separately packaged to produce integrated circuit products. The electronic device 4900 includes a semiconductor structure having a semiconductor substrate 4902, a buried layer 4904 in a portion of the semiconductor substrate 4902, a semiconductor surface layer 4906 with an upper or top side 4907 and deep doped regions 4908 and 4909, and field oxide structures 4910 that have upper or top sides 4911 and extend on corresponding portions of the top side 4907 of the semiconductor surface layer 4906. In one example, the field oxide 4910 is or includes silicon dioxide ($SiO_2$) grown by a thermal oxidation process during fabrication of the electronic device 4900.

The semiconductor substrate 4902 in one example is a silicon or silicon on insulator (SOI) structure that includes majority carrier dopants of a first conductivity type. The buried layer 4904 extends in a portion of the semiconductor substrate 4902 and includes majority carrier dopants of a second conductivity type. In the illustrated implementation, the first conductivity type is P, the second conductivity type is N, the semiconductor substrate 4902 is labeled "P-SUBSTRATE", and the buried layer 4904 is an N-type buried layer labeled "NBL" in the drawings. In another implementation (not shown), the first conductivity type is N and the second conductivity type is P.

The semiconductor surface layer 4906 in the illustrated example is or includes epitaxial silicon having majority carrier dopants of the second conductivity type and is labeled "N-EPI" in the drawings. The electronic device 4900 includes first and second deep doped region 4908 and 4909, respectively. Both deep doped regions 4908 and 4909 include majority carrier dopants of the second conductivity type and the first deep doped region 4908 is labeled "DEEPN" in the FIG. 49. The deep doped regions 4908 and 4909 extend from the semiconductor surface layer 4906 to the buried layer 4904. In another example, the deep doped region 4908 is omitted.

A first portion 4912 (e.g., a first implanted region) of the semiconductor surface layer 4906 along the top side 4907 includes majority carrier dopants of the second conductivity type and is labeled "NSD" in the drawings. A second portion or implanted region 4914 of the semiconductor surface layer 4906 along the top side 4907 includes majority carrier dopants of the first conductivity type and is labeled "PSD" in the drawings. A third portion 4916 (e.g., a third implanted region) of the semiconductor surface layer 4906 within the deep doped region 4908 along the top side 4907 includes majority carrier dopants of the second conductivity type and is labeled "NSD" in the drawings.

The electronic device 4900 includes a deep trench isolation structure 4920 with a bilayer dielectric liner having a first dielectric liner layer 4921 and a second dielectric liner layer 4922 along a sidewall of a trench 4923. The second deep doped region 4909 surrounds the deep trench isolation structure 4920, and the first deep doped region 4908 is laterally spaced apart from the deep trench isolation structure 4920. In another implementation, a single layer dielectric liner (not shown) is formed along the trench sidewall. In another implementation, a multilayer dielectric liner (not shown) includes more than two dielectric layers along the trench sidewall. The trench 4923 is filled with doped polysilicon 4924 having an upper or top side 4925. The trench 4923 extends through the semiconductor surface layer 4906 to the semiconductor substrate 4902.

Figure 49A:
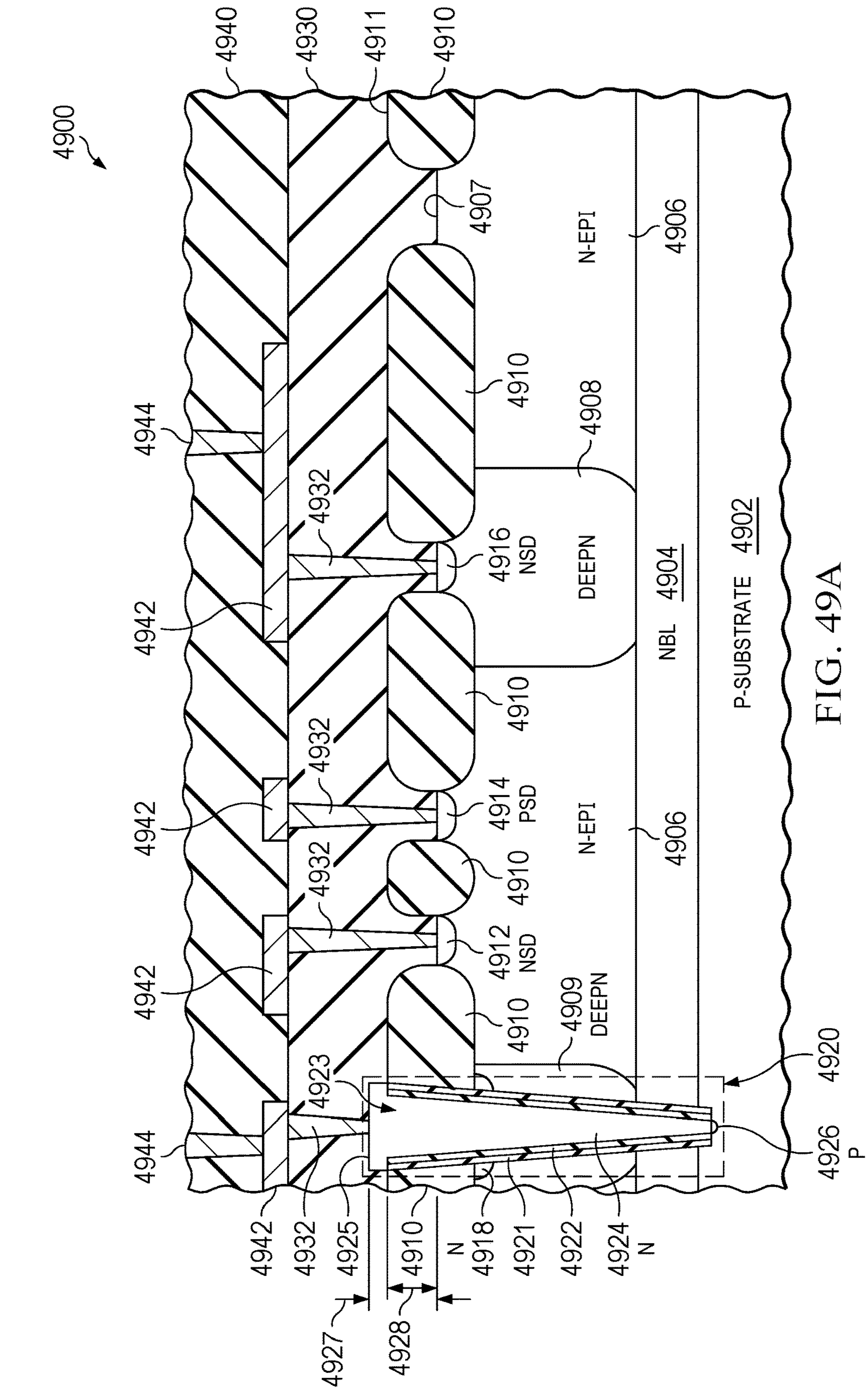
FIG. 49A is a partial sectional side elevation view of an alternative implementation of the electronic device of FIG. 49 that includes a deep trench isolation structure formed through a field oxide structure, through the deep implanted region, through the buried layer and into the substrate.

FIG. 49A shows an alternative implementation of the electronic device 4900 of FIG. 49 that includes a deep trench isolation structure 4920 that extends through the semiconductor surface layer 4906, through opposite upper and lower sides of the buried layer 4904 and into the underlying semiconductor substrate 4902.

Referring again to FIG. 49, a portion 4926 (e.g., an implanted region) of the semiconductor substrate 4902 under the trench 4923 includes majority carrier dopants of the first conductivity type. In the illustrated example, the buried layer 4904 is formed by a blanket implantation process and the trench 4923 extends into the buried layer of the semiconductor substrate. The bilayer dielectric liner 4921, 4922 extends on the sidewall of the trench 4923 from the semiconductor surface layer 4906 on the sidewall of the trench 4923 from the semiconductor surface layer 4906 to the buried layer 4904.

The polysilicon 4924 includes majority carrier dopants of the second conductivity type. The polysilicon 4924 extends on the dielectric liner 4921, 4922 and fills the trench 4923 to the top side 4907 of the semiconductor surface layer 4906. In the example of FIG. 49, the trench 4923, the dielectric liner 4921, 4922, and the polysilicon 4924 extend beyond the top side 4907 of the semiconductor surface layer 4906 through a portion of the field oxide 4910. A portion (e.g., side) of the field oxide 4910 contacts (e.g., is in contact with) a portion of the isolation structure 4920. The top side 4925 of the polysilicon 4924 extends outward beyond the top side 4907 of the semiconductor surface layer 4906 by a first distance 4927, and the top side 4911 of the field oxide 4910 extends outward beyond the top side 4907 of the semiconductor surface layer 4906 by a second distance 4928. The isolation structure 4920 in the electronic device 4900 of FIG. 49 is fabricated after formation (e.g., growth) of the field oxide structure 4910, and the first distance 4927 is greater than the second distance 4928 in the electronic device 4900 of FIG. 49 (e.g., the polysilicon 4924 extends upward past and above the top side 4911 of the field oxide 4910 in the configuration and orientation shown in the drawings).

The electronic device 4900 includes a multilevel metallization structure, only a portion of which is shown in FIG. 49. The electronic device 4900 includes a first dielectric layer 4930 (e.g., a pre-metal dielectric layer labeled "PMD" in the drawings) that extends on or over the field oxide 4910 and portions of the top side 4907 of the semiconductor surface layer 4906. In one example, the first dielectric layer is or includes $SiO_2$. The PMD layer 4930 includes conductive contacts 4932 that extend through the PMD layer 4930 to form electrical contacts to the respective implanted regions 4912, 4914, and 4916 of the semiconductor surface layer 4906. The PMD layer 4930 also includes a conductive contact 4932 that forms an electrical contact to the top side 4925 of the doped polysilicon 4924 of the deep trench isolation structure 4920.

The multilevel metallization structure this example also includes a second dielectric layer 4940 (e.g., $SiO_2$), which is labeled "ILD" in FIG. 49. The second dielectric layer 4940 includes conductive routing structures 4942, such as traces or lines. In one example, the conductive routing structures 4942 are or include copper or aluminum or aluminum or other conductive metal. The second dielectric layer 4940 includes conductive vias 4944 that are or include copper or aluminum or other conductive metal. In one example, the electronic device 4900 includes one or more further metallization layers or levels (not shown).

FIG. 50 shows the finished electronic device 4900 that includes a package structure having a semiconductor die 5000 enclosed in a molded package 5002. In the illustrated example, the die 5000 is mounted on a die attach pad 5004, and conductive bond pads of the die 5000 are electrically coupled to respective leads 5006 via conductive bond wires 5008.

FIGS. 51 and 52 illustrate another example electronic device 5100 having a first deep doped region and a second deep doped region that at least partially surrounds the deep trench isolation structure, in which the deep trench isolation structure is formed before the field oxide structures. FIG. 51 shows a partial sectional side view of the electronic device 5100 and FIG. 52 shows the electronic device 5100 including a package structure. The electronic device 5100 includes a deep trench isolation structure formed through field oxide without STI structures. The DTI structure facilitates electrical isolation between components or circuits without adding an STI mask and without the cost and complexity of STI processing. The electronic device 5100 in one example is an integrated circuit product, only a portion of which is shown in FIG. 51. The electronic device 5100 includes electronic components, such as transistors, resistors, capacitors (not shown) fabricated on or in a semiconductor structure of a starting wafer, which is subsequently separated or singulated into individual semiconductor dies that are separately packaged to produce integrated circuit products. The electronic device 5100 includes a semiconductor structure having a semiconductor substrate 5102, a buried layer 5104 in a portion of the semiconductor substrate 5102, a semiconductor surface layer 5106 with an upper or top side 5107 and deep doped regions 5108 and 5109, and field oxide structures 5110 that have upper or top sides 5111 and extend on corresponding portions of the top side 5107 of the semiconductor surface layer 5106. In one example, the field oxide 5110 is or includes silicon dioxide ($SiO_2$) grown by a thermal oxidation process during fabrication of the electronic device 5100.

The semiconductor substrate 5102 in one example is a silicon or silicon on insulator (SOI) structure that includes majority carrier dopants of a first conductivity type. The buried layer 5104 extends in a portion of the semiconductor substrate 5102 and includes majority carrier dopants of a second conductivity type. In the illustrated implementation, the first conductivity type is P, the second conductivity type is N, the semiconductor substrate 5102 is labeled "P-SUBSTRATE", and the buried layer 5104 is an N-type buried layer labeled "NBL" in the drawings. In another implementation (not shown), the first conductivity type is N and the second conductivity type is P.

The semiconductor surface layer 5106 in the illustrated example is or includes epitaxial silicon having majority carrier dopants of the second conductivity type and is labeled "N-EPI" in the drawings. The electronic device 5100 includes first and second deep doped region 5108 and 5109, respectively. Both deep doped regions 5108 and 5109 include majority carrier dopants of the second conductivity type and the first deep doped region 5108 is labeled "DEEPN" in the FIG. 51. The deep doped regions 5108 and 5109 extend from the semiconductor surface layer 5106 to the buried layer 5104. In another example, the deep doped region 5108 is omitted.

A first portion 5112 (e.g., a first implanted region) of the semiconductor surface layer 5106 along the top side 5107 includes majority carrier dopants of the second conductivity type and is labeled "NSD" in the drawings. A second portion or implanted region 5114 of the semiconductor surface layer 5106 along the top side 5107 includes majority carrier dopants of the first conductivity type and is labeled "PSD" in the drawings. A third portion 5116 (e.g., a third implanted region) of the semiconductor surface layer 5106 within the deep doped region 5108 along the top side 5107 includes majority carrier dopants of the second conductivity type and is labeled "NSD" in the drawings.

The electronic device 5100 includes a deep trench isolation structure 5120 with a bilayer dielectric liner having a first dielectric liner layer 5121 and a second dielectric liner layer 5122 along a sidewall of a trench 5123. The second deep doped region 5109 surrounds the deep trench isolation structure 5120, and the first deep doped region 5108 is laterally spaced apart from the deep trench isolation structure 5120. In another implementation, a single layer dielectric liner (not shown) is formed along the trench sidewall. In another implementation, a multilayer dielectric liner (not shown) includes more than two dielectric layers along the trench sidewall. The trench 5123 is filled with doped polysilicon 5124 having an upper or top side 5125. The trench 5123 extends through the semiconductor surface layer 5106 to the buried layer 5104. semiconductor substrate 5102.

Figure 51A:
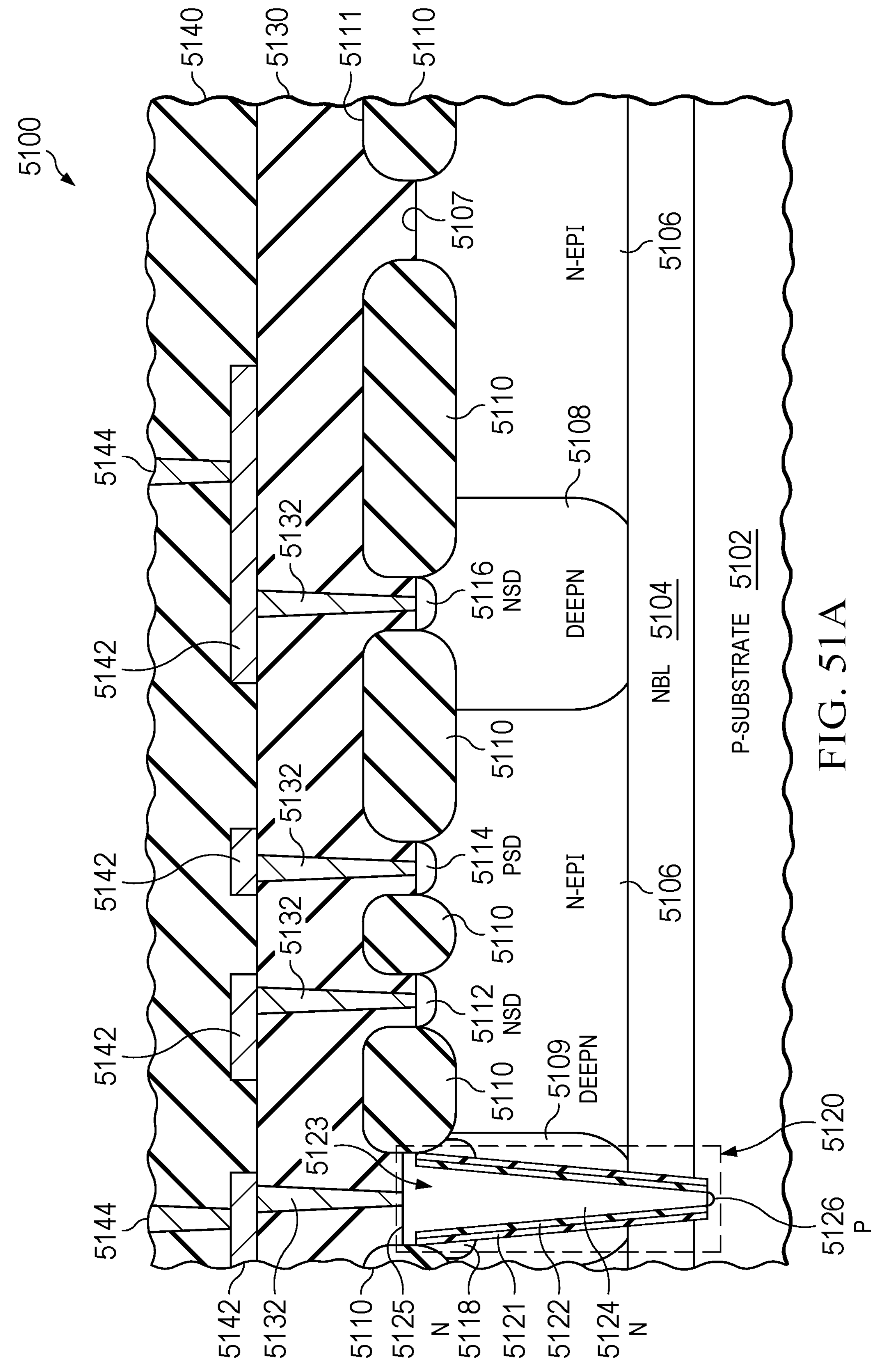
FIG. 51A is a partial sectional side elevation view of an alternative implementation of the electronic device of FIG. 51 that includes a deep trench isolation structure formed between field oxide structures, and a deep implanted region surrounding the isolation structure and downward through the deep implanted region, through the buried layer and into the substrate.

FIG. 51A shows an alternative implementation of the electronic device 5100 of FIG. 51 that includes a deep trench isolation structure 5120 that extends through the semiconductor surface layer 5106, through opposite upper and lower sides of the buried layer 5104 and into the underlying semiconductor substrate 5102.

Referring again to FIG. 51, a portion 5126 (e.g., an implanted region) of the semiconductor substrate 5102 under the trench 5123 includes majority carrier dopants of the first conductivity type. In the illustrated example, the buried layer 5104 is formed by a blanket implantation process and the trench 5123 extends into the buried layer 5104 of the semiconductor substrate. The bilayer dielectric liner 5121, 5122 extends on the sidewall of the trench 5123 from the semiconductor surface layer 5106 on the sidewall of the trench 5123 from the semiconductor surface layer 5106 to the buried layer 5104.

The polysilicon 5124 includes majority carrier dopants of the second conductivity type. The polysilicon 5124 extends on the dielectric liner 5121, 5122 and fills the trench 5123 to the top side 5107 of the semiconductor surface layer 5106. In the example of FIG. 51, the trench 5123, the dielectric liner 5121, 5122, and the polysilicon 5124 extend beyond the top side 5107 of the semiconductor surface layer 5106. A portion (e.g., side) of the field oxide 5110 contacts (e.g., is in contact with) a portion of the isolation structure 5120. The isolation structure 5120 in the electronic device 5100 of FIG. 51 is fabricated before formation (e.g., growth) of the field oxide structure 5110.

The electronic device 5100 includes a multilevel metallization structure, only a portion of which is shown in FIG. 51. The electronic device 5100 includes a first dielectric layer 5130 (e.g., a pre-metal dielectric layer labeled "PMD" in the drawings) that extends on or over the field oxide 5110 and portions of the top side 5107 of the semiconductor surface layer 5106. In one example, the first dielectric layer is or includes $SiO_2$. The PMD layer 5130 includes conductive contacts 5132 that extend through the PMD layer 5130 to form electrical contacts to the respective implanted regions 5112, 5114, and 5116 of the semiconductor surface layer 5106. The PMD layer 5130 also includes a conductive contact 5132 that forms an electrical contact to the top side 5125 of the doped polysilicon 5124 of the deep trench isolation structure 5120.

The multilevel metallization structure this example also includes a second dielectric layer 5140 (e.g., $SiO_2$), which is labeled "ILD" in FIG. 51. The second dielectric layer 5140 includes conductive routing structures 5142, such as traces or lines. In one example, the conductive routing structures 5142 are or include copper or aluminum or aluminum or other conductive metal. The second dielectric layer 5140 includes conductive vias 5144 that are or include copper or aluminum or other conductive metal. In one example, the electronic device 5100 includes one or more further metallization layers or levels (not shown).

FIG. 52 shows the finished electronic device 5100 that includes a package structure having a semiconductor die 5200 enclosed in a molded package 5202. In the illustrated example, the die 5200 is mounted on a die attach pad 5204, and conductive bond pads of the die 5200 are electrically coupled to respective leads 5206 via conductive bond wires 5208.

The above examples provide a deep trench isolation solution that can be employed in any technology which does not need STI without the added cost and complexity of STI processing.

Modifications are possible in the described examples, and other implementations are possible, within the scope of the claims.

What is claimed is:

1. A method of fabricating an electronic device, the method comprising:

forming a buried layer in at least a portion of a semiconductor substrate, the semiconductor substrate including majority carrier dopants of a first conductivity type, and the buried layer including majority carrier dopants of a second conductivity type;

forming a trench through a semiconductor surface layer and into one of the semiconductor substrate and the buried layer, the semiconductor surface layer including majority carrier dopants of the second conductivity type;

forming a dielectric liner along a sidewall of the trench from the semiconductor surface layer to the one of the semiconductor substrate and the buried layer;

forming polysilicon inside the trench and on the dielectric liner, the polysilicon filling the trench to a side of the semiconductor surface layer and including majority carrier dopants of the second conductivity type; and forming a thermally grown field oxide on a portion of the side of the semiconductor surface layer, a portion of the thermally grown field oxide in contact with one of a portion of the dielectric liner and a portion of the polysilicon.

2. The method of claim 1, further comprising:

forming a deep doped region including majority carrier dopants of the second conductivity type, the deep doped region spaced apart from the dielectric liner and extending from the semiconductor surface layer to the buried layer.

3. The method of claim 2, further comprising:

forming a second deep doped region including majority carrier dopants of the second conductivity type, the second deep doped region extending from the semiconductor surface layer to the buried layer and surrounding a portion of the trench.

4. The method of claim 1, further comprising:

forming a deep doped region including majority carrier dopants of the second conductivity type, the deep doped region extending from the semiconductor surface layer to the buried layer and surrounding a portion of the trench.

5. The method of claim 1, wherein forming the trench comprises:

performing a first etch process that etches through an exposed portion of the thermally grown field oxide using an etch mask to expose a portion of the semiconductor surface layer; and performing a second etch process that etches through the exposed portion of the semiconductor surface layer using the etch mask to expose one of a portion of the semiconductor substrate and a portion of the buried layer.

6. The method of claim 5, further comprising:

forming a deep doped region including majority carrier dopants of the second conductivity type, the deep doped region extending from the semiconductor surface layer to the buried layer and surrounding a portion of the trench.

7. The method of claim 1, wherein the thermally grown field oxide is formed after forming the trench.

8. The method of claim 7, further comprising:

forming a deep doped region including majority carrier dopants of the second conductivity type, the deep doped region extending from the semiconductor surface layer to the buried layer and surrounding a portion of the trench.

9. A method, comprising:

forming a buried layer in at least a portion of a semiconductor substrate, the semiconductor substrate being a first conductivity type and the buried layer being a second conductivity type opposite the first conductivity type;

forming a semiconductor layer on the semiconductor substrate, the semiconductor layer being the second conductivity type;

forming a trench through the semiconductor layer and into one of the semiconductor substrate and the buried layer;

forming a dielectric liner along a sidewall surface and a bottom surface of the trench;

forming polysilicon on the dielectric liner, the polysilicon filling the trench; and forming a thermally grown field oxide on a portion of the semiconductor layer adjacent to the trench, the thermally grown field oxide being in contact with the dielectric liner or the polysilicon of the trench.

10. The method of claim 9, further comprising:

forming a doped region of the second conductivity type in the semiconductor layer, the doped region laterally spaced apart from the trench and extended to the buried layer.

11. The method of claim 9, further comprising:

forming a doped region of the second conductivity type in the semiconductor layer, the doped region surrounding a portion of the trench and extended to the buried layer.

12. The method of claim 9, wherein forming the trench further comprises:

forming a plurality of dielectric layers on the semiconductor layer; and forming an opening through the plurality of dielectric layers, wherein the opening exposes a region of the semiconductor layer corresponding to the trench.

13. The method of claim 9, wherein the dielectric liner includes a thermally grown oxide layer and a deposited oxide layer formed on the thermally grown oxide layer.

14. The method of claim 9, further comprising:

removing the dielectric liner on the bottom surface of the trench, prior to forming the polysilicon.

15. The method of claim 14, further comprising:

cleaning the bottom surface of the trench after removing the dielectric liner on the bottom surface of the trench.

16. The method of claim 14, further comprising:

implanting dopants into one of the semiconductor substrate and the buried layer at the bottom surface of the trench after removing the dielectric liner on the bottom surface of the trench.

17. The method of claim 9, further comprising:

removing the polysilicon outside the trench based on a chemical mechanical polishing (CMP) process, wherein the CMP process stops on a dielectric layer formed on the semiconductor layer, the dielectric layer used for exposing a region of the semiconductor layer corresponding to the trench.

18. The method of claim 9, wherein forming the thermally grown field oxide further comprises:

forming a mask on the semiconductor layer, the mask configured to block thermal oxidation of the semiconductor layer, wherein the mask exposes the portion of the semiconductor layer adjacent to the trench.

19. The method of claim 9, wherein the polysilicon is the first conductivity type.

20. The method of claim 9, wherein the polysilicon is the second conductivity type.

* * * * *